United States Patent
Hara et al.

(10) Patent No.: US 11,427,656 B2
(45) Date of Patent: Aug. 30, 2022

(54) PHOTOSENSITIVE COMPOSITION FOR HOLOGRAM RECORDING, HOLOGRAM RECORDING MEDIUM, AND HOLOGRAM

(71) Applicant: SONY CORPORATION, Tokyo (JP)

(72) Inventors: Hisaya Hara, Kanagawa (JP); Eri Igarashi, Kanagawa (JP); Kenshiro Kawasaki, Tokyo (JP)

(73) Assignee: SONY CORPORATION, Tokyo (JP)

( * ) Notice: Subject to any disclaimer, the term of this patent is extended or adjusted under 35 U.S.C. 154(b) by 94 days.

(21) Appl. No.: 16/325,352

(22) PCT Filed: Aug. 30, 2017

(86) PCT No.: PCT/JP2017/031239
§ 371 (c)(1),
(2) Date: Feb. 13, 2019

(87) PCT Pub. No.: WO2018/043593
PCT Pub. Date: Mar. 8, 2018

(65) Prior Publication Data
US 2019/0202946 A1    Jul. 4, 2019

(30) Foreign Application Priority Data

Aug. 30, 2016 (JP) .............................. JP2016-168484
Jan. 20, 2017 (JP) .............................. JP2017-008901

(51) Int. Cl.
*C08F 2/44* (2006.01)
*G11B 7/24044* (2013.01)
(Continued)

(52) U.S. Cl.
CPC .................. *C08F 2/44* (2013.01); *C08F 2/40* (2013.01); *C08F 2/50* (2013.01); *G03F 7/001* (2013.01);
(Continued)

(58) Field of Classification Search
CPC ........ G03F 7/001; G03F 7/0047; G03F 7/027; C08F 2/50; C08F 2/40; C08F 2/44; G03H 1/02; G11B 7/24044; G11B 7/251
See application file for complete search history.

(56) References Cited

U.S. PATENT DOCUMENTS 3,854,950 A * 12/1974 Held ..................... G03C 1/8155
                                                                            430/11
4,942,102 A    7/1990 Keys et al.
(Continued)

FOREIGN PATENT DOCUMENTS

| CN | 104109217 | * 10/2014 |
|---|---|---|
| EP | 2889700 | 7/2015 |

(Continued)

OTHER PUBLICATIONS

Sanchez et al. TiO2 nanoparticles photopolymer composites for volume holographic recording, Adv. Funct. Mater., vol. 15 1623-1629 (2005).*

(Continued)

*Primary Examiner* — Martin J Angebranndt
(74) *Attorney, Agent, or Firm* — Sheridan Ross P.C.

(57) ABSTRACT

To provide a photosensitive composition for hologram recording that enables further improvement in diffraction characteristic. A photosensitive composition for hologram recording that includes at least two kinds of photopolymerizable monomers, a photopolymerization initiator, a binder resin, and a polymerization inhibitor. The at least two kinds of photopolymerizable monomers are a monofunctional monomer and a polyfunctional monomer.

25 Claims, 1 Drawing Sheet

(51) Int. Cl.
  *C08F 2/40* (2006.01)
  *C08F 2/50* (2006.01)
  *G03F 7/027* (2006.01)
  *G03F 7/00* (2006.01)
  *G03F 7/004* (2006.01)
  *G03H 1/02* (2006.01)
  *G11B 7/251* (2006.01)
  *G03F 7/025* (2006.01)

(52) U.S. Cl.
  CPC ............ *G03F 7/0047* (2013.01); *G03F 7/025* (2013.01); *G03F 7/027* (2013.01); *G03H 1/02* (2013.01); *G11B 7/24044* (2013.01); *G11B 7/251* (2013.01); *G03H 2260/12* (2013.01); *G03H 2260/14* (2013.01); *G03H 2260/30* (2013.01)

(56) References Cited

U.S. PATENT DOCUMENTS

| | | | | |
|---|---|---|---|---|
| 5,164,278 | A * | 11/1992 | Brunsvold | G03F 7/039 430/176 |
| 5,212,046 | A * | 5/1993 | Lamola | G03F 7/0045 430/270.1 |
| 5,240,795 | A | 8/1993 | Yoshinaga et al. | |
| 5,415,950 | A * | 5/1995 | King | G03H 1/0248 359/1 |
| 6,355,395 | B1 * | 3/2002 | Zwez | G03F 7/033 430/271.1 |
| 2003/0096172 | A1 * | 5/2003 | Ichihashi | G03F 7/027 430/1 |
| 2007/0196645 | A1 * | 8/2007 | Duerig | G11B 9/149 428/336 |
| 2008/0070124 | A1 * | 3/2008 | Matsumoto | G11B 7/245 430/2 |
| 2009/0310196 | A1 * | 12/2009 | Shimizu | G03H 1/02 359/3 |
| 2010/0112458 | A1 * | 5/2010 | Knocke | G03F 7/027 430/2 |
| 2010/0221646 | A1 * | 9/2010 | Kawamonzen | G03H 1/02 430/2 |
| 2011/0027697 | A1 * | 2/2011 | Peredereeva | C08F 290/067 430/2 |
| 2011/0092612 | A1 * | 4/2011 | Miki | G11B 7/244 522/154 |
| 2011/0111344 | A1 * | 5/2011 | Ajioka | G03F 7/027 430/281.1 |
| 2011/0287343 | A1 * | 11/2011 | Hayashida | G03F 7/027 430/2 |
| 2012/0071618 | A1 * | 3/2012 | Goldfinger | C09K 19/14 526/268 |
| 2012/0219884 | A1 * | 8/2012 | Weiser | C08G 18/10 430/2 |

FOREIGN PATENT DOCUMENTS

| | | | |
|---|---|---|---|
| JP | H02-015268 | | 1/1990 |
| JP | H07-306529 | | 11/1995 |
| JP | 08-272284 | * | 10/1996 |
| JP | 2004-031089 | | 1/2004 |
| JP | 2004-138686 | * | 5/2004 |
| JP | 2004-318069 | | 11/2004 |
| JP | 2006-003388 | * | 1/2006 |
| JP | 2006-010796 | | 1/2006 |
| JP | 2006-078821 | * | 3/2006 |
| JP | 4232001 | | 3/2009 |
| JP | 2011-118363 | | 6/2011 |
| JP | 2011-178985 | | 9/2011 |
| JP | 2013-227513 | * | 11/2013 |
| JP | 2014-063104 | | 4/2014 |
| JP | 2014-196288 | | 10/2014 |
| WO | 03/081344 | * | 10/2003 |
| WO | 2015029996 | * | 3/2015 |

OTHER PUBLICATIONS

Suzuki et al. "Highly transparent ZrO2 nanodispersed acrylate photopolymers for volume holographic recording", Opt. Exp. vol. 14(26) pp. 12712 12719 (Dec. 2006).*
Machine translation of WO 2015029996 (Mar. 2015).*
Machine transaltion of JP 08-272284 (Oct. 1996).*
Machine translation of CN104109217 (Oct. 2014).*
Machine translation of WO 03/081344 (2003).*
Machine translation og JP 2006-0078821 (2006).*
Machine translation of JP 2013-227513 (2013).*
Machine translation of JP 2006-003388 (2006).*
Machine translation of JP 2004-138686 (2004).*
Suzuki et al., "Holographic recording in TiO2 nanoparticle-dispersed methacrylate," Applied Physics Letters, vol. 81, No. 22, Nov. 25, 2002, pp. 4121-4123.
Extended European Search Report for European Patent Application No. 17846597.7, dated Sep. 3, 2019, 10 pages.
International Search Report prepared by the Japan Patent Office dated Nov. 10, 2017, for International Application No. PCT/JP2017/031239.
Official Action (no English translation available) for Japan Patent Application No. 2018-537360, dated May 11, 2021, 3 pages.

* cited by examiner

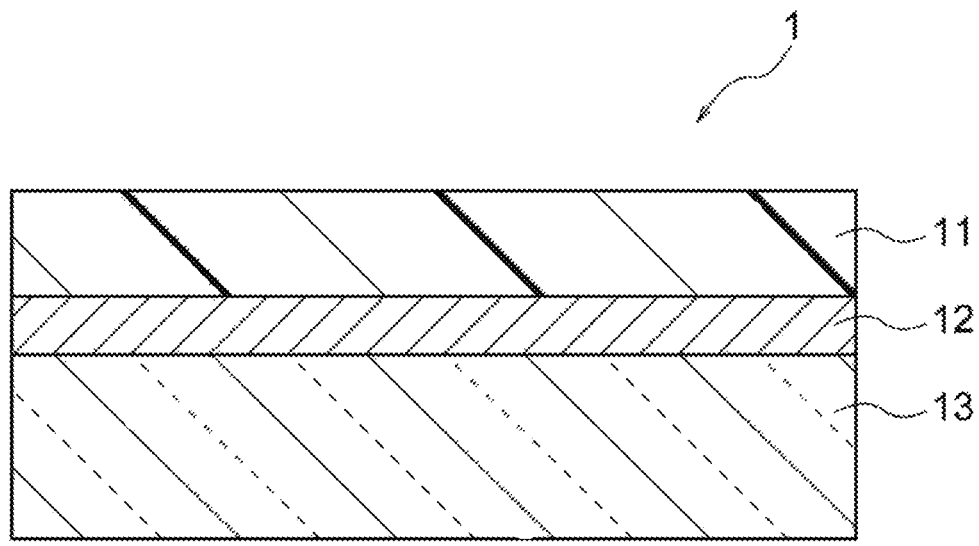

PHOTOSENSITIVE COMPOSITION FOR HOLOGRAM RECORDING, HOLOGRAM RECORDING MEDIUM, AND HOLOGRAM

CROSS REFERENCE TO RELATED APPLICATIONS

This application is a national stage application under 35 U.S.C. 371 and claims the benefit of PCT Application No. PCT/JP2017/031239 having an international filing date of 30 Aug. 2017, which designated the United States, which PCT application claimed the benefit of Japanese Patent Application Nos. 2016-168484 filed 30 Aug. 2016 and 2017-008901 filed 20 Jan. 2017, the entire disclosures of each of which are incorporated herein by reference.

TECHNICAL FIELD

The present technology relates to a photosensitive composition for hologram recording, a hologram recording medium, and a hologram.

BACKGROUND ART

In recent years, holograms are used in a wide variety of fields such as optical information processing, security, medical science, and three-dimensional image display. Holograms enable recording of large-capacity three-dimensional information associated with an object as optical information. That is why holograms are attracting attention as next-generation recording media, and research and development on holograms are now active.

For example, Patent Document 1 discloses a photosensitive composition for volume hologram recording that includes a binder resin, a photopolymerizable compound, a photopolymerization initiator, and a sensitizer. In this photosensitive composition for volume hologram recording, the binder resin has an average molecular weight of 10,000 to 250,000, and the glass transition temperature of this composition is 80° C. or more. Herein, when recording a volume hologram by exposing a photosensitive medium that includes this compound, a half width of a diffraction spectrum of the obtained volume hologram is 20 nm or less and an amount of refractive index change is 0.03 or more.

Furthermore, for example, Patent Document 2 discloses a composition for a volume phase hologram recording material which is used for recording, as changes in refractive index, intensity distributions of bright and dark sections of interference fringes obtained by interference of light. This composition includes (note that the composition does not include aryl prepolymer) a thermoplastic resin soluble in an organic solvent (A), a radically polymerizable compound (B) which has a 9,9-diaryl fluorene skeleton and at least one radically polymerizable unsaturated double bond and which is a solid at room temperature and normal pressure, a plasticizer (C), and a photopolymerization initiator (D). A weight percentage of the thermoplastic resin (A), the radically polymerizable compound (B), and the plasticizer (C) is (A):(B):(C)=10 to 80:10 to 80:10 to 80, and the refractive index of the radically polymerizable compound (B) is larger than a weighted average of the refractive index of the thermoplastic resin (A) and the refractive index of the plasticizer (C).

CITATION LIST

Patent Document

Patent Document 1: Japanese Patent Application Laid-Open No. 2004-31089
Patent Document 2: Japanese Patent No. 4232001

SUMMARY OF THE INVENTION

Problems to be Solved by the Invention

However, the techniques proposed in Patent Documents 1 and 2 may not contribute to further improvement in diffraction characteristic.

The present technology has been made in light of such a situation, and a main object of the present technology is to provide a photosensitive composition for hologram recording, a hologram recording medium, and a hologram which contribute to further improvement in diffraction characteristic.

Solutions to Problems

As a result of intensive study to achieve the aforementioned object, surprisingly, the present inventors have succeeded in significantly improving the diffraction characteristic, whereby completing the present technology.

In other words, the present technology provides, first, a photosensitive composition for hologram recording that includes at least two kinds of photopolymerizable monomers, a photopolymerization initiator, a binder resin, and a polymerization inhibitor, in which the at least two kinds of photopolymerizable monomers are a monofunctional monomer and a polyfunctional monomer.

The monofunctional monomer may be a dinaphthothiophene monomer, and the polyfunctional monomer may also be a dinaphthothiophene monomer.

The monofunctional monomer may be a carbazole monomer and the polyfunctional monomer may be a fluorene monomer.

The polyfunctional monomer may also be a tris(phenylethynyl)benzene monomer or a tris(naphthylethynyl)benzene monomer.

The monofunctional monomer may also be a dinaphthothiophene monomer.

The polyfunctional monomer may also be a dinaphthothiophene monomer.

The polymerization inhibitor may be a quinone compound.

The polymerization inhibitor may be a hindered phenol compound.

The polymerization inhibitor may be a benzotriazole compound.

The polymerization inhibitor may be a thiazine compound.

The photosensitive composition for hologram recording according to the present technology may further include an inorganic particulate.

The inorganic particulate may be ZrO$_2$ particulate or TiO$_2$ particulate.

The monofunctional monomer may be a carbazole monomer and the polyfunctional monomer may be a fluorene monomer.

The monofunctional monomer may be a compound represented by the following General Formula (8).

[Formula 1]

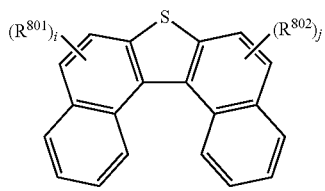

(8)

(In General Formula (8), R$^{801}$ and R$^{802}$ independently are a univalent substituent represented by the following General Formula (9), where i and j independently are an integer of 0 or 1, and i and j are not simultaneously 0 or 1.)

[Formula 2]

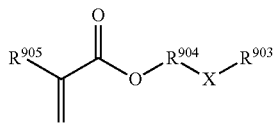

(9)

(In General Formula (9), R$^{903}$ and R$^{904}$ independently are a single bond or a substituted or unsubstituted straight or branched C$_{1-10}$ alkylene group, R$^{905}$ is hydrogen or a substituted or unsubstituted straight or branched C$_{1-10}$ alkyl group, and X is a divalent aromatic group represented by the following Formulae (9-1) to (9-8). The divalent aromatic group is unsubstituted or includes at least one substituent. Two binding sites of the divalent aromatic group for R$^{903}$ and R$^{904}$ may be on any carbon in the aromatic group that is to be bound.)

[Formula 3]

(9-1)

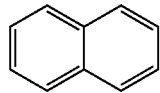
(9-2)

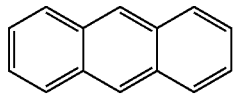
(9-3)

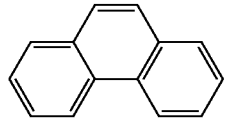
(9-4)

[Formula 4]

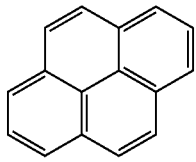
(9-5)

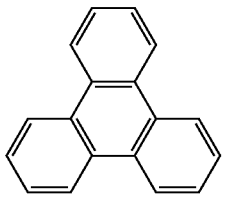
(9-6)

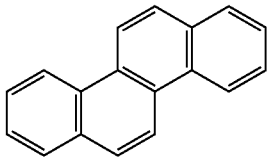
(9-7)

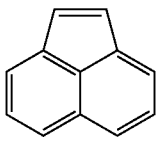
(9-8)

The monofunctional monomer may be a compound represented by General Formula (8), and the polyfunctional monomer may be a fluorene monomer.

The monofunctional monomer may be a compound represented by General Formula (8), and the polyfunctional monomer may be a dinaphthothiophene monomer.

Furthermore, the present technology provides a hologram recording medium that includes at least a photosensitive layer including the photosensitive composition for hologram recording according to the present technology; and at least one transparent base material, in which the photosensitive layer is formed on the at least one transparent base material.

Moreover, the present technology provides a hologram obtained with use of the hologram recording medium according to the present technology, and an amount of refractive index change of the hologram is 0.06 or more.

Furthermore, according to the present technology, it is possible to provide a photosensitive composition for hologram recording including at least one kind of photopolymerizable monomer, a photopolymerization initiator, a binder resin, and a polymerization inhibitor, and it is possible to provide a photosensitive composition for hologram recording including at least two kinds of photopolymerizable monomers, a photopolymerization initiator, a binder resin, and a polymerization inhibitor.

Effects of the Invention

According to the present technology, it is possible to significantly improve a diffraction characteristic. Note that the effects described herein do not necessarily limit the present technology, and the present technology may produce any of the effects described in the present disclosure.

BRIEF DESCRIPTION OF DRAWINGS

FIG. 1 is a cross-sectional view schematically showing an example of a hologram recording medium according to a second embodiment to which the present technology is applied.

MODE FOR CARRYING OUT THE INVENTION

Preferable embodiments for carrying out the present technology will now be described. The following embodiments are illustrated as typical embodiments of the present technology and do not limit the scope of the present technology.

Note that the present technology will be described in the following order.
1. Outline of The Present Technology
2. First Embodiment (Example of Photosensitive Composition for Hologram Recording)
   2-1. Photosensitive Composition for Hologram Recording
   2-2. Photopolymerizable Monomer
   2-3. Binder Resin
   2-4. Photopolymerization Initiator
   2-5. Polymerization Inhibitor
   2-6. Inorganic Particulate
   2-7. Plasticizer
   2-8. Sensitizing Dye
   2-9. Chain Transfer Agent
   2-10. Solvent
   2-11. Method for Producing Photosensitive Composition for Hologram Recording
3. Second Embodiment (Example of Hologram Recording Medium)
   3-1. Hologram Recording Medium
   3-2. Photosensitive Layer
   3-3. Transparent Base Material
   3-4. Method for Producing Hologram Recording Medium
4. Third Embodiment (Example of Hologram)
   4-1. Hologram
   4-2. Method for Producing Hologram

1. Outline of the Present Technology

First, the outline of the present technology will be described.

The present technology relates to a photosensitive composition for hologram recording, a hologram recording medium, and a hologram.

In order to obtain a high amount of refractive index change ($\Delta n$), heating after interference exposure is indispensable, which is responsible for the complicated process. For example, there is a technique to obtain a high diffraction characteristic, that is, an amount of refractive index change ($\Delta n$) of 0.065. In this technique, heating is performed after interference exposure. Furthermore, for example, there is a technique to obtain a diffraction efficiency of 90% or more without requiring heating. However, a recording layer (photosensitive layer) has a film thickness in a range from 15 μm to 20 μm, and it is inferred that the amount of refractive index change ($\Delta n$) of the recording layer does not satisfy $\Delta n=0.03$, when using the Kogelnik theoretical formula. Note that the Kogelnik theoretical formula indicates the following formula described in Bell Syst. Tech. J., 48, 2909 (1969).

$$\eta = \tanh^2(\pi(\Delta n)d/\lambda \cos\theta) \quad \text{Kogelnik theoretical formula;}$$

Here, $\eta$ represents a diffraction efficiency, d represents a film thickness of a photosensitive layer (photopolymer), $\lambda$ represents a recording laser wavelength, and $\theta$ represents an incident angle of recording laser light relative to a photosensitive material.

In order to obtain a high amount of refractive index change ($\Delta n$) without performing heating, the present inventors have found that it is necessary to prevent polymerization in dark sections while promoting polymerization in bright sections during interference exposure. In addition, the present inventors have found that a polymerization inhibitor included in a photosensitive composition for hologram recording prevents dark polymerization during interference exposure, which promotes refractive index change and achieves a high diffraction characteristic.

Under such situations, the inventors have completed the present technology. The present technology employs a polymerization inhibitor in a photosensitive composition for hologram recording. This makes it possible to promote polymerization of photopolymerizable monomers in a bright sections, during interference exposure, and to prevent polymerization of photopolymerizable monomers in dark sections so that the photopolymerizable monomers in the dark sections diffuse into the bright sections. Moreover, the polymerization of the photopolymerizable monomers in the bright sections is further promoted, which achieves a high amount of refractive index change ($\Delta n$) after the interference exposure.

In other words, in the present technology, including a polymerization inhibitor in a photosensitive composition for hologram recording makes it possible to provide a photosensitive composition for hologram recording, a hologram recording medium, and a hologram which have an excellent diffraction characteristic and do not require heating after interference exposure. Note that the photosensitive composition for hologram recording according to the present technology is determined by, for example, chromatograph typified by nuclear magnetic resonance spectroscopy, infrared spectroscopy, Raman spectroscopy, ultraviolet-visible absorption spectroscopy, high performance liquid chromatography, and gas chromatography.

2. First Embodiment (Example of Photosensitive Composition for Hologram Recording)

[2-1. Photosensitive Composition for Hologram Recording]

The photosensitive composition for hologram recording according to the first embodiment of the present technology is a photosensitive composition for hologram recording including at least two kinds of photopolymerizable monomers, a photopolymerization initiator, a binder resin, and a polymerization inhibitor. The at least two kinds of photopolymerizable monomers are a monofunctional monomer and a polyfunctional monomer.

The photosensitive composition for hologram recording according to the first embodiment of the present technology offers a high amount of refractive index change ($\Delta n$) and an excellent diffraction characteristic.

[2-2. Photopolymerizable Monomer]

The at least two kinds of photopolymerizable monomers included in the photosensitive composition for hologram recording according to the first embodiment of the present technology are a monofunctional monomer and a polyfunctional monomer, as described above. When two kinds of photopolymerizable monomers are included in the photosensitive composition for hologram recording according to the first embodiment of the present technology, the photosensitive composition for hologram recording includes one kind of monofunctional monomer and one kind of polyfunctional monomer. When three or more kinds of photopolymerizable monomers are included in the photosensitive composition for hologram recording according to the first embodiment of the present technology, the photosensitive composition for hologram recording includes one kind of monofunctional monomer and one kind of polyfunctional monomer, and the other one or more kinds of the photopolymerizable monomers may be a monofunctional monomer(s) or a polyfunctional monomer(s).

It is preferable that the monofunctional monomer included in the photosensitive composition for hologram recording according to the first embodiment of the present technology should be a dinaphthothiophene monomer, and the polyfunctional monomer should be a dinaphthothiophene monomer. In addition, the polyfunctional dinaphthothiophene monomer is preferably a bifunctional dinaphthothiophene monomer.

As a preferred embodiment, the photosensitive composition for hologram recording according to the first embodiment of the present technology includes at least a monofunctional dinaphthothiophene monomer, a bifunctional dinaphthothiophene monomer, and hydroquinone as described later as a polymerization inhibitor.

Furthermore, it is preferable that the monofunctional monomer included in the photosensitive composition for hologram recording according to the first embodiment of the present technology should be a dinaphthothiophene monomer. Moreover, it is preferable that the polyfunctional monomer included in the photosensitive composition for hologram recording according to the first embodiment of the present technology should be a dinaphthothiophene monomer.

Furthermore, as a preferred embodiment, the photosensitive composition for hologram recording according to the first embodiment of the present technology includes at least a monofunctional monomer dinaphthothiophene monomer, a bifunctional monomer, and a quinone compound as described later or a thiazine compound as a polymerization inhibitor.

Moreover, as a preferred embodiment, the photosensitive composition for hologram recording according to the first embodiment of the present technology includes at least a monofunctional monomer, a bifunctional dinaphthothiophene monomer, and a quinone compound as described later or a thiazine compound as a polymerization inhibitor.

The monofunctional or polyfunctional dinaphthothiophene monomer is preferably a compound represented by the following General Formula (1) or General Formula (5).

[Formula 5]

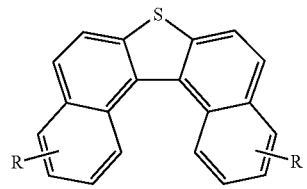

(1)

Herein, R is a substituent on a benzene ring which is not condensed with a thiophene ring, and R is a hydroxyl group, a 2-allyloxy group, a vinyloxy group, a 2,3-epoxypropoxy group, a 2-(meth)acryloyloxy group, a 2-(meth)acryloyloxyethoxy group, an $R^1O$-group (where $R^1$ is an alkyl group which may include oxygen or sulfur as a heteroatom) or HO—X—O group (where X is an alkylene chain or an aralkylene chain which may include oxygen or sulfur as a heteroatom).

In a monofunctional dinaphthothiophene monomer, either one of the two Rs in the above General Formula (1) is a group having a polymerizable unsaturated bond, and in a bifunctional dinaphthothiophene monomer, the two Rs in General Formula (1) are groups having a polymerizable unsaturated bond.

In the above Formula, $R^1$ is an alkyl group which may include oxygen or sulfur as a heteroatom. $R^1$ may be a straight or branched $C_{1-20}$ alkyl group, for example, a methyl group, an ethyl group, a propyl group, an isopropyl group, an n-butyl group, an isobutyl group, a sec-butyl group, a tert-butyl group, a 2-ethylhexyl group, a dodecyl group, a cetyl group, a methoxymethyl group, a 2-methoxyethyl group, an ethoxymethyl group, 2-(ethoxy)ethyl group, a 2-(methylmercapto)ethyl group, and the like.

Furthermore, X is an alkylene chain or an aralkylene chain which may include oxygen or sulfur as a heteroatom. An example of the alkylene chain includes a straight or branched $C_{1-10}$ alkylene chain, for example, a methylene group, an ethylene group, a trimethylene group, a tetramethylene group, a hexamethylene group, a decamethylene group, a propylene group, cyclohexylene group, and the like. An example of the alkylene chain which may include oxygen or sulfur as a heteroatom includes a polyoxyalkylene chain including oxyethylene or oxypropylene as a repeating unit.

An example of an alkylene moiety of the aralkylene chain which may include oxygen or sulfur as a heteroatom includes the aforementioned alkylene chain.

The dinaphthothiophene monomer represented by General Formula (1) may be synthesized by various known synthesis, and may be synthesized, for example, on the basis of the synthesis disclosed in JP-A-2014-196288.

[Formula 6]

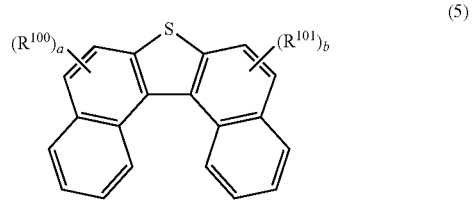

(5)

Herein, $R^{100}$ and $R^{101}$ are substituents on a benzene ring condensed with a thiophene ring. $R^{100}$ and $R^{101}$ independently are a hydroxyl group, a 2-allyloxy group, a vinyloxy group, a 2,3-epoxypropoxy group, a 2-(meth)acryloyloxy group, a 2-(meth)acryloyloxyethoxy group, an $R^1O$-group (where $R^1$ is an alkyl group which may include oxygen or sulfur as a heteroatom) or HO—X—O group (where X is an alkylene chain or an aralkylene chain which may include oxygen or sulfur as a heteroatom).

Herein, a and b are independently an integer of 0 to 2.

In a monofunctional dinaphthothiophene monomer, either one of $R^{100}$ (a=1, b=0) or $R^{101}$ (a=0, b=1) of $R^{100}$ and $R^{101}$ in the above General Formula (5) is a group having a polymerizable unsaturated bond, and in a bifunctional dinaphthothiophene monomer, $R^{100}$ and $R^{101}$ (a=1, b=1) in the above General Formula (5) are groups having a polymerizable unsaturated bond. In a trifunctional dinaphthothiophene monomer, $R^{100}$ and $R^{101}$ (a=2 and b=1, or a=1 and b=2) in the above General Formula (5) are groups having a polymerizable unsaturated bond. In a tetrafunctional dinaphthothiophene monomer, $R^{100}$ and $R^{101}$ (a=2 and b=2) in the above General Formula (5) are groups having a polymerizable unsaturated bond.

In the above Formula, $R^1$ is an alkyl group which may include oxygen or sulfur as a heteroatom. $R^1$ may be a straight or branched $C_{1-20}$ alkyl group, for example, a methyl group, an ethyl group, a propyl group, an isopropyl group, an n-butyl group, an isobutyl group, a sec-butyl group, a tert-butyl group, a 2-ethylhexyl group, a dodecyl group, a cetyl group, a methoxymethyl group, a 2-methoxyethyl group, an ethoxymethyl group, 2-(ethoxy)ethyl group, a 2-(methylmercapto)ethyl group, and the like.

Furthermore, X is an alkylene chain or an aralkylene chain which may include oxygen or sulfur as a heteroatom. An example of the alkylene chain includes a straight or branched $C_{1-10}$ alkylene chain, for example, a methylene group, an ethylene group, a trimethylene group, a tetramethylene group, a hexamethylene group, a decamethylene group, a propylene group, cyclohexylene group, and the like. An example of the alkylene chain which may include oxygen or sulfur as a heteroatom includes a polyoxyalkylene chain including oxyethylene or oxypropylene as a repeating unit.

An example of an alkylene moiety of the aralkylene chain which may include oxygen or sulfur as a heteroatom includes the aforementioned alkylene chain.

Specific examples of the monofunctional dinaphthothiophene monomer include 6VDNpTh, DNTMA, 5EDNTMA, NVC, the following exemplary compounds 5-1 to 5-4, and the like.

Specific examples of the polyfunctional dinaphthothiophene monomer include DHEDNTMA, DAEDNT, 3,11-DHEDNTMA, 3,11-DAEDNT, EA0200, the following exemplary compounds 5-5 to 5-7, and the like.

It is preferable that the polyfunctional monomer included in the photosensitive composition for hologram recording according to the first embodiment of the present technology should be a tris(phenylethynyl)benzene monomer or a tris (naphthylethynyl)benzene monomer.

As a preferred embodiment, the photosensitive composition for hologram recording according to the first embodiment of the present technology includes at least a monofunctional monomer, a trifunctional tris(phenylethynyl) benzene monomer or a trifunctional tris(naphthylethynyl) benzene monomer, and a quinone compound as described later or a thiazine compound as a polymerization inhibitor.

The trifunctional tris(phenylethynyl)benzene monomer is preferably a compound represented by the following General Formula (6).

[Formula 7]

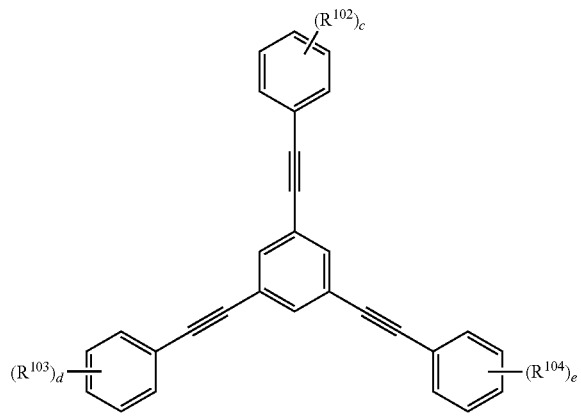

(6)

Herein, $R^{102}$, $R^{103}$, and $R^{104}$ independently are a substituted or unsubstituted alkyl group or a substituted or unsubstituted aryl group. From the aspect of enhancing a high refractive index and improving solubility, it is preferable that $R^{102}$, $R^{103}$, and $R^{104}$ independently be a methyl group, an ethyl group, a propyl group, a butyl group, an isobutyl group, or an isopropyl group.

Herein, c to e independently are an integer of 0 to 5.

Furthermore, the trifunctional tris(naphthylethynyl)benzene monomer is preferably a compound represented by the following General Formula (7).

[Formula 8]

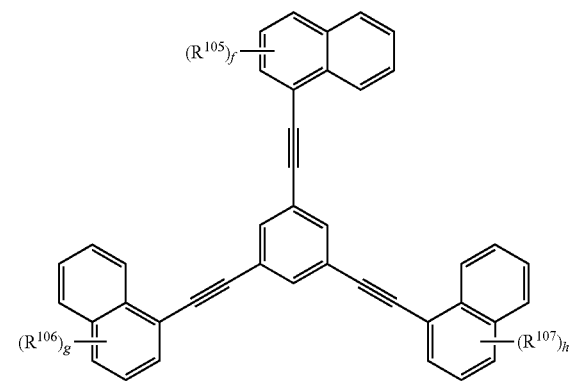

(7)

Herein, $R^{105}$, $R^{106}$, and $R^{107}$ independently are a substituted or unsubstituted alkyl group or a substituted or unsubstituted aryl group. From the aspect of enhancing a high refractive index and improving solubility, it is preferable that $R^{105}$, $R^{106}$, and $R^{107}$ independently be a methyl group, an ethyl group, a propyl group, a butyl group, an isobutyl group, or an isopropyl group.

Herein, f to h independently are an integer of 0 to 3.

The following chemical structural formula is for NVC and DNTMA which are monofunctional monomers and for exemplary compounds which are monofunctional monomers represented by General Formula (5) (the compounds 5-1 to 5-4).

[Formula 9]
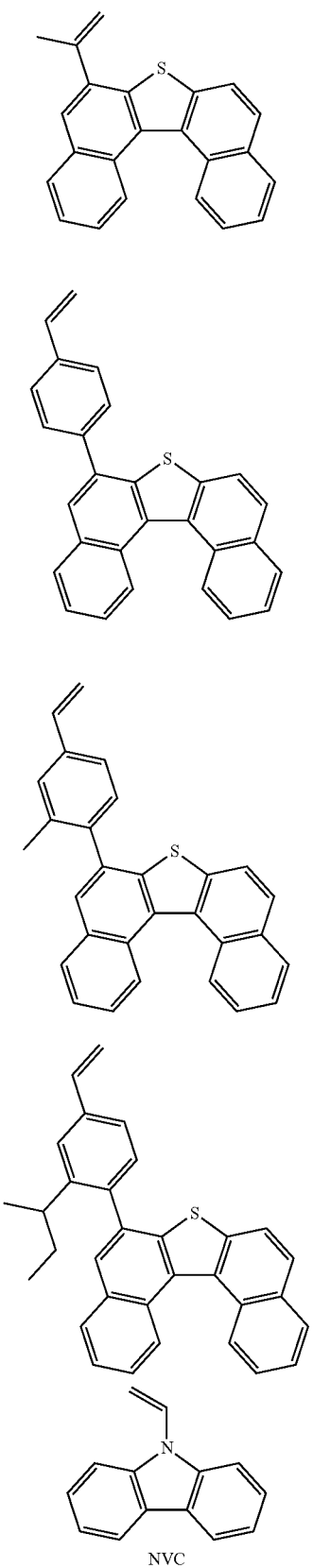
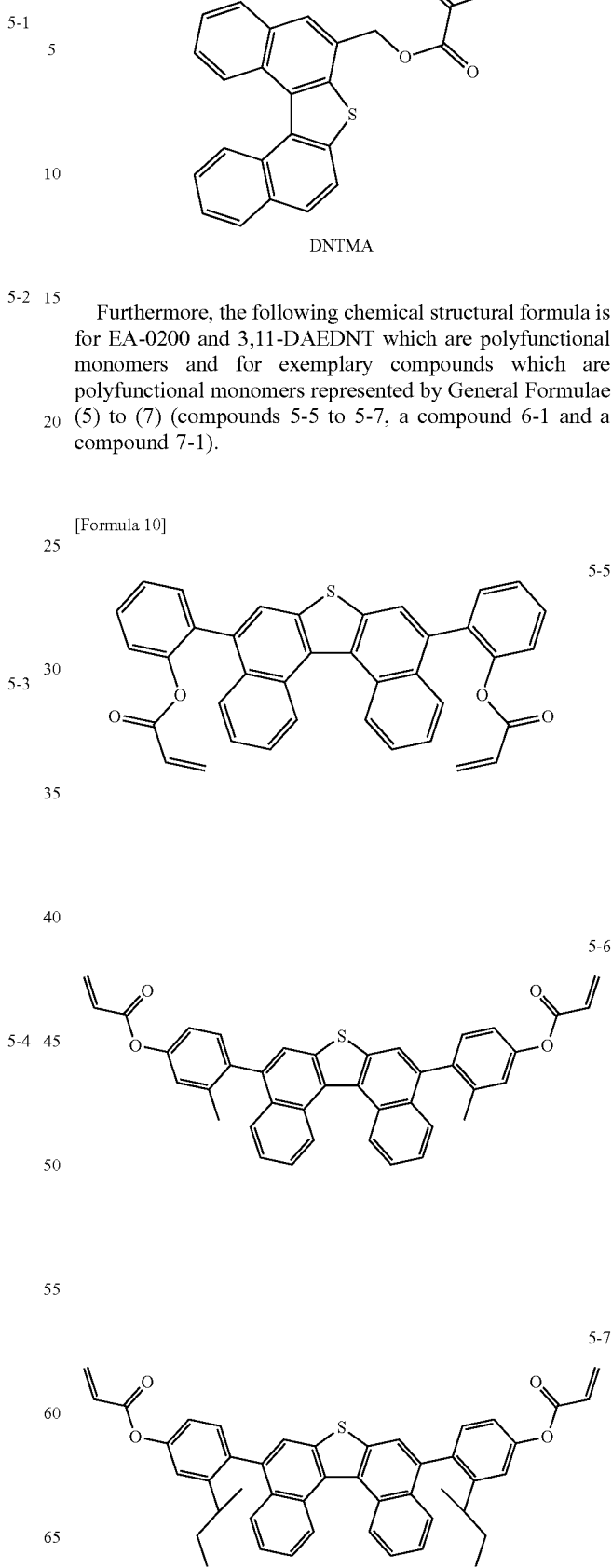
Furthermore, the following chemical structural formula is for EA-0200 and 3,11-DAEDNT which are polyfunctional monomers and for exemplary compounds which are polyfunctional monomers represented by General Formulae (5) to (7) (compounds 5-5 to 5-7, a compound 6-1 and a compound 7-1).
[Formula 10]

-continued
6-1
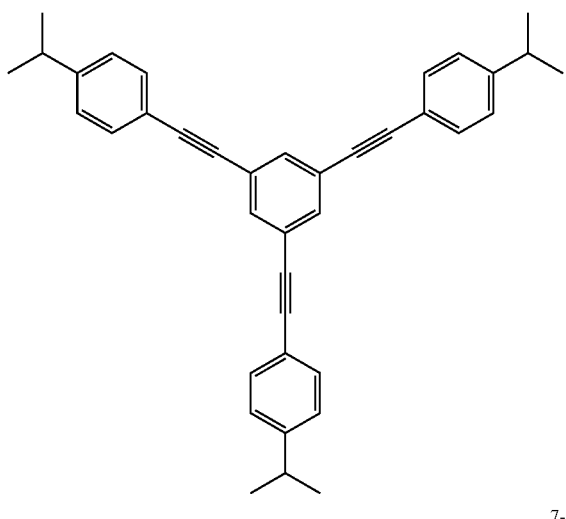
7-1
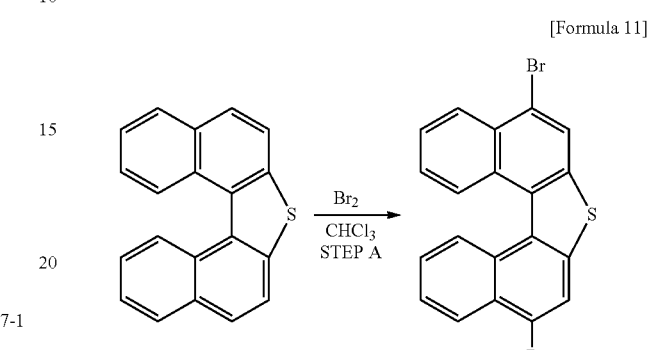
EA-0200
3,11-DAEDNT
Next, examples of synthesis of the compound 5-5, the compound 5-6, the compound 6-1, and the compound 7-1 will be illustrated.
Example of Synthesis of Compound 5-5
A synthesis scheme of the compound 5-5 is as follows.
[Formula 11]
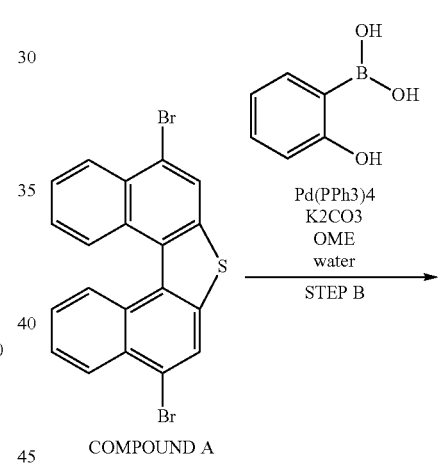
DNpTh     COMPOUND A
[Formula 12]
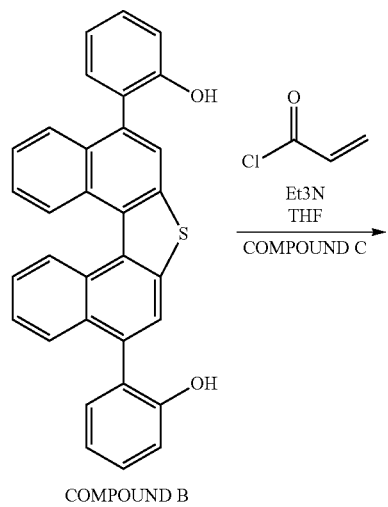
COMPOUND A
COMPOUND B

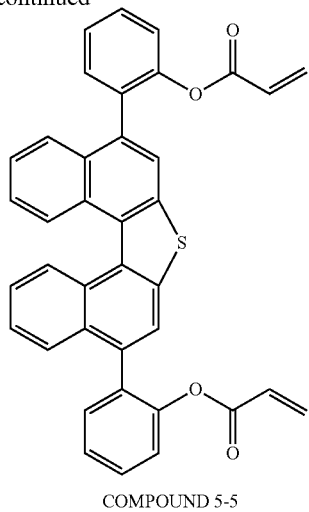

COMPOUND 5-5

(Step A)

A compound A is obtained by the following procedures.

1. Add 1.00 g (3.52 mmol, 1.00 eq.) of DNpTh (available from Sugai Chemical Industry Co., Ltd.) and 42.0 mL of chloroform (available from Tokyo Chemical Industry Co., Ltd.) to a 200 mL four-necked flask under an Ar atmosphere.

2. Cool the mixture to −5° C.

3. Drip 8.00 mL of a bromine-chloroform solution (bromine: 1.23 g (7.70 mmol, 2.19 eq.), available from Tokyo Chemical Industry Co., Ltd.) over 20 minutes at −5° C.

4. Stir the solution for 1 hour at −7 to −8° C.

5. Stir the solution overnight while allowing the solution to cool.

6. Filter a solid precipitated from the solution and wash the solid with methanol (available from FUJIFILM Wako Pure Chemical Corporation).

7. Obtain 1.47 g of a pale yellow solid.

8. While heating the solid obtained in 7 under reflux, suspend and wash the solid with 50.0 mL of chloroform.

9. While heating the solid obtained in 8 under reflux, suspend and wash the solid with 100 mL of chloroform.

10. Obtain 1.37 g of the compound A.

(Step B)

A compound B is obtained by the following procedures.

1. Charge 5.00 g (11.3 mmol, 1.00 eq.) of the compound A, 118 mL of DME, 6.24 g (45.2 mmol, 4.00 eq.) of (2-Hydroxyphenyl)boronic acid (available from Sigma-Aldrich), 12.5 g (90.4 mmol, 8.00 eq.) of potassium carbonate (available from Tokyo Chemical Industry Co., Ltd.), and 10.2 mL of distilled water into a 200 mL four-necked flask under a current of Ar.

2. Perform Ar bubbling for 1 hour.

3. Charge 1.31 g (1.13 mmol, 0.100 eq.) of Pd(PPh 3)4 (available from Tokyo Chemical Industry Co., Ltd.) to the mixture and heat the resultant.

4. Heat the mixture under reflux for 6 hours.

5. After allowing the mixture to cool, add distilled water and chloroform (available from Tokyo Chemical Industry Co., Ltd.) to the reaction solution and separate the solution.

6. Extract an aqueous layer obtained in 5 with chloroform three times.

7. Combine organic layers obtained in 5 and 6, and wash the organic layers with water.

8. Dry an organic layer obtained in 7 with magnesium sulfate (available from Tokyo Chemical Industry Co., Ltd.), and filter the organic layer.

9. Concentrate a filtrate to dryness under reduced pressure, and purify residues by passage through a column.

10. Obtain 3.18 g of the compound B.

(Step C)

The compound 5-5 is obtained by the following procedures.

1. Charge 2.90 g (6.19 mmol, 1.00 eq.) of the compound B, 50.0 mL of super dehydrated THE (available from Tokyo Chemical Industry Co., Ltd.), and 4.90 mL (35.3 mmol, 5.70 eq.) of triethylamine (available from Tokyo Chemical Industry Co., Ltd.) into a 200 mL four-necked flask under a current of Ar.

2. Cool the mixture on ice so that the internal temperature reaches 5° C.

3. Drip 2.50 mL (30.9 mmol, 5.00 eq.) of acryloyl chloride (available from FUJIFILM Wako Pure Chemical Corporation) to the reaction solution.

4. Stir the reaction solution on ice for 2 hours.

5. Pour the reaction solution into 50 mL of water to quench, and subsequently perform extraction with chloroform (available from Tokyo Chemical Industry Co., Ltd.).

6. Extract an aqueous layer obtained in 5 with chloroform three times.

7. Combine organic layers obtained in 5 and 6, and wash the organic layers with water.

8. Dry an organic layer obtained in 7 with magnesium sulfate (available from Tokyo Chemical Industry Co., Ltd.), and filter the organic layer.

9. Concentrate a filtrate to dryness under reduced pressure, and purify residues by passage through a column.

10. Obtain 1.78 g of the compound 5-5.

Example of Synthesis of Compound 5-6

A synthesis scheme of the compound 5-6 is as follows.

[Formula 13]

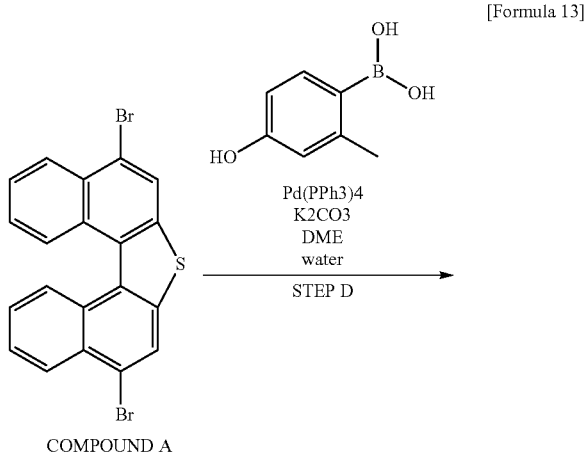

COMPOUND A

17

-continued

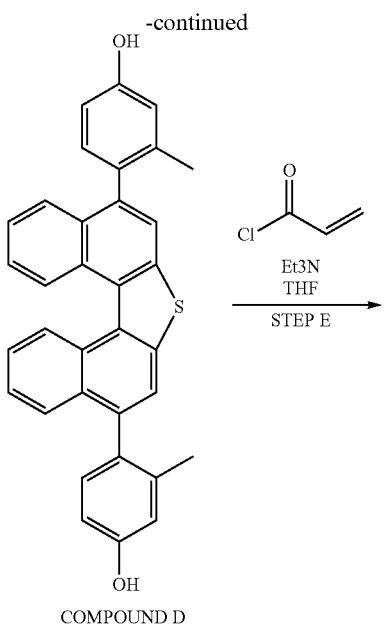

COMPOUND D

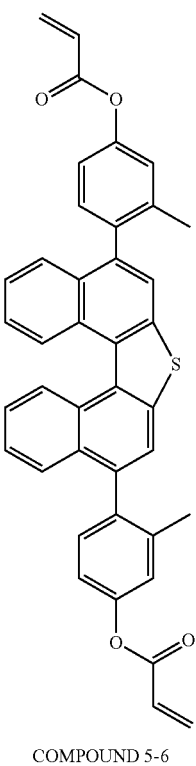

COMPOUND 5-6

(Step D)

A compound D is obtained by the following procedures. Note that the compound A is obtained on the basis of Step A.

1. Charge 2.70 g (6.11 mmol, 1.00 eq.) of the compound A, 63.5 mL of DME, 3.71 g (24.4 mmol, 4.00 eq.) of (4-Hydroxy-2-methylphenyl)boronic acid (available from Sigma-Aldrich), 6.75 g (48.9 mmol, 8.00 eq.) of potassium carbonate (available from Tokyo Chemical Industry Co., Ltd.), and 5.50 mL of distilled water into a 200 mL four-necked flask under a current of Ar.

18

2. Perform Ar bubbling for 1 hour.
3. Charge 0.710 g (0.611 mmol, 0.100 eq.) of Pd(PPh 3)4 (available from Tokyo Chemical Industry Co., Ltd.) to the mixture and heat the resultant.
4. Heat the mixture under reflux for 4.5 hours.
5. After allowing the mixture to cool, add distilled water and chloroform (available from Tokyo Chemical Industry Co., Ltd.) to the reaction solution and separate the solution.
6. Extract an aqueous layer obtained in 5 with chloroform three times.
7. Combine organic layers obtained in 5 and 6, and wash the organic layers with water.
8. Dry an organic layer obtained in 7 with magnesium sulfate, and filter the organic layer.
9. Concentrate a filtrate to dryness under reduced pressure, and purify residues by passage through a column.
10. 1.82 g of the compound D is obtained.

(Step E)

The compound 5-6 is obtained by the following procedures.

1. Charge 1.65 g (3.32 mmol, 1.00 eq.) of the compound D, 27.0 mL of super dehydrated THF (available from Tokyo Chemical Industry Co., Ltd.), and 2.64 mL (18.9 mmol, 5.70 eq.) of triethylamine into a 200 mL four-necked flask under a current of Ar.
2. Cool the mixture on ice so that the internal temperature reaches 5° C.
3. Drip 1.35 mL (16.6 mmol, 5.00 eq.) of acryloyl chloride (available from FUJIFILM Wako Pure Chemical Corporation) to the reaction solution.
4. Stir the reaction solution on ice for 2 hours.
5. Pour the reaction solution into 50 mL of water to quench, and perform extraction with chloroform (available from Tokyo Chemical Industry Co., Ltd.).
6. Extract an aqueous layer obtained in 5 with chloroform three times.
7. Combine organic layers obtained in 5 and 6, and wash the organic layers with water.
8. Dry an organic layer obtained in 7 with magnesium sulfate (available from Tokyo Chemical Industry Co., Ltd.), and filter the organic layer.
9. Concentrate a filtrate to dryness under reduced pressure, and purify residues by passage through a column.
10. Obtain 1.00 g of the compound 5-6.

Example of Synthesis of Compound 7-1

A synthesis scheme of the compound 7-1 is as follows.

[Formula 14]

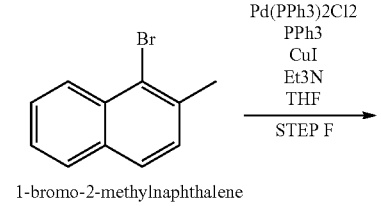

19

-continued

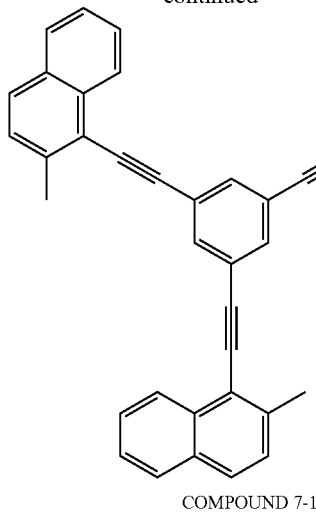

COMPOUND 7-1

(Step F)

The compound 7-1 is obtained by the following procedures.

1. Charge 2.00 g (13.3 mmol, 1.00 eq.) of 1,3,5-triethynylbenzene (available from Tokyo Chemical Industry Co., Ltd.), 9.73 g (44.0 mmol, 3.30 eq.) of 1-bromo-2-methylnaphthalene (available from Tokyo Chemical Industry Co., Ltd.), 114 mL of super dehydrated THE (available from FUJIFILM Wako Pure Chemical Corporation), and 38.1 mL (273 mmol, 20.5 eq.) of triethylamine (available from Tokyo Chemical Industry Co., Ltd.) into a 300 mL four-necked flask under a current of Ar.

2. Perform Ar bubbling for 1 hour.

3. Charge 1.02 g (1.46 mmol, 0.109 eq.) of Pd(PPh3)2Cl2 (available from Tokyo Chemical Industry Co., Ltd.), and 0.210 g (0.799 mmol, 0.060 eq.) of triphenylphosphine (available from Tokyo Chemical Industry Co., Ltd.) to the mixture, and heat the resultant.

4. Heat the mixture under reflux overnight.

5. After allowing the mixture to cool, add distilled water and chloroform (available from Tokyo Chemical Industry Co., Ltd.) to the reaction solution and separate the solution.

6. Extract an aqueous layer obtained in 5 with chloroform three times.

7. Combine organic layers obtained in 5 and 6, and wash the organic layers with water.

8. Dry an organic layer obtained in 7 with magnesium sulfate (available from Tokyo Chemical Industry Co., Ltd.), and filter the organic layer.

9. Concentrate a filtrate to dryness under reduced pressure, and purify residues by passage through a column.

10. Obtain 3.04 g of the compound 7-1.

20

Example of Synthesis of Compound 6-1

A synthesis scheme of the compound 6-1 is as follows.

[Formula 15]

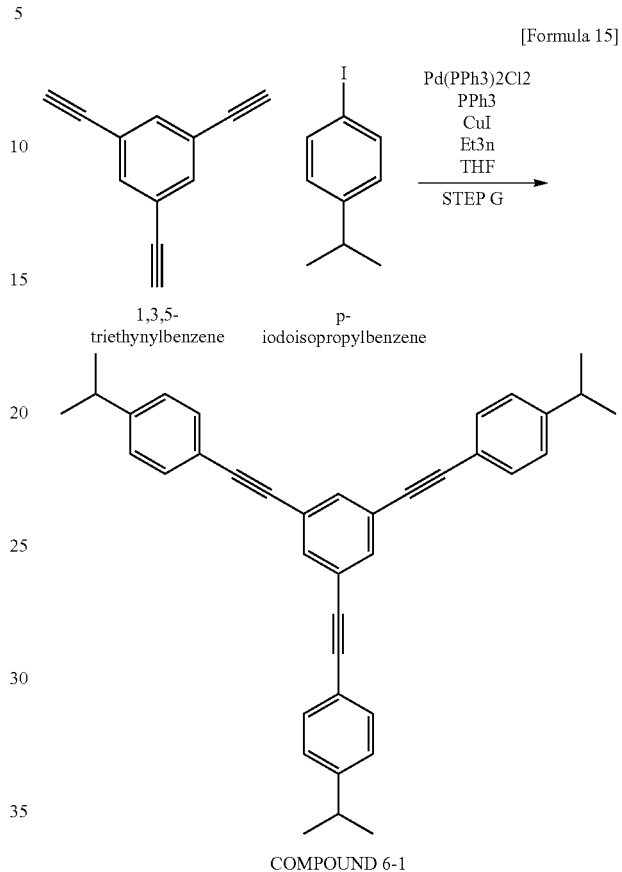

COMPOUND 6-1

(Step G)

The compound 6-1 is obtained by the following procedures.

1. Charge 2.00 g (13.3 mmol, 1.00 eq.) of 1,3,5-triethynylbenzene (available from Tokyo Chemical Industry Co., Ltd.), 10.8 g (44.0 mmol, 3.30 eq.) of p-iodoisopropylbenzene (available from FUJIFILM Wako Pure Chemical Corporation), 114 mL of super dehydrated THE (available from FUJIFILM Wako Pure Chemical Corporation), and 38.1 mL (273 mmol, 20.5 eq.) of triethylamine (available from Tokyo Chemical Industry Co., Ltd.) into a 300 mL four-necked flask under a current of Ar.

2. Perform Ar bubbling for 1 hour.

3. Charge 1.02 g (1.46 mmol, 0.109 eq.) of Pd(PPh3)2Cl2 (available from Tokyo Chemical Industry Co., Ltd.), and 0.210 g (0.799 mmol, 0.060 eq.) of triphenylphosphine (available from Tokyo Chemical Industry Co., Ltd.) to the mixture, and heat the resultant.

4. Heat the mixture under reflux overnight.

5. After allowing the mixture to cool, add distilled water and chloroform (available from Tokyo Chemical Industry Co., Ltd.) to the reaction solution and separate the solution.

6. Extract an aqueous layer obtained in 5 with chloroform three times.

7. Combine organic layers obtained in 5 and 6, and wash the organic layers with water.

8. Dry an organic layer obtained in 7 with magnesium sulfate (available from Tokyo Chemical Industry Co., Ltd.), and filter the organic layer.

9. Concentrate a filtrate to dryness under reduced pressure, and purify residues by passage through a column.

10. Obtain 2.69 g of the compound 6-1.

It is preferable that the monofunctional monomer included in the photosensitive composition for hologram recording according to the first embodiment of the present technology should be a carbazole monomer, and the polyfunctional monomer should be a fluorene monomer. In addition, the polyfunctional fluorene monomer is preferably a bifunctional fluorene monomer.

As a preferred embodiment, the photosensitive composition for hologram recording according to the first embodiment of the present technology includes at least a monofunctional carbazole monomer, a bifunctional fluorene monomer, and a quinone compound or a thiazine compound as described later as a polymerization inhibitor. Furthermore, as a preferred embodiment, the photosensitive composition for hologram recording according to the first embodiment of the present technology includes at least a monofunctional carbazole monomer, a bifunctional fluorene monomer, and a hindered phenol compound as described later or a benzotriazole compound as a polymerization inhibitor.

The monofunctional carbazole monomer is preferably 2-(9H-carbazole-9-yl)ethyl acrylate or 9H-carbazole-9-ethylmethacrylate. Furthermore, the monofunctional carbazole monomer is preferably a compound represented by the following General Formula (2).

[Formula 16]

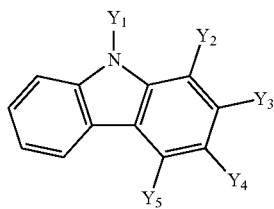

(2)

Herein, only one of $Y_1$, $Y_2$, $Y_3$, $Y_4$, and $Y_5$ is substituted with any one of substituents represented by the following General Formulae (3-1) to (3-7). Note that in a case where at least two of $Y_1$, $Y_2$, $Y_3$, $Y_4$, and $Y_5$ are at least two of the substituents represented by the following General Formulae (3-1) to (3-7), the carbazole monomer is polyfunctional (bifunctional or higher-functional) monomer.

[Formula 17]

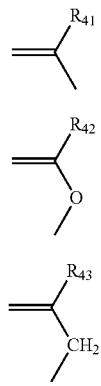

(3-1)

(3-2)

(3-3)

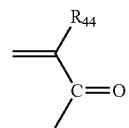

(3-4)

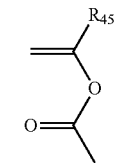

(3-5)

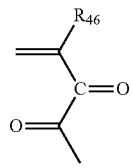

(3-6)

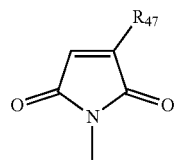

(3-7)

$Y_1$ to $Y_5$ (except for at least one of $Y_1$, $Y_2$, $Y_3$, $Y_4$, and $Y_5$ which is to be at least one of the substituents represented by General Formulae (3-1) to (3-7)) and R41 to R47 independently are, but not specifically limited to, for example, an alkyl group (for example, a methyl group, an ethyl group, a propyl group, an isopropyl group, a t-butyl group, a pentyl group, a hexyl group, an octyl group, a dodecyl group, a trifluoromethyl group, and the like), a cycloalkyl group (for example, a cyclopentyl group, a cyclohexyl group, and the like), an aryl group (for example, a phenyl group, a naphthyl group, and the like), an acylamino group (for example, an acetylamino group and a benzoylamino group), an alkylthio group (for example, a methylthio group, an ethylthio group, and the like), an arylthio group (for example, a phenylthio group, a naphthylthio group, and the like), an alkenyl group (for example, a vinyl group, a 2-propenyl group, a 3-butenyl group, a 1-methyl-3-propenyl group, a 3-pentenyl group, a 1-methyl-3-butenyl group, a 4-hexenyl group, a cyclohexenyl group, and the like), a halogen atom (for example, a fluorine atom, a chlorine atom, a bromine atom, an iodine atom, and the like), an alkynyl group (for example, a propargyl group and the like), a heterocyclic group (for example, a pyridyl group, a thiazolyl group, an oxazolyl group, an imidazolyl group, and the like), an alkylsulfonyl group (for example, a methylsulfonyl group, an ethylsulfonyl group, and the like), an arylsulfonyl group (for example, a phenylsulfonyl group, a naphthylsulfonyl group, and the like), an alkylsulfinyl group (for example, a methylsulfinyl group and the like), an arylsulfinyl group (for example, a phenylsulfinyl group and the like), a phosphono group, an acyl group (for example, an acetyl group, a pivaloyl group, a benzoyl group, and the like), a carbamoyl group (for example, an aminocarbonyl group, a methylaminocarbonyl group, a dimethylaminocarbonyl group, a butylaminocarbonyl group, a cyclohexylaminocarbonyl group, a phenylaminocarbonyl group, a 2-pyridylaminocarbonyl group, and the like), a sulfamoyl group (for example, an aminosulfonyl group, a methylaminosulfonyl group, a dimethylaminosulfonyl group, a butylaminosulfonyl group, a hexylaminosulfonyl group, a cyclohexylaminosulfonyl group, an octylaminosulfonyl group, a dodecylaminosulfonyl group, a phenylaminosulfonyl group, a naphthylaminosulfonyl group, a 2-pyridylaminosulfonyl group, and the like), a sulfonamido group (for example, a methanesulfonamido group, a benzenesulfonamido group, and the like), a cyano group, an alkoxy group (for example, a methoxy group, an ethoxy group, a propoxy group, and the like), an aryloxy (for example, a phenoxy group and a naphthyloxy group), a heterocyclic oxy group, a siloxy group, an acyloxy group (for example, an acetyloxy group, a benzoyloxy group, and the like), a sulfonic acid group, a salt of a sulfonic acid, an aminocarbonyloxy group, an amino group (for example, an amino group, an ethylamino group, a dimethylamino group, a butylamino group, a cyclopentylamino group, a 2-ethylhexylamino group, a dodecylamino group, and the like), an anilino group (for example, a phenylamino group, a chlorophenylamino group, a toluidino group, an anisidino group, a naphthylamino group, a 2-pyridylamino group, and the like), an imide group, a ureido group (for example, a methylureido group, an ethylureido group, a pentylureido group, a cyclohexylureido group, an octylureido group, a dodecylureido group, a phenylureido group, a naphthylureido group, a 2-pyridylaminoureido group, and the like), an alkoxycarbonylamino group (for example, methoxycarbonylamino group, a phenoxycarbonylamino group, and the like), an alkoxycarbonyl group (for example, a methoxycarbonyl group, a ethoxycarbonyl group, phenoxycarbonyl, and the like), an aryloxycarbonyl group (for example, a phenoxycarbonyl group and the like), a heterocyclic thio group, a thioureido group, a carboxyl group, a salt of a carboxylic acid, a hydroxyl group, a mercapto group, a nitro group, and the like. Each of these groups may include a substituent, and examples of the substituent include groups similar to those described above.

The compound represented by General Formula (2) is preferably an N-vinylcarbazole derivative or a 2-vinylcarbazole derivative, more preferably, N-vinylcarbazole or 2-vinylcarbazole.

The monofunctional carbazole monomer or the polyfunctional (bifunctional or higher-functional) carbazole monomer represented by the above General Formula (2) may be synthesized by various known synthesis, and may be synthesized, for example, on the basis of the synthesis disclosed in JP-A-2015-105239.

The bifunctional fluorene monomer (polyfunctional fluorene monomer) is preferably 9,9-bisarylfluorenes, and is, for example, a compound represented by the following General Formula (4).

Herein, the ring Z is an aromatic hydrocarbon ring, $R^1$ is a substituent, $R^2$ is an alkylene group, $R^3$ is a hydrogen atom or a methyl group, $R^4$ is a substituent, k is an integer of 0 to 4, m is an integer of 0 or more, n is an integer of 0 or more, and p is an integer of 1. In a case where p is 2 or more, note that the fluorene monomer is polyfunctional (tetrafunctional or higher-functional) monomer.

In Formula (4), examples of the aromatic hydrocarbon ring represented by the ring Z include a benzene ring, a condensed polycyclic arene (or condensed polycyclic aromatic hydrocarbon) ring, and the like. Examples of the condensed polycyclic arene (or condensed polycyclic aromatic hydrocarbon) ring include a condensed bicyclic arene ring (for example, a $C_{8-20}$ condensed bicyclic arene ring such as an indene ring or a naphthalene ring, preferably a $C_{10-16}$ condensed bicyclic arene ring), a condensed tricyclic arene ring (for example, an anthracene ring, a phenanthrene ring, and the like), and the like. Preferable examples of the condensed polycyclic arene ring include a naphthalene ring, an anthracene ring, and the like, and a naphthalene ring is particularly preferable. Note that two rings Z may be the same or different, and typically, the rings Z may be the same.

A typical ring Z is a benzene ring or a naphthalene ring, and the ring Z may be a naphthalene ring, specifically, from the viewpoints of high heat resistance, high refractive index, and the like.

Examples of the group $R^1$ in the Formula (4) include a non-reactive substituent such as a cyano group, a halogen atom (such as a fluorine atom, a chlorine atom, and a bromine atom), and a hydrocarbon group [for example, an alkyl group, an aryl group (a $C_{6-10}$ aryl group such as a phenyl group and the like)]. Specifically, the group $R^1$ is often a group other than a halogen atom, for example, an alkyl group. An example of the alkyl group include a $C_{1-12}$ alkyl group (for example, a $C_{1-8}$ alkyl group, specifically, a $C_{1-4}$ alkyl group such as a methyl group) such as a methyl group, an ethyl group, a propyl group, an isopropyl group, a butyl group, a t-butyl group, and the like. In a case where k is plural (2 or more), note that the groups $R^1$ may be different from each other or may be the same. Furthermore, the groups $R^1$ which substitutes two benzene rings included in fluorene (or a fluorene skeleton) may be the same or different. Furthermore, the binding position (substitution position) of the groups $R^1$ with respect to the benzene rings included in fluorene is not specifically limited. The number of substitutions k is preferably 0 to 1, and particularly preferably 0. In the two benzene rings included in fluorene, note that the number of substitutions k may be the same or different from each other.

[Formula 14]

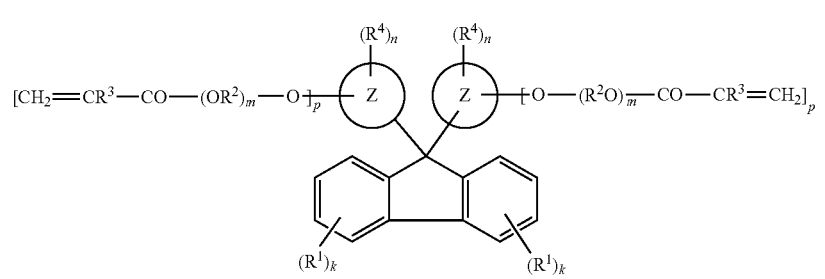

(4)

Examples of the alkylene group represented by the group $R^2$ in the Formula (4) include a $C_{2-6}$ alkylene group such as an ethylene group, a propylene group, a trimethylene group, a 1,2-butanediyl group, and a tetramethylene group, preferably a $C_{2-4}$ alkylene group, and more preferably a $C_{2-3}$ alkylene group. When m is 2 or more, note that the alkylene groups may be different, and typically, the alkylene groups may be the same. Furthermore, in the two rings Z, the groups $R^2$ may be the same or different, and typically, the rings Z may be the same.

The number (the number of moles added) m of the oxyalkylene group ($OR^2$) may be selected from a range of about 0 to 15 (for example, 0 to 12), for example, 0 to 8 (for example, 0 to 8), preferably 0 to 6 (for example, 1 to 6), and more preferably 0 to 4 (for example, 1 to 4). In particular, m may be 1 or more (for example, 1 to 4, preferably 1 to 3, more preferably 1 to 2, and particularly preferably 1). Note that the number of substitutions m may be the same or different in different rings Z. Furthermore, in the two rings Z, the total (m×2) of the oxyalkylene groups may be selected from a range of about 0 to 30 (for example, 2 to 24), for example, 0 to 16 (for example, 2 to 14), preferably 0 to 12 (for example, 2 to 10), more preferably 0 to 8 (for example, 0 to 6), and particularly preferably 0 to 4 (for example, 2 to 4).

In the Formula (4), the number of substitutions p of the group including the group $R^2$ (which may be referred to as a (meth)acryloyl group-including group or the like) is 1, but in a polyfunctional (tetrafunctional or higher-functional) fluorene monomer, the number of substitutions p is 2 or more. Note that the number of substitutions p may be the same or different in each ring Z, and typically, the number of substitutions is often the same. Note that the substitution position of the (meth)acryloyl group-including group is not specifically limited, and the (meth)acryloyl group-including group may substitute at any appropriate substitution position of the ring Z. For example, when the ring Z is a benzene ring, the (meth)acryloyl group-including group may substitute at an appropriate position from 2- to 6-positions of the benzene ring (specifically, at least the 4-position). When the ring Z is a condensed polycyclic hydrocarbon ring, the (meth)acryloyl group-including group may substitute at least at a hydrocarbon ring different from the hydrocarbon ring bonded to the 9-position of fluorene (for example, the 5-position, the 6-position, or the like of the naphthalene ring).

Examples of the substituent $R^4$ which substitutes the ring Z typically include non-reactive substituents, for example, a hydrocarbon group such as an alkyl group (for example, a $C_{1-12}$ alkyl group, preferably a $C_{1-8}$ alkyl group, and more preferably a $C_{1-6}$ alkyl group such as a methyl group, an ethyl group, a propyl group, an isopropyl group, and a butyl group), a cycloalkyl group (a $C_{5-8}$ cycloalkyl group, preferably a $C_{5-6}$ cycloalkyl group such as a cyclohexyl group, and the like), an aryl group (for example, a $C_{6-14}$ aryl group, preferably a $C_{6-10}$ aryl group, and more preferably a $C_{6-8}$ aryl group such as a phenyl group, a tolyl group, a xylyl group, a naphthyl group, and the like), an aralkyl group (a $C_{6-10}$ aryl-$C_{1-4}$ alkyl group such as a benzyl group, phenethyl group, and the like); an —$OR^5$ group [where $R^5$ represents a hydrocarbon group (such as the above exemplified hydrocarbon group)] such as an alkoxy group (a $C_{1-8}$ alkoxy group, preferably a $C_{1-6}$ alkoxy group such as a methoxy group, an ethoxy group, and the like), a cycloalkoxy group (a $C_{5-10}$ cycloalkyloxy group such as a cyclohexyloxy group and the like), an aryloxy group (a $C_{6-10}$ aryloxy group such as a phenoxy group), an aralkyloxy group (for example, a $C_{6-10}$ aryl-$C_{1-4}$ alkyloxy group such as a benzyloxy group); an —$SR^5$ group (where $R^5$ is the same as above) such as an alkylthio group (a $C_{1-8}$ alkylthio group, preferably a $C_{1-6}$ alkylthio group such as a methylthio group, an ethylthio group, and the like), a cycloalkylthio group (a $C_{5-10}$ cycloalkylthio group such as a cyclohexylthio group and the like), an arylthio group (a $C_{6-10}$ arylthio group such as a thiophenoxy group), an aralkylthio group (for example, a $C_{6-10}$ aryl-$C_{1-4}$ alkylthio group such as a benzylthio group); an acyl group (a $C_{1-6}$ acyl group such as an acetyl group and the like); an alkoxycarbonyl group (a $C_{1-4}$ alkoxy-carbonyl group such as a methoxycarbonyl group and the like); a halogen atom (such as a fluorine atom, a chlorine atom, a bromine atom, and an iodine atom); a nitro group; a cyano group; a substituted amino group (for example, a dialkylamino group such as a dimethylamino group and the like); and the like.

Preferable examples of the group $R^4$ include a hydrocarbon group [for example, an alkyl group (for example, a $C_{1-6}$ alkyl group), a cycloalkyl group (for example, a $C_{5-8}$ cycloalkyl group), an aryl group (for example, a $C_{6-10}$ aryl group), and an aralkyl group (for example, a $C_{6-8}$ aryl-$C_{1-2}$ alkyl group and the like)], an alkoxy group (such as a $C_{1-4}$ alkoxy group), and the like. In particular, $R^2$ is preferably an alkyl group [such as a $C_{1-4}$ alkyl group (specifically, a methyl group)], an aryl group [for example, a $C_{6-10}$ aryl group (specifically, a phenyl group) and the like], or the like.

In the same rings Z, in a case where n is plural (2 or more), note that the groups $R^4$ may be different from each other or may be the same. Furthermore, in the two rings Z, the groups $R^4$ may be the same or different. Furthermore, the preferable number of substitution n may be selected according to the kind of the ring Z and may be, for example, 0 to 8, preferably 0 to 4 (for example, 0 to 3), and more preferably 0 to 2. In the different rings Z, note that the number of substitutions n may be the same or different from each other, and typically, the number may be the same.

The compound represented by the Formula (4) includes 9,9-bis((meth)acryloyloxyaryl)fluorenes and 9,9-bis((meth)acryloyloxy(poly)alkoxyaryl)fluorenes.

Examples of the 9,9-bis((meth)acryloyloxyaryl)fluorenes include 9,9-bis((meth)acryloyloxyphenyl)fluorenes (a compound in which a ring Z is a benzene ring and m is 0 in the Formula (4)) such as 9,9-bis((meth)acryloyloxyphenyl)fluorene [for example, 9,9-bis(4-(meth)acryloyloxyphenyl)fluorene and the like], 9,9-bis(alkyl-(meth)acryloyloxyphenyl)fluorene [for example, 9,9-bis(mono- or di-$C_{1-4}$ alkyl-(meth)acryloyloxyphenyl)fluorene such as 9,9-bis(4-(meth)acryloyloxy-3-methylphenyl)fluorene and 9,9-bis(4-(meth)acryloyloxy-3,5-dimethylphenyl)fluorene], 9,9-bis(aryl(meth)acryloyloxyphenyl)fluorene [for example, 9,9-bis(mono- or di-$C_{6-8}$ aryl(meth)acryloyloxyphenyl)fluorene such as 9,9-bis(4-(meth)acryloyloxy-3-phenylphenyl)fluorene], 9,9-bis(poly(meth)acryloyloxyphenyl)fluorene {for example, 9,9-bis(di- or tri-(meth)acryloyloxyphenyl)fluorene such as 9,9-bis[3,4-di((meth)acryloyloxy)phenyl]fluorene, 9,9-bis[3,4,5-tri((meth)acryloyloxy)phenyl]fluorene}, and the like; 9,9-bis((meth)acryloyloxynaphthyl)fluorenes (a compound in which a ring Z is a naphthalene ring and m is 0 in the Formula (4)) such as 9,9-bis((meth)acryloyloxynaphthyl)fluorene [for example, 9,9-bis[6-(2-(meth)acryloyloxynaphthyl)]fluorene, 9,9-bis[1-(5-(meth)acryloyloxynaphthyl)]fluorene, and the like]; and the like.

The 9,9-bis((meth)acryloyloxy(poly)alkoxyaryl)fluorenes corresponds to the 9,9-bis((meth)acryloyloxyaryl)fluorenes and are compounds in which m is 1 or more in Formula (4). Examples of the 9,9-bis((meth)acryloyloxy(poly)alkoxyaryl)fluorenes include 9,9-bis((meth)acryloyloxy(poly) alkoxyphenyl)fluorenes (a compound in which a ring Z is a benzene ring and m is 1 or more in Formula (4)) such as 9,9-bis{[2-(2-(meth)acryloyloxy $C_{2-4}$ alkoxy) $C_{2-4}$ alkoxy] phenyl}fluorene such as 9,9-bis((meth)acryloyloxyalkoxyphenyl)fluorene [for example, 9,9-bis((meth)acryloyloxy $C_{2-4}$ alkoxyphenyl)fluorene such as 9,9-bis(4-(2-(meth)acryloyloxyethoxy)phenyl)fluorene and the like], 9,9-bis((meth)acryloyloxydialkoxyphenyl)fluorene (for example, 9,9-bis{4-[2-(2-(meth)acryloyloxyethoxy)ethoxy] phenyl}fluorene and the like], 9,9-bis(alkyl-(meth)acryloyloxyphenyl)fluorene [for example, 9,9-bis(mono- or di-$C_{1-4}$ alkyl(meth)acryloyloxy $C_{2-4}$ alkoxyphenyl)fluorene such as 9,9-bis(4-(2-(meth)acryloyloxyethoxy-3-methylphenyl)fluorene, 9,9-bis(4-(2-(meth)acryloyloxyethoxy-3,5-dimethylphenyl)fluorene, and the like], 9,9-bis(aryl-(meth)acryloyloxyphenyl)fluorene [for example, 9,9-bis (mono- or di-$C_{6-8}$ aryl(meth)acryloyloxy $C_{2-4}$ alkoxyphenyl) fluorene such as 9,9-bis(4-(2-(meth)acryloyloxyethoxy)-3-phenylphenyl)fluorene and the like], 9,9-bis(di- or tri-(meth) acryloyloxyalkoxy)phenyl)fluorene [for example, 9,9-bis (di- or tri-(meth)acryloyloxy $C_{2-4}$ alkoxy)phenyl)fluorene such as 9,9-bis[3,4-di(2-(meth)acryloyloxyethoxy)phenyl] fluorene, 9,9-bis[3,4,5-tri(2-(meth)acryloyloxy)phenyl]fluorene, and the like]; 9,9-bis((meth)acryloyloxy(poly) alkoxynaphthyl)fluorenes (a compound in which a ring Z is a naphthalene ring and m is 1 or more in Formula (4)) such as 9,9-bis((meth)acryloyloxyalkoxynaphthyl)fluorene [for example, 9,9-bis((meth)acryloyloxy $C_{2-4}$ alkoxynaphthyl] fluorene and the like]; and the like.

The bifunctional fluorene monomer (polyfunctional fluorene monomer) or the tetrafunctional or higher-functional fluorene monomer (polyfunctional fluorene monomer) represented by the above General Formula (4) may be synthesized by various known synthesis techniques, and may be synthesized, for example, on the basis of the synthesis disclosed in JP-A-2012-111942.

It is preferable that the monofunctional monomer included in the photosensitive composition for hologram recording according to the first embodiment of the present technology should be a fluorene monomer, and the polyfunctional monomer should be a carbazole monomer. In addition, the polyfunctional carbazole monomer is preferably a bifunctional carbazole monomer.

It is preferable that the monofunctional monomer included in the photosensitive composition for hologram recording according to the first embodiment of the present technology should be a compound represented by the following General Formula (8).

[Formula 19]

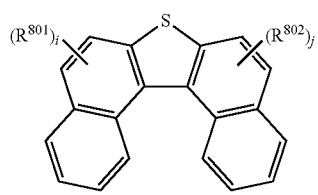
(8)

In the above General Formula (8), $R^{801}$ and $R^{802}$ are independently a univalent substituent represented by the following General Formula (9). Furthermore, i and j in the above General Formula (8) are independently an integer of 0 or 1, and i and j are not simultaneously 0 or 1.

[Formula 20]

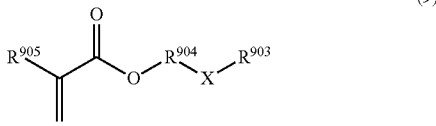
(9)

$R^{903}$ and $R^{904}$ in the above General Formula (9) are independently a single bond or a substituted or unsubstituted straight or branched $C_{1-10}$ alkylene group. Examples of the straight or branched $C_{1-10}$ alkylene group include a methyl group, an ethyl group, a propyl group, an isopropyl group, a butyl group, and an isobutyl group. Furthermore, the straight or branched $C_{1-10}$ alkylene group may be substituted with, for example, a halogen element.

In the above General Formula (9), $R^{905}$ is hydrogen or a substituted or unsubstituted straight or branched $C_{1-10}$ alkyl group. Examples of the straight or branched $C_{1-10}$ alkyl group include a methyl group, an ethyl group, a propyl group, an isopropyl group, a butyl group, and an isobutyl group. Furthermore, the straight or branched $C_{1-10}$ alkyl group may be substituted with, for example, a halogen element.

Furthermore, X is a divalent aromatic group represented by the following Formulae (9-1) to (9-8). The divalent aromatic group may be unsubstituted or may include at least one substituent. Two binding sites of the divalent aromatic group for $R^{903}$ and $R^{904}$ may be on any carbon in the aromatic group that is to be bound. When the divalent aromatic group includes at least one substituent, the substituent is preferably a straight or branched $C_{1-10}$ alkyl group, an aromatic group, or a halogen element. Examples of the straight or branched $C_{1-10}$ alkyl group include a methyl group, an ethyl group, a propyl group, an isopropyl group, a butyl group, and an isobutyl group. Furthermore, the straight or branched $C_{1-10}$ alkyl group may be substituted with, for example, a halogen element. Furthermore, the aromatic group is preferably a univalent or higher aromatic group represented by (9-1) to (9-8). Alternatively, the aromatic group may be unsubstituted or may include at least one substituent. When the univalent or higher aromatic group includes at least one substituent, similarly to the substituent of X, the substituent is preferably a straight or branched $C_{1-10}$ alkyl group, an aromatic group, or a halogen element.

[Formula 21]

(9-1)

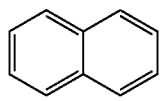
(9-2)

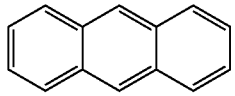
(9-3)

(9-4)

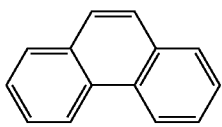

[Formula 22]

(9-5)

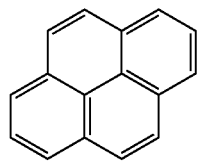

(9-6)

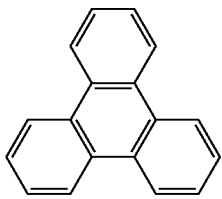

(9-7)

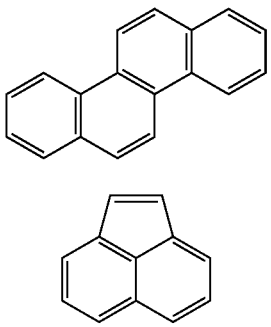

(9-8)

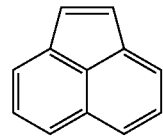

The following chemical structural formula is for preferable exemplary compounds represented by the above General Formula (8) (compounds 10-1 to 10-6). In addition, from the viewpoint of further improving the diffraction characteristic, the compound 10-1 and the compound 10-2 are more preferably used in the photosensitive composition for hologram recording according to the first embodiment of the present technology.

[Formula 23]

(10-1)

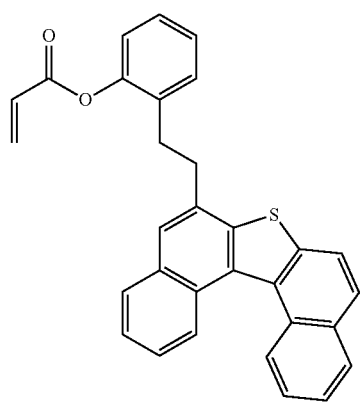

(10-2)

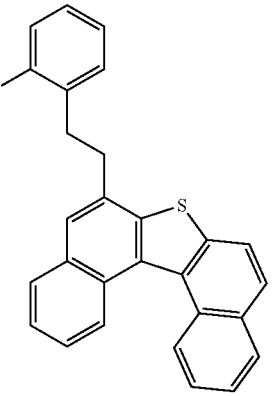

[Formula 24]

(10-3)

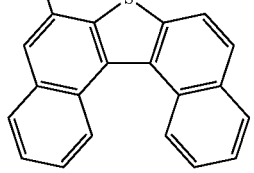

(10-4)

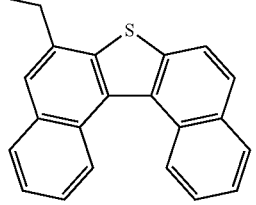

[Formula 25]

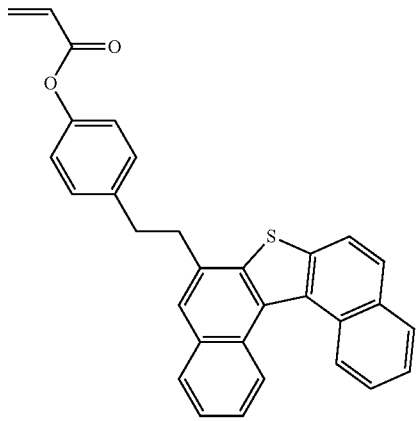
(10-5)

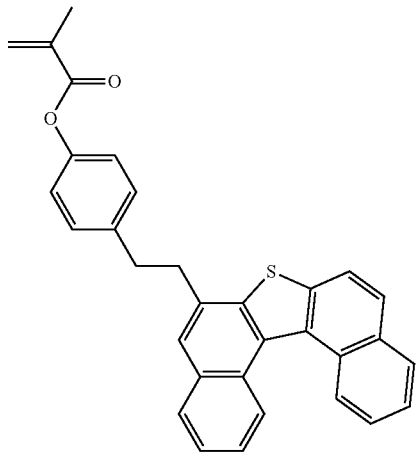
(10-6)

The monofunctional monomer included in the photosensitive composition for hologram recording according to the first embodiment of the present technology may be a compound represented by the above General Formula (8), and the polyfunctional monomer may be a fluorene monomer. Furthermore, the monofunctional monomer included in the photosensitive composition for hologram recording according to the first embodiment of the present technology may be a compound represented by the above General Formula (8), and the polyfunctional monomer may be a dinaphthothiophene monomer.

2-3. Binder Resin

The binder resin included in the photosensitive composition for hologram recording according to the first embodiment of the present technology is not specifically limited and may be any binder resin. A preferable example of the binder resin includes a vinyl acetate resin, specifically, polyvinyl acetate or a hydrolysate thereof. Furthermore, an acrylic resin, specifically, a poly(meth)acrylic acid ester or a partial hydrolysate thereof is preferably used.

Other preferable binder resins include copolymers including, as a polymerization component, at least one copolymerizable monomer group such as polyvinyl alcohol or a partial acetalized product thereof, triacetyl cellulose, polyisoprene, polybutadiene, polychloroprene, silicone rubber, polystyrene, polyvinyl butyral, polychloroprene, polyvinyl chloride, polyarylate, chlorinated polyethylene, chlorinated polypropylene, poly-N-vinylcarbazole or a derivative thereof, poly-N-vinylpyrrolidone or a derivative thereof, polyarylate, a copolymer of styrene and maleic anhydride or a half ester thereof, acrylic acid, acrylic acid ester, methacrylic acid, methacrylic acid ester, acrylamide, acrylonitrile, ethylene, propylene, vinyl chloride, vinyl acetate, and the like; and mixtures thereof. Moreover, as a copolymerization component, a monomer including a thermosetting or photosetting curable functional group may be used. The use of a curable monomer in this manner enhances film strength and improves heat resistance and mechanical strength.

Furthermore, as a preferable example of the binder resin, an oligomer type curable resin may also be used. Examples of the oligomer type curable resin include various phenolic compounds such as bisphenol A, bisphenol S, novolak, o-cresol novolak, p-alkylphenol novolak, and the like and epoxy compounds produced by a condensation reaction with epichlorohydrin.

2-4. Photopolymerization Initiator

The photopolymerization initiator included in the photosensitive composition for hologram recording according to the first embodiment of the present technology is not specifically limited and may be any type of photopolymerization initiator. Preferable examples of the photopolymerization initiator include a radical polymerization initiator (radical generator) or a cationic polymerization initiator (acid generator) of an imidazole type, a bisimidazole type, an N-arylglycine type, an organic azide compound type, a titanocene type, an aluminate complex type, an organic peroxide type, an N-alkoxypyridinium salt type, a thioxanthone derivative type, a sulfonic acid ester type, an imidosulfonate type, a dialkyl-4-hydroxysulfonium salt type, an arylsulfonic acid-p-nitrobenzyl ester type, a silanol-aluminum complex type, a ($\eta$6-benzene) ($\eta$5-cyclopentadienyl) iron(II) type, a ketone type, a diaryliodonium salt type, a diaryliodonium organic boron complex type, an aromatic sulfonium salt type, an aromatic diazonium salt type, an aromatic phosphonium salt type, a triazine compound type, an iron arene complex type, and the like, or one that has functions of both radical polymerization initiator and cationic polymerization initiator. Note that the photopolymerization initiator included in the photosensitive composition for hologram recording according to the first embodiment of the present technology may be an anionic polymerization initiator (base generator).

For example, the radical polymerization initiator (radical generator) may be, but is not limited to, 1,3-di(t-butyldioxycarbonyl)benzophenone, 3,3',4,4'-tetrakis(t-butyldioxycarbonyl)benzophenone, 3-phenyl-5-isoxazolone, 2-mercaptobenzimidazole, bis(2,4,5-triphenyl) imidazole, 2,2-dimethoxy-1,2-diphenylethan-1-one (trade name: Irgacure 651, available from Ciba Specialty Chemicals Inc.), 1-hydroxy-cyclohexyl-phenyl-ketone (trade name: Irgacure 184, available from Ciba Specialty Chemicals Inc.), 2-benzyl-2-dimethylamino-1-(4-morpholinophenyl)-1-butanone (trade name: Irgacure 369, available from Ciba Specialty Chemicals Inc.), bis($\eta$5-2,4-cyclopentadien-1-yl)-bis(2,6-difluoro-3-(1H-pyrrol-1-yl)-phenyl)titanium (trade name: Irgacure 784, available from Ciba Specialty Chemicals Inc.), and the like.

For example, the cationic polymerization initiator (acid generator) may be, but is not limited to, benzoin tosylate, 2,5-dinitrobenzyl tosylate, N-tosyphthalic acid imide, and the like.

For example, a compound which may be used as the radical polymerization initiator (radical generator) and also as the cationic polymerization initiator (acid generator) may be, but is not limited to, iodonium chloride such as 4-isopropyl-4'-methyldiphenyliodonium tetrakis(pentafluorophenyl)borate, diphenyliodonium, ditolyliodonium, bis(p-tert-butylphenyl) iodonium, and bis(p-chlorophenyl) iodonium; an iodonium salt such as bromide, a borofluoride salt, a hexafluorophosphate salt, and a hexafluoroantimonate salt; sulfonium chloride such as triphenylsulfonium, 4-tert-butyl-triphenylsulfonium, and tris(4-methylphenyl)sulfonium; a sulfonium salt such as bromide, borofluoride, a hexafluorophosphate salt, and a hexafluoroantimonate salt; a 2,4,6-substitute-1,3,5-triazine compound such as 2,4,6-tris(trichloromethyl)-1,3,5-triazine, 2-phenyl-4,6-bis(trichloromethyl)-1,3,5-triazine, and 2-methyl-4,6-bis(trichloromethyl)-1,3,5-triazine; and the like.

2-5. Polymerization Inhibitor

The polymerization inhibitor included in the photosensitive composition for hologram recording according to the first embodiment of the present technology is not specifically limited and may be any polymerization inhibitor. Preferable examples of the polymerization inhibitor include a quinone compound, a hindered phenol compound, a benzotriazole compound, a thiazine compound, and the like. An example of the quinone compound includes hydroquinone, and hydroquinone may be regarded as one type of phenol compound. An example of the thiazine compound include phenothiazine.

The hindered phenol compound is preferably, but not specifically limited to, a compound which has a structure difficult to diffuse in the photosensitive composition for hologram recording (photosensitive layer) and has a large steric hindrance. More preferably, the hindered phenol compound is a compound having a 2,6-dialkylphenol structure. For example, n-octadecyl 3-(4'-hydroxy-3',5'-di-tert-butylphenyl)propionate (trade name: ADK STAB AO-50, available from Adeka Corporation) and the like is used preferably.

The benzotriazole compound is preferably, but not specifically limited to, a compound having a structure difficult to diffuse in the photosensitive composition for hologram recording (photosensitive layer) and has a large steric hindrance. For example, 2,2'-methylenebis[6-(2H-benzotriazol-2-yl)-4-(1,1,3,3-tetramethylbutyl)phenol] (trade name: ADK STAB LA-31, available from Adeka Corporation) is used preferably.

As a preferred embodiment, the photosensitive composition for hologram recording according to the first embodiment of the present technology includes at least the monofunctional carbazole monomer, the bifunctional fluorene monomer, and n-octadecyl 3-(4'-hydroxy-3',5'-di-tert-butylphenyl)propionate (trade name: ADK STAB AO-50, available from Adeka Corporation).

Furthermore, as a preferred embodiment, the photosensitive composition for hologram recording according to the first embodiment of the present technology includes at least the monofunctional carbazole monomer, the bifunctional fluorene monomer, and 2,2'-methylenebis[6-(2H-benzotriazol-2-yl)-4-(1,1,3,3-tetramethylbutyl)phenol] (trade name: ADK STAB LA-31, available from Adeka Corporation).

The photosensitive composition for hologram recording may include one kind of polymerization inhibitor, or two or more kinds of polymerization inhibitors. For example, the quinone compound and the phenol compound, or the quinone compound and the benzotriazole compound may be used in combination.

The polymerization inhibitor may be included in the photosensitive composition for hologram recording in any amount, but the polymerization inhibitor is preferably included in an amount of 0.01% by mass to 10% by mass, more preferably 0.1% by mass to 5.0% by mass, with respect to the total mass of the photosensitive composition for hologram recording. Furthermore, a mole ratio of the polymerization inhibitor to the photopolymerization initiator is preferably from 0.1 to 10, and more preferably from 0.5 to 1.5.

2-6. Inorganic Particulate

The photosensitive composition for hologram recording according to the first embodiment of the present technology preferably includes an inorganic particulate. By including the inorganic particulate in the photosensitive composition for hologram recording, the effect of increasing the amount of refractive index change ($\Delta n$) is exerted. The inorganic particulate is preferably, but not specifically limited to, $TiO_2$ particulate or $ZrO_2$ particulate.

The photosensitive composition for hologram recording may include one kind of inorganic particulate, or two or more kinds of inorganic particulates. For example, the above $TiO_2$ particulate and $ZrO_2$ particulate may be used in combination.

As a preferred embodiment, the photosensitive composition for hologram recording according to the first embodiment of the present technology includes at least the monofunctional carbazole monomer, the bifunctional fluorene monomer, and the $TiO_2$ particulate.

Furthermore, as a preferred embodiment, the photosensitive composition for hologram recording according to the first embodiment of the present technology includes at least the monofunctional carbazole monomer, the bifunctional fluorene monomer, and the $ZrO_2$ particulate.

The inorganic particulate may be included in the photosensitive composition for hologram recording in any amount, but the inorganic particulate is preferably included in an amount of 15% by mass to 85% by mass with respect to the total mass of the photosensitive composition for hologram recording.

[2-7. Plasticizer]

The photosensitive composition for hologram recording according to the first embodiment of the present technology may include a plasticizer. The plasticizer is present in order to change physical characteristics of the photosensitive composition for hologram recording such as adhesiveness, flexibility, hardness, and other characteristics. Examples of the plasticizer include triethylene glycol, triethylene glycol diacetate, triethylene glycol dipropionate, triethylene glycol dicaprylate, triethylene glycol dimethyl ether, poly(ethylene glycol), poly(ethylene glycol) methyl ether, triethylene glycol bis(2-ethylhexanoate), tetraethylene glycol diheptanoate, diethyl sepacate, dibutyl suberate, tris(2-ethylhexyl) phosphate, isozorobyl naphthalene, diisopropyl naphthalene, poly(propylene glycol), glyceryl tributyrate, diethyl adipate, diethyl sebacate, nobutyl suberate, tributyl phosphate, tris(2-ethylhexyl)phosphate, and the like.

The photosensitive composition for hologram recording may include one kind of plasticizer, or two or more kinds of plasticizers.

The plasticizer may be included in the photosensitive composition for hologram recording in any amount, but the plasticizer is preferably included in an amount of 5% by mass to 40% by mass with respect to the total mass of the photosensitive composition for hologram recording.

2-8. Sensitizing Dye

The photosensitive composition for hologram recording according to the first embodiment of the present technology may include a sensitizing dye. The sensitizing dye intensifies sensitivity of the photopolymerization initiator with respect to light. Specifically, examples of the sensitizing dye include a thiopyrylium salt dye, a merocyanine dye, a quinoline dye, a rose bengal dye, a styryl quinoline dye, a ketocoumarin dye, a thioxanthene dye, a xanthene dye, an oxonol dye, a cyanine dye, an acridine dye, a rhodamine dye, a pyrylium salt dye, a cyclopentanone dye, a cyclohexanone dye, and the like. Specifically, the cyanine dye and the merocyanine dye may be, but are not limited to, 3,3'-dicarboxyethyl-2,2'-thiocyanine bromide, 1-carboxymethyl-1'-carboxyethyl-2,2'-quinocyanine bromide, 1,3'-diethyl-2,2'-quinothiacyanine Iodide, 3-ethyl-5-[(3-ethyl-2(3H)-benzothiazolylidene)ethylidene]-2-thioxo-4-oxazolidine, and the like and specific examples of a coumarin dye and the ketocoumarin dye may include, but are not limited to, 3-(2'-benzimidazole)-7-diethylaminocoumarin, 3,3'-carbonylbis(7-diethylaminocoumarin), 3,3'-carbonylbiscoumarin, 3,3'-carbonylbis(5,7-dimethoxycoumarin), 3,3'-carbonylbis(7-acetoxycoumarin), and the like.

The photosensitive composition for hologram recording may include one kind of sensitizing dye, or two or more kinds of sensitizing dyes.

The sensitizing dye may be included in the photosensitive composition for hologram recording in any amount, but the sensitizing dye is preferably included in an amount of 0.01% by mass to 3.0% by mass with respect to the total mass of the photosensitive composition for hologram recording.

2-9. Chain Transfer Agent

The photosensitive composition for hologram recording according to the first embodiment of the present technology may include a chain transfer agent. The chain transfer agent withdraws radicals from a growing end of the polymerization reaction, stops the growth, and becomes a new polymerization reaction initiation species which is added to the photopolymerizable monomer to start the growth of a new polymer. The use of the chain transfer agent increases the frequency in chain transfer of radical polymerization, which increases a rate of reaction of the photopolymerizable monomer and improves sensitivity. Furthermore, an increase in rate of reaction of the photopolymerizable monomer increases reaction-contributing components, which makes it possible to adjust the degree of polymerization of the photopolymerizable monomer.

Specific examples of the chain transfer agent include α-methylstyrene dimer, 2-mercaptobenzoxazole, 2-mercaptobenzothiazole, tert-butyl alcohol, n-butanol, isobutanol, isopropylbenzene, ethylbenzene, chloroform, methyl ethyl ketone, propylene, vinyl chloride, and the like.

The photosensitive composition for hologram recording may include one kind of chain transfer agent, or two or more kinds of chain transfer agents.

The chain transfer agent may be included in the photosensitive composition for hologram recording in any amount, but the chain transfer agent is preferably included in an amount of 0.1% by mass to 1.0% by mass with respect to the total mass of the photosensitive composition for hologram recording.

2-10. Solvent

The photosensitive composition for hologram recording according to the first embodiment of the present technology may include a solvent. Solvents are effective for adjusting viscosity and compatibility and for improving film formability or the like. For example, acetone, xylene, toluene, methyl ethyl ketone, tetrahydrofuran, benzene, methylene chloride, dichloromethane, chloroform, methanol, and the like are often used as a solvent.

The photosensitive composition for hologram recording may include one kind of solvent, or two or more kinds of solvents.

The solvent may be included in the photosensitive composition for hologram recording in any amount, but the solvent is preferably included in an amount of 5% by mass to 95% by mass with respect to the total mass of the photosensitive composition for hologram recording.

2-11. Method for Producing Photosensitive Composition for Hologram Recording The photosensitive composition for hologram recording according to the first embodiment of the present technology is produced by, for example, adding to the solvent at least two kinds of photopolymerizable monomers, a photopolymerization initiator, a binder resin, and a polymerization inhibitor in a predetermined amount at room temperature or the like, and by dissolving and mixing those additives. Furthermore, an inorganic particulate, a plasticizer, a sensitizing dye, a chain transfer agent, and the like may be added to the photosensitive composition depending on use, purpose, and the like. When the photosensitive composition for hologram recording according to the first embodiment of the present technology is formed on a transparent base material including in a hologram recording medium as described later, the photosensitive composition for hologram recording may be used as a coating solution.

3. Second Embodiment (Example of Hologram Recording Medium)

3-1. Hologram Recording Medium

A hologram recording medium according to a second embodiment of the present technology includes at least a photosensitive layer including the photosensitive composition for hologram recording according to the first embodiment of the present technology, and at least one transparent base material. The photosensitive layer herein is formed on the at least one transparent base material. The hologram recording medium according to the second embodiment of the present technology may have a three-layer structure in which the photosensitive layer is formed on a first transparent base material and a second transparent base material is formed on a main surface of the photosensitive layer on which the first transparent base material is not formed.

FIG. 1 is a cross-sectional view schematically showing an example of the hologram recording medium according to the second embodiment of the present technology. A hologram recording medium 11 illustrated herein has a three-layer structure in which a photosensitive layer 12 is disposed between a pair of transparent substrates, that is, a polyvinyl alcohol film (transparent base material) 11 and a glass substrate (transparent base material) 13.

The hologram recording medium according to the second embodiment of the present technology offers a high amount of refractive index change (Δn) and an excellent diffraction characteristic.

3-2 Photosensitive Layer

The photosensitive layer included in the hologram recording medium according to the second embodiment of the present technology may include the photosensitive composition for hologram recording according to the first embodiment of the present technology and other materials, or may include the photosensitive composition for hologram recording according to the first embodiment of the present technology.

The photosensitive layer may have any thickness, but preferably has a thickness of 0.1 μm or more and 100 μm or less. Having a thickness of less than 0.1 μm, the photosensitive layer may have difficulty in obtaining a sufficient diffraction efficiency. On the other hand, having a thickness over 100 μm, the photosensitive layer may not further improve in sensitivity and diffraction efficiency.

3-3. Transparent Base Material

Examples of the transparent base material included in the hologram recording medium according to the second embodiment of the present technology include a glass substrate, a transparent resin substrate, and the like.

Specific examples of the transparent resin substrate include transparent substrates such as a polyethylene film, a polypropylene film, a polyethylene fluoride film, a polyvinylidene fluoride film, a polyvinyl chloride film, a polyvinylidene chloride film, an ethylene-vinyl alcohol film, a polyvinyl alcohol film, a polymethyl methacrylate film, a polyether sulfone film, a polyether ether ketone film, a polyamide film, a tetrafluoroethylene-perfluoroalkyl vinyl ether copolymer film, a polyester film such as a polyethylene terephthalate film, and a polyimide film.

The transparent base material may have any film thickness, but the film thickness is preferably 0.1 μm to 100 μm from the viewpoint of transparency and rigidity of the hologram recording medium. The above exemplified film may be used as a protective film, and the film may be laminated on a coated surface. In this case, a contact surface between the laminated film and the coated surface may be subjected to mold-release treatment so as to make it easier to peel the laminated film afterward.

3-4. Method for Producing Hologram Recording Medium

As described above, the hologram recording medium according to the second embodiment of the present technology is obtained by, for example, applying a coating solution that includes the photosensitive composition for hologram recording to the transparent base material with a spin coater, a gravure coater, a comma coater, a bar coater, or the like and by drying the solution to form a photosensitive layer.

4. Third Embodiment (Example of Hologram)

4-1. Hologram

A hologram according to a third embodiment of the present technology is obtained with use of the hologram recording medium according to the second embodiment of the present technology, and an amount of refractive index change of the hologram is 0.06 or more.

The hologram according to the third embodiment of the present technology offers an amount of refractive index change (Δn) of 0.06 or more and an excellent diffraction characteristic.

4-2. Method for Producing Hologram

The hologram according to the third embodiment of the present technology is obtained by, for example, performing two-luminous-flux interference exposure on the hologram recording medium according to the second embodiment of the present technology with a semiconductor laser or the like in the range of visible light, and by irradiating the entire surface of the hologram recording medium with UV light to cure an uncured photopolymerizable monomer and to fix a refractive index distribution on the hologram recording medium. Conditions for the two-luminous-flux interference exposure may be selected arbitrarily depending on use and purpose. However, it is preferable that the two-luminous-flux interference exposure should be performed for 1 second to 1000 seconds, setting the light intensity of a single luminous flux on the recording medium to a range from 0.1 mW/cm$^2$ to 100 mW/cm$^2$, and setting an angle formed by the two luminous fluxes to a range from 0.1° to 179.9°.

EXAMPLE

Hereinafter, effects of the present technology will be described in detail with reference to Examples. Note that the scope of the present technology is not limited to Examples.

First, evaluation of a diffraction characteristic will be described.

<Evaluation of Diffraction Characteristic>
(Method for Calculating Amount of Refractive Index Change)

The amount of refractive index change (hereinafter also referred to as Δn) was calculated on the basis of the Kogelnik theoretical formula.

Example 1

(Preparation of Photosensitive Composition for Hologram Recording 1)

A photosensitive composition for hologram recording 1 was prepared by mixing, at room temperature, 1.1 g of bisphenoxy ethanol fluorene dimethacrylate ("EA-0200", available from Osaka Gas Chemicals Co., Ltd.) as a polyfunctional (bifunctional) photopolymerizable monomer, 0.4 g of N-vinylcarbazole ("NVC", available from Tokyo Chemical Industry Co., Ltd.) as a monofunctional photopolymerizable monomer, 0.7 g of polyvinyl acetate ("SN-09T", available from Denka Company Limited) as a binder resin, 0.09 g of 4-isopropyl-4'-methyldiphenyliodonium tetrakis(pentafluorophenyl)borate ("DI", available from Tokyo Chemical Industry Co., Ltd.) as a photopolymerization initiator, 0.01 g of hydroquinone ("HQ", available from FUJIFILM Wako Pure Chemical Corporation) as a polymerization inhibitor, 1 g of diethyl sebacate ("SDE", available from FUJIFILM Wako Pure Chemical Corporation) as a plasticizer, 0.02 g of 3,3'-carbonylbis(7-diethylaminocoumarin) ("BC", available from Midori Kagaku Co., Ltd.) as a sensitizing dye, and 8 g of acetone as a solvent.

(Preparation of Hologram Recording Medium 1)

The photosensitive composition for hologram recording 1 was applied by a bar coater to a polyvinyl alcohol film having a thickness of 2.5 µm so as to make a dried film have a thickness of 3 µm. Then, a film surface of a photosensitive layer 1 including resin of the photosensitive composition for hologram recording 1 was pressured and bonded to a glass substrate having a thickness of 1.0 mm, whereby preparing a hologram recording medium 1.

(Preparation of Hologram 1)

The hologram recording medium 1 was subjected to two-luminous-flux interference exposure by a semiconductor laser with an exposure wavelength of 457 nm, and then the entire surface of the medium 1 was irradiated with UV light to cure an uncured monomer, whereby fixing a refractive index distribution on the medium 1. In regard to the condition of the two-luminous-flux interference exposure, the light intensity of a single luminous flux on the recording medium was set to 20 mW/cm$^2$, and the medium 1 was subjected to interference exposure for 20 seconds, making the two luminous fluxes form a 7-degree angle. Accordingly, the refractive index distribution was formed on the hologram recording medium 1, whereby preparing a hologram 1.

(Evaluation of Hologram 1)

The amount of refractive index change (Δn) of Hologram 1 prepared herein was calculated based on the Kogelnik theoretical formula, and the amount of refractive index change (Δn) was 0.065.

Examples 2 to 4

(Preparation of Photosensitive Compositions for Hologram Recording 2 to 4)

Using materials similar to one used in Example 1, photosensitive compositions for hologram recording 2 to 4 were prepared in a manner similar to Example 1 according to amounts of additives shown in the following Table 1 except that rose bengal ("RB", available from Sigma-Aldrich) was used as a sensitizing dye in Example 2, polyvinyl acetate ("SN-55T", available from Denka Company Limited) as a binder resin and 2-mercaptobenzoxazole ("2-MBO", available from Tokyo Chemical Industry Co., Ltd.) as a chain transfer agent were used in Example 3, and polyvinyl acetate ("SN-55T", available from Denka Company Limited) as a binder resin, rose bengal ("RB", available from Sigma-Aldrich) as a sensitizing dye, and 2-mercaptobenzoxazole ("2-MBO", available from Tokyo Chemical Industry Co., Ltd.) as a chain transfer agent were used in Example 4.

(Preparation of Hologram Recording Media 2 to 4)

Using the prepared photosensitive compositions for hologram recording 2 to 4, hologram recording media 2 to 4 were prepared in a manner similar to Example 1.

(Preparation of Holograms 2 to 4)

Using the prepared hologram recording media 2 to 4, holograms 2 to 4 were prepared in a manner similar to Example 1 except that exposure was carried out under conditions shown in Table 1.

(Evaluation of Holograms 2 to 4)

The amounts of refractive index change (Δn) of each of Holograms 2 to 4 prepared herein were obtained in a manner similar to Example 1. Δn of the hologram 2 was 0.066, Δn of the hologram 3 was 0.069, and Δn of the hologram 4 was 0.067.

Examples 5 to 8

(Preparation of Photosensitive Compositions for Hologram Recording 5 to 8)

Using materials similar to one used in Example 1, photosensitive compositions for hologram recording 5 to 8 were prepared in a manner similar to Example 1 according to amounts of additives shown in the following Table 1 except that "3,11-DAEDNT" available from Sugai Chemical Industry Co., Ltd. as a polyfunctional (bifunctional) photopolymerizable monomer and "DNTMA" available from Sugai Chemical Industry Co., Ltd. as a monofunctional photopolymerizable monomer were used in Example 5, "3,11-DAEDNT" available from Sugai Chemical Industry Co., Ltd. as a polyfunctional (bifunctional) photopolymerizable monomer, "DNTMA" available from Sugai Chemical Industry Co., Ltd. as a monofunctional photopolymerizable monomer, and rose bengal ("RB", available from Sigma-Aldrich) as a sensitizing dye were used in Example 6, "3,11-DAEDNT" available from Sugai Chemical Industry Co., Ltd. as a polyfunctional (bifunctional) photopolymerizable monomer, "DNTMA" available from Sugai Chemical Industry Co., Ltd. as a monofunctional photopolymerizable monomer, polyvinyl acetate ("SN-55T", available from Denka Company Limited) as a binder resin, and 2-mercaptobenzoxazole ("2-MBO", available from Tokyo Chemical Industry Co., Ltd.) as a chain transfer agent were used in Example 7, and "3,11-DAEDNT" available from Sugai Chemical Industry Co., Ltd. as a polyfunctional (bifunctional) photopolymerizable monomer, "DNTMA" available from Sugai Chemical Industry Co., Ltd. as a monofunctional photopolymerizable monomer, polyvinyl acetate ("SN-55T", available from Denka Company Limited) as a binder resin, rose bengal ("RB", available from Sigma-Aldrich) as a sensitizing dye, and 2-mercaptobenzoxazole ("2-MBO", available from Tokyo Chemical Industry Co., Ltd.) as a chain transfer agent were used in Example 8.

(Preparation of Hologram Recording Media 5 to 8)

Using the prepared photosensitive compositions for hologram recording 5 to 8, hologram recording media 5 to 8 were prepared in a manner similar to Example 1.

(Preparation of Holograms 5 to 8)

Using the prepared hologram recording media 5 to 8, holograms 5 to 8 were prepared in a manner similar to Example 1 except that exposure was carried out under conditions shown in Table 1.

(Evaluation of Holograms 5 to 8)

The amounts of refractive index change (Δn) of each of Holograms 5 to 8 prepared herein were obtained in a manner similar to Example 1. Δn of the hologram 5 was 0.087, Δn of the hologram 6 was 0.086, Δn of the hologram 7 was 0.091, and Δn of the hologram 8 was 0.092.

Examples 9 to 16

(Preparation of Photosensitive Compositions for Hologram Recording 9 to 16)

Using materials similar to one used in Example 1, photosensitive compositions for hologram recording 9 to 12 were prepared in a manner similar to Example 1 according to amounts of additives shown in the following Table 2 except that a TiO$_2$ particulate ("SRD-K", available from Sakai Chemical Industry Co., Ltd.) was used as inorganic particulate in Example 9, a ZrO$_2$ particulate ("SZR-K", available from Sakai Chemical Industry Co., Ltd.) was used in Example 10, a TiO$_2$ particulate ("SRD-K", available from Sakai Chemical Industry Co., Ltd.) as an inorganic particulate and rose bengal ("RB", available from Sigma-Aldrich) as a sensitizing dye were used in Example 11, and a ZrO$_2$ particulate ("SZR-K", available from Sakai Chemical Industry Co., Ltd.) and rose bengal ("RB", available from Sigma-Aldrich) as a sensitizing dye were used in Example 12.

Furthermore, using materials similar to one used in Example 1, photosensitive compositions for hologram recording 13 to 16 were prepared in a manner similar to Example 1 according to amounts of additives shown in the following Table 2 except that a TiO$_2$ particulate ("SRD-K", available from Sakai Chemical Industry Co., Ltd.) as an inorganic particulate, polyvinyl acetate ("SN-55T", available from Denka Company Limited) as a binder resin, and 2-mercaptobenzoxazole ("2-MBO", available from Tokyo Chemical Industry Co., Ltd.) as a chain transfer agent were used in Example 13, a ZrO$_2$ particulate ("SZR-K", available from Sakai Chemical Industry Co., Ltd.), polyvinyl acetate ("SN-55T", available from Denka Company Limited) as a binder resin, and 2-mercaptobenzoxazole ("2-MBO", available from Tokyo Chemical Industry Co., Ltd.) as a chain transfer agent were used in Example 14, a TiO$_2$ particulate ("SRD-K", available from Sakai Chemical Industry Co., Ltd.) as an inorganic particulate, polyvinyl acetate ("SN-55T", available from Denka Company Limited) as a binder resin, 2-mercaptobenzoxazole ("2-MBO", available from Tokyo Chemical Industry Co., Ltd.) as a chain transfer agent, and rose bengal ("RB", available from Sigma-Aldrich) as a sensitizing dye were used in Example 15, and a ZrO$_2$ particulate ("SZR-K", available from Sakai Chemical Industry Co., Ltd.), polyvinyl acetate ("SN-55T", available from Denka Company Limited) as a binder resin, 2-mercaptobenzoxazole ("2-MBO", available from Tokyo Chemical Industry Co., Ltd.) as a chain transfer agent, and rose bengal ("RB", available from Sigma-Aldrich) as a sensitizing dye were used in Example 16.

(Preparation of Hologram Recording Media 9 to 16)

Using the prepared photosensitive compositions for hologram recording 9 to 16, hologram recording media 9 to 16 were prepared in a manner similar to Example 1.

(Preparation of Holograms 9 to 16)

Using the prepared hologram recording media 9 to 16, holograms 9 to 16 were prepared in a manner similar to Example 1 except that exposure was carried out under conditions shown in Table 2.

(Evaluation of Holograms 9 to 16)

The amounts of refractive index change (Δn) of each of Holograms 9 to 16 prepared herein were obtained in a manner similar to Example 1. Δn of the hologram 9 was 0.078, Δn of the hologram 10 was 0.073, Δn of the hologram 11 was 0.08, Δn of the hologram 12 was 0.076, Δn of the hologram 13 was 0.083, Δn of the hologram 14 was 0.081, Δn of the hologram 15 was 0.088, and Δn of the hologram 16 was 0.085.

Examples 17 to 24

(Preparation of Photosensitive Compositions for Hologram Recording 17 to 24)

Using materials similar to one used in Example 1, photosensitive compositions for hologram recording 17 to 20 were prepared in a manner similar to Example 1 according to amounts of additives shown in the following Table 3 except that "ADK STAB AO-50" available from Adeka Corporation was used as a polymerization inhibitor in Example 17, "ADK STAB LA-31" available from Adeka Corporation was used as a polymerization inhibitor in Example 18, "ADK STAB AO-50" available from Adeka Corporation as a polymerization inhibitor and rose bengal ("RB", available from Sigma-Aldrich) as a sensitizing dye were used in Example 19, and "ADK STAB LA-31" available from Adeka Corporation as a polymerization inhibitor and rose bengal ("RB", available from Sigma-Aldrich) as a sensitizing dye were used in Example 20.

Furthermore, using materials similar to one used in Example 1, photosensitive compositions for hologram recording 21 to 24 were prepared in a manner similar to Example 1 according to amounts of additives shown in the following Table 3 except that "ADK STAB AO-50" available from Adeka Corporation as a polymerization inhibitor, polyvinyl acetate ("SN-55T", available from Denka Company Limited) as a binder resin, and 2-mercaptobenzoxazole ("2-MBO", available from Tokyo Chemical Industry Co., Ltd.) as a chain transfer agent were used in Example 21, "ADK STAB LA-31" available from Adeka Corporation as a polymerization inhibitor, polyvinyl acetate ("SN-55T", available from Denka Company Limited) as a binder resin, and 2-mercaptobenzoxazole ("2-MBO", available from Tokyo Chemical Industry Co., Ltd.) as a chain transfer agent were used in Example 22, "ADK STAB AO-50" available from Adeka Corporation as a polymerization inhibitor, polyvinyl acetate ("SN-55T", available from Denka Company Limited) as a binder resin, 2-mercaptobenzoxazole ("2-MBO", available from Tokyo Chemical Industry Co., Ltd.) as a chain transfer agent, and rose bengal ("RB", available from Sigma-Aldrich) as a sensitizing dye were used in Example 23, and "ADK STAB LA-31" available from Adeka Corporation as a polymerization inhibitor, polyvinyl acetate ("SN-55T", available from Denka Company Limited) as a binder resin, 2-mercaptobenzoxazole ("2-MBO", available from Tokyo Chemical Industry Co., Ltd.) as a chain transfer agent, and rose bengal ("RB", available from Sigma-Aldrich) as a sensitizing dye were used in Example 24.

(Preparation of Hologram Recording Media 17 to 24)

Using the prepared photosensitive compositions for hologram recording 17 to 24, hologram recording media 17 to 24 were prepared in a manner similar to Example 1.

(Preparation of Holograms 17 to 24)

Using the prepared hologram recording media 17 to 24, holograms 17 to 24 were prepared in a manner similar to Example 1 except that exposure was carried out under conditions shown in Table 3.

(Evaluation of Holograms 17 to 24)

The amounts of refractive index change (Δn) of each of Holograms 17 to 24 prepared herein were obtained in a manner similar to Example 1. Δn of the hologram 17 was 0.068, Δn of the hologram 18 was 0.07, Δn of the hologram 19 was 0.07, Δn of the hologram 20 was 0.072, Δn of the hologram 21 was 0.071, Δn of the hologram 22 was 0.073, Δn of the hologram 23 was 0.074, and Δn of the hologram 24 was 0.075.

Comparative Examples 1 to 4

(Preparation of Photosensitive Compositions for Hologram Recording 101 to 104)

In Comparative Example 1, using a material similar to those used in Examples 1, 17, or 18, a photosensitive composition for hologram recording 101 was prepared in a manner similar to Example 1 except that no polymerization inhibitor (hydroquinone ("HQ", available from FUJIFILM Wako Pure Chemical Corporation), and no "ADK STAB AO-50" available from Adeka Corporation or "ADK STAB LA-31" available from Adeka Corporation were used. In Comparative Example 2, using a material similar to those used in Examples 2, 19, or 20, a photosensitive composition for hologram recording 102 was prepared in a manner similar to Example 1 except that no polymerization inhibitor (hydroquinone ("HQ", available from FUJIFILM Wako Pure Chemical Corporation), and no "ADK STAB AO-50" available from Adeka Corporation or "ADK STAB LA-31" available from Adeka Corporation were used. In Comparative Example 3, using a material similar to those used in Examples 3, 21, or 22, a photosensitive composition for hologram recording 103 was prepared in a manner similar to Example 1 except that no polymerization inhibitor (hydroquinone ("HQ", available from FUJIFILM Wako Pure Chemical Corporation), and no "ADK STAB AO-50" available from Adeka Corporation or "ADK STAB LA-31" available from Adeka Corporation were used. In Comparative Example 4, using a material similar to those used in Examples 4, 23, or 24, a photosensitive composition for hologram recording 104 was prepared in a manner similar to Example 1 except that no polymerization inhibitor (hydroquinone ("HQ", available from FUJIFILM Wako Pure Chemical Corporation), and no "ADK STAB AO-50" available from Adeka Corporation or "ADK STAB LA-31" available from Adeka Corporation were used. Note that the photosensitive compositions for hologram recording 101 to 104 were prepared according to amounts of additives shown in the following Table 4.

(Preparation of Hologram Recording Media 101 to 104)

Using the prepared photosensitive compositions for hologram recording 101 to 104, hologram recording media 101 to 104 were prepared in a manner similar to Example 1.

(Preparation of Holograms 101 to 104)

Using the prepared hologram recording media 101 to 104, holograms 101 to 104 were prepared in a manner similar to Example 1 except that exposure was carried out under conditions shown in Table 4.

(Evaluation of Holograms 101 to 104)

The amounts of refractive index change ($\Delta n$) of each of Holograms 101 to 104 prepared herein were obtained in a manner similar to Example 1. $\Delta n$ of the hologram 101 was 0.043, $\Delta n$ of the hologram 102 was 0.037, $\Delta n$ of the hologram 103 was 0.035, and $\Delta n$ of the hologram 104 was 0.038.

Comparative Examples 5 to 8

(Preparation of Photosensitive Compositions for Hologram Recording 105 to 108)

In Comparative Example 5, using a material similar to one used in Example 5, a photosensitive composition for hologram recording 105 was prepared in a manner similar to Example 1 except that no polymerization inhibitor (hydroquinone ("HQ", available from FUJIFILM Wako Pure Chemical Corporation) was used. In Comparative Example 6, using a material similar to one used in Example 6, a photosensitive composition for hologram recording 106 was prepared in a manner similar to Example 1 except that no polymerization inhibitor (hydroquinone ("HQ", available from FUJIFILM Wako Pure Chemical Corporation) was used. In Comparative Example 7, using a material similar to one used in Example 7, a photosensitive composition for hologram recording 107 was prepared in a manner similar to Example 1 except that no polymerization inhibitor (hydroquinone ("HQ", available from FUJIFILM Wako Pure Chemical Corporation) was used. In Comparative Example 8, using a material similar to one used in Example 8, a photosensitive composition for hologram recording 108 was prepared in a manner similar to Example 1 except that no polymerization inhibitor (hydroquinone ("HQ", available from FUJIFILM Wako Pure Chemical Corporation) was used. Note that the photosensitive compositions for hologram recording 105 to 108 were prepared according to amounts of additives shown in the following Table 4.

(Preparation of Hologram Recording Media 105 to 108)

Using the prepared photosensitive compositions for hologram recording 105 to 108, hologram recording media 105 to 108 were prepared in a manner similar to Example 1.

(Preparation of Holograms 105 to 108)

Using the prepared hologram recording media 105 to 108, holograms 105 to 108 were prepared in a manner similar to Example 1 except that exposure was carried out under conditions shown in the following Table 4.

(Evaluation of Holograms 105 to 108)

The amounts of refractive index change ($\Delta n$) of each of Holograms 105 to 108 prepared herein were obtained in a manner similar to Example 1. $\Delta n$ of the hologram 105 was 0.047, $\Delta n$ of the hologram 106 was 0.049, $\Delta n$ of the hologram 107 was 0.046, and $\Delta n$ of the hologram 108 was 0.048.

Comparative Examples 9 to 16

(Preparation of Photosensitive Compositions for Hologram Recording 109 to 116)

In Comparative Example 9, using a material similar to one used in Example 9, a photosensitive composition for hologram recording 109 was prepared in a manner similar to Example 1 except that no polymerization inhibitor (hydroquinone ("HQ", available from FUJIFILM Wako Pure Chemical Corporation) was used. In Comparative Example 10, using a material similar to one used in Example 10, a photosensitive composition for hologram recording 110 was prepared in a manner similar to Example 1 except that no polymerization inhibitor (hydroquinone ("HQ", available from FUJIFILM Wako Pure Chemical Corporation) was used. In Comparative Example 11, using a material similar to one used in Example 11, a photosensitive composition for hologram recording 111 was prepared in a manner similar to Example 1 except that no polymerization inhibitor (hydroquinone ("HQ", available from FUJIFILM Wako Pure Chemical Corporation) was used. In Comparative Example 12, using a material similar to one used in Example 12, a photosensitive composition for hologram recording 112 was prepared in a manner similar to Example 1 except that no polymerization inhibitor (hydroquinone ("HQ", available from FUJIFILM Wako Pure Chemical Corporation) was used. In Comparative Example 13, using a material similar to one used in Example 13, a photosensitive composition for hologram recording 113 was prepared in a manner similar to Example 1 except that no polymerization inhibitor (hydroquinone ("HQ", available from FUJIFILM Wako Pure Chemical Corporation) was used. In Comparative Example 14, using a material similar to one used in Example 14, a photosensitive composition for hologram recording 114 was prepared in a manner similar to Example 1 except that no polymerization inhibitor (hydroquinone ("HQ", available from FUJIFILM Wako Pure Chemical Corporation) was used. In Comparative Example 15, using a material similar to one used in Example 15, a photosensitive composition for hologram recording 115 was prepared in a manner similar to Example 1 except that no polymerization inhibitor (hydroquinone ("HQ", available from FUJIFILM Wako Pure Chemical Corporation) was used. In Comparative Example 16, using a material similar to one used in Example 16, a photosensitive composition for hologram recording 116 was prepared in a manner similar to Example 1 except that no polymerization inhibitor (hydroquinone ("HQ", available from FUJIFILM Wako Pure Chemical Corporation) was used. Note that the photosensitive compositions for hologram recording 109 to 116 were prepared according to amounts of additives shown in the following Table 5.

(Preparation of Hologram Recording Media 109 to 116)

Using the prepared photosensitive compositions for hologram recording 109 to 116, hologram recording media 109 to 116 were prepared in a manner similar to Example 1.

(Preparation of Holograms 109 to 116)

Using the prepared hologram recording media 109 to 116, holograms 109 to 116 were prepared in a manner similar to Example 1 except that exposure was carried out under conditions shown in the following Table 5.

(Evaluation of Holograms 109 to 116)

The amounts of refractive index change ($\Delta n$) of each of Holograms 109 to 116 prepared herein were obtained in a manner similar to Example 1. $\Delta n$ of the hologram 109 was 0.048, $\Delta n$ of the hologram 110 was 0.046, $\Delta n$ of the hologram 111 was 0.049, $\Delta n$ of the hologram 112 was 0.046, $\Delta n$ of the hologram 113 was 0.045, $\Delta n$ of the hologram 114 was 0.044, $\Delta n$ of the hologram 115 was 0.046, and $\Delta n$ of the hologram 116 was 0.045.

Examples 25 to 32

(Preparation of Photosensitive Compositions for Hologram Recording 25 to 32)

In Examples 25 to 28, using materials similar to one used in Example 1, photosensitive compositions for hologram recording 25 to 28 were prepared in a manner similar to Example 1 according to amounts of additives shown in the following Table 6. In Examples 29 to 32, using materials similar to one used in Example 2, photosensitive compositions for hologram recording 29 to 32 were prepared in a manner similar to Example 1 according to amounts of additives shown in the following Table 6.

(Preparation of Hologram Recording Media 25 to 32)

Using the prepared photosensitive compositions for hologram recording 25 to 32, hologram recording media 25 to 32 were prepared in a manner similar to Example 1.

(Preparation of Holograms 25 to 32)

Using the prepared hologram recording media 25 to 32, holograms 25 to 32 were prepared in a manner similar to Example 1 except that exposure was carried out under conditions shown in Table 6.

(Evaluation of Holograms 25 to 32)

The amounts of refractive index change ($\Delta n$) of each of Holograms 25 to 32 prepared herein were obtained in a manner similar to Example 1. $\Delta n$ of the hologram 25 was 0.065, $\Delta n$ of the hologram 26 was 0.067, $\Delta n$ of the hologram 27 was 0.066, $\Delta n$ of the hologram 28 was 0.067, $\Delta n$ of the hologram 29 was 0.066, $\Delta n$ of the hologram 30 was 0.068, $\Delta n$ of the hologram 31 was 0.069, and $\Delta n$ of the hologram 32 was 0.065.

Examples 33 to 42

(Preparation of Photosensitive Compositions for Hologram Recording 33 to 42)

In Examples 33 to 37, using materials similar to one used in Example 1, photosensitive compositions for hologram recording 33 to 37 were prepared in a manner similar to Example 1 according to amounts of additives shown in the following Table 7. In Examples 38 to 42, using materials similar to one used in Example 2, photosensitive compositions for hologram recording 38 to 42 were prepared in a manner similar to Example 1 according to amounts of additives shown in the following Table 7.

(Preparation of Hologram Recording Media 33 to 42)

Using the prepared photosensitive compositions for hologram recording 33 to 42, hologram recording media 33 to 42 were prepared in a manner similar to Example 1.

(Preparation of Holograms 33 to 42)

Using the prepared hologram recording media 33 to 42, holograms 33 to 42 were prepared in a manner similar to Example 1 except that exposure was carried out under conditions shown in Table 7.

(Evaluation of Holograms 33 to 42)

The amounts of refractive index change ($\Delta n$) of each of Holograms 33 to 42 prepared herein were obtained in a manner similar to Example 1. $\Delta n$ of the hologram 33 was 0.060, $\Delta n$ of the hologram 34 was 0.062, $\Delta n$ of the hologram 35 was 0.061, $\Delta n$ of the hologram 36 was 0.063, $\Delta n$ of the hologram 37 was 0.062, $\Delta n$ of the hologram 38 was 0.060, $\Delta n$ of the hologram 39 was 0.060, $\Delta n$ of the hologram 40 was 0.062, $\Delta n$ of the hologram 41 was 0.063, and $\Delta n$ of the hologram 42 was 0.062.

Example 43

(Preparation of Photosensitive Composition for Hologram Recording 43)

A photosensitive composition for hologram recording 43 was prepared by mixing, at room temperature, 1.1 g of the compound 5-5 as a polyfunctional (bifunctional) photopolymerizable monomer, 0.3 g of the compound 5-1 as a monofunctional photopolymerizable monomer, 0.5 g of polyvinyl acetate ("SN-55T", available from Denka Company Limited) as a binder resin, 0.09 g of 4-isopropyl-4'-methyldiphenyliodonium tetrakis(pentafluorophenyl)borate ("DI", available from Tokyo Chemical Industry Co., Ltd.) as a photopolymerization initiator, 0.03 g of hydroquinone ("HQ", available from FUJIFILM Wako Pure Chemical Corporation) as a polymerization inhibitor, 1 g of diethyl sebacate ("SDE", available from FUJIFILM Wako Pure Chemical Corporation) as a plasticizer, 0.08 g of rose bengal "RB" available from Sigma-Aldrich as a sensitizing dye, and 8 g of acetone as a solvent.

(Preparation of Hologram Recording Medium 43)

The photosensitive composition for hologram recording 43 was applied by a bar coater to a polyvinyl alcohol film having a thickness of 2.5 μm so as to make a dried film have a thickness of 3 μm. Then, a film surface of a photosensitive layer 43 including resin of the photosensitive composition for hologram recording 43 was pressured and bonded to a glass substrate having a thickness of 1.0 mm, whereby preparing a hologram recording medium 43.

(Preparation of Hologram 43)

The hologram recording medium 43 was subjected to two-luminous-flux interference exposure by a semiconductor laser with an exposure wavelength of 532 nm, and then the entire surface of the medium 43 was irradiated with UV light to cure an uncured monomer, whereby fixing a refractive index distribution on the medium 43. In regard to the condition of the two-luminous-flux interference exposure, the light intensity of a single luminous flux on the recording medium was set to 2.6 mW/cm$^2$, and the medium 43 was subjected to interference exposure for 30 seconds, making the two luminous fluxes form a 7-degree angle. Accordingly, the refractive index distribution was formed on the hologram recording medium 43, whereby preparing a hologram 43.

(Evaluation of Hologram 43)

The amount of refractive index change (Δn) of Hologram 43 prepared herein was calculated based on the Kogelnik theoretical formula, and the amount of refractive index change (Δn) was 0.091.

Examples 44 to 49

(Preparation of Photosensitive Compositions for Hologram Recording 44 to 49)

Using materials similar to one used in Example 43, photosensitive composition for hologram recording 44 to 49 were prepared in a manner similar to Example 43 according to amounts of additives shown in the following Table 8 except that the compound 5-6 was used as a polyfunctional (bifunctional) photopolymerizable monomer in Example 44, the compound 5-7 was used as a polyfunctional (bifunctional) photopolymerizable monomer in Example 45, the compound 6-1 was used as a polyfunctional (trifunctional) photopolymerizable monomer in Example 46, the compound 7-1 was used as a polyfunctional (trifunctional) photopolymerizable monomer in Example 47, EA-0200 was used as a polyfunctional (bifunctional) photopolymerizable monomer in Example 48, and 3,11-DAEDNT was used as a polyfunctional (bifunctional) photopolymerizable monomer in Example 49.

(Preparation of Hologram Recording Media 44 to 49)

Using the prepared photosensitive compositions for hologram recording 44 to 49, hologram recording media 44 to 49 were prepared in a manner similar to Example 43.

(Preparation of Holograms 44 to 49)

Using the prepared hologram recording media 44 to 49, holograms 44 to 49 were prepared in a manner similar to Example 43 except that exposure was carried out under conditions shown in Table 8.

(Evaluation of Holograms 44 to 49)

The amounts of refractive index change (Δn) of each of Holograms 44 to 49 prepared herein were obtained in a manner similar to Example 43. Δn of the hologram 44 was 0.092, Δn of the hologram 45 was 0.09, Δn of the hologram 46 was 0.09, Δn of the hologram 47 was 0.093, Δn of the hologram 48 was 0.085, Δn of the hologram 49 was 0.09.

Examples 50 to 56

(Preparation of Photosensitive Compositions for Hologram Recording 50 to 56)

Using materials similar to one used in Example 43, photosensitive composition for hologram recording 50 to 56 were prepared in a manner similar to Example 43 according to amounts of additives shown in the following Table 8 except that the compound 5-2 was used as a monofunctional photopolymerizable monomer in Example 50, the compound 5-6 as a polyfunctional (bifunctional) photopolymerizable monomer and the compound 1-2 as a monofunctional photopolymerizable monomer were used in Example 51, the compound 5-7 as a polyfunctional (bifunctional) photopolymerizable monomer and the compound 1-2 as a monofunctional photopolymerizable monomer were used in Example 52, the compound 6-1 as a polyfunctional (trifunctional) photopolymerizable monomer and the compound 1-2 as a monofunctional photopolymerizable monomer were used in Example 53, the compound 7-1 as a polyfunctional (trifunctional) photopolymerizable monomer and the compound 1-2 as a monofunctional photopolymerizable monomer were used in Example 54, EA-0200 as a polyfunctional (bifunctional) photopolymerizable monomer and the compound 1-2 as a monofunctional photopolymerizable monomer were used in Example 55, and 3,11-DAEDNT as a polyfunctional (bifunctional) photopolymerizable monomer and the compound 1-2 as a monofunctional photopolymerizable monomer were used in Example 56.

(Preparation of Hologram Recording Media 50 to 56)

Using the prepared photosensitive compositions for hologram recording 50 to 56, hologram recording media 50 to 56 were prepared in a manner similar to Example 43.

(Preparation of Holograms 50 to 56)

Using the prepared hologram recording media 50 to 56, holograms 50 to 56 were prepared in a manner similar to Example 43 except that exposure was carried out under conditions shown in Table 8.

(Evaluation of Holograms 50 to 56)

The amounts of refractive index change (Δn) of each of Holograms 50 to 56 prepared herein were obtained in a manner similar to Example 43. Δn of the hologram 50 was 0.09, Δn of the hologram 51 was 0.091, Δn of the hologram 52 was 0.092, Δn of the hologram 53 was 0.092, Δn of the hologram 54 was 0.093, Δn of the hologram 55 was 0.086, and Δn of the hologram 56 was 0.09.

Examples 57 to 63

(Preparation of Photosensitive Compositions for Hologram Recording 57 to 63)

Using materials similar to one used in Example 43, photosensitive composition for hologram recording 57 to 63 were prepared in a manner similar to Example 43 according to amounts of additives shown in the following Table 9 except that the compound 1-3 was used as a monofunctional photopolymerizable monomer in Example 57, the compound 5-6 as a polyfunctional (bifunctional) photopolymerizable monomer and the compound 1-3 as a monofunctional photopolymerizable monomer were used in Example 58, the compound 5-7 as a polyfunctional (bifunctional) photopolymerizable monomer and the compound 1-3 as a monofunctional photopolymerizable monomer were used in Example 59, the compound 6-1 as a polyfunctional (trifunctional) photopolymerizable monomer and the compound 1-3 as a monofunctional photopolymerizable monomer were used in Example 60, the compound 7-1 as a polyfunctional (trifunctional) photopolymerizable monomer and the compound 1-3 as a monofunctional photopolymerizable monomer were used in Example 61, EA-0200 as a polyfunctional (bifunctional) photopolymerizable monomer and the compound 1-3 as a monofunctional photopolymerizable monomer were used in Example 62, and 3,11-DAEDNT as a polyfunctional (bifunctional) photopolymerizable monomer and the compound 1-3 as a monofunctional photopolymerizable monomer were used in Example 63.

(Preparation of Hologram Recording Media 57 to 63)

Using the prepared photosensitive compositions for hologram recording 57 to 63, hologram recording media 57 to 63 were prepared in a manner similar to Example 43.

(Preparation of Holograms 57 to 63)

Using the prepared hologram recording media 57 to 63, holograms 57 to 63 were prepared in a manner similar to Example 43 except that exposure was carried out under conditions shown in Table 9.

(Evaluation of Holograms 57 to 63)

The amounts of refractive index change (Δn) of each of Holograms 57 to 63 prepared herein were obtained in a manner similar to Example 43. Δn of the hologram 57 was 0.09, Δn of the hologram 58 was 0.093, Δn of the hologram 59 was 0.092, Δn of the hologram 60 was 0.094, Δn of the hologram 61 was 0.095, Δn of the hologram 62 was 0.087, and Δn of the hologram 63 was 0.091.

Examples 64 to 70

(Preparation of Photosensitive Compositions for Hologram Recording 64 to 70)

Using materials similar to one used in Example 43, the photosensitive composition for hologram recording 64 to 70 were prepared in a manner similar to Example 43 according to amounts of additives shown in the following Table 9 except that the compound 1-4 was used as a monofunctional photopolymerizable monomer in Example 64, the compound 5-6 as a polyfunctional (bifunctional) photopolymerizable monomer and the compound 1-4 as a monofunctional photopolymerizable monomer were used in Example 65, the compound 5-7 as a polyfunctional (bifunctional) photopolymerizable monomer and the compound 1-4 as a monofunctional photopolymerizable monomer were used in Example 66, the compound 6-1 as a polyfunctional (trifunctional) photopolymerizable monomer and the compound 1-4 as a monofunctional photopolymerizable monomer were used in Example 67, the compound 7-1 as a polyfunctional (trifunctional) photopolymerizable monomer and the compound 1-4 as a monofunctional photopolymerizable monomer were used in Example 68, EA-0200 as a polyfunctional (bifunctional) photopolymerizable monomer and the compound 1-4 as a monofunctional photopolymerizable monomer were used in Example 69, and 3,11-DAEDNT as a polyfunctional (bifunctional) photopolymerizable monomer and the compound 1-4 as a monofunctional photopolymerizable monomer were used in Example 70.

(Preparation of Hologram Recording Media 64 to 70)

Using the prepared photosensitive compositions for hologram recording 64 to 70, hologram recording media 64 to 70 were prepared in a manner similar to Example 43.

(Preparation of Holograms 64 to 70)

Using the prepared hologram recording media 64 to 70, holograms 64 to 70 were prepared in a manner similar to Example 43 except that exposure was carried out under conditions shown in Table 9.

(Evaluation of Holograms 64 to 70)

The amounts of refractive index change (Δn) of each of Holograms 64 to 70 prepared herein were obtained in a manner similar to Example 43. Δn of the hologram 64 was 0.091, Δn of the hologram 65 was 0.091, Δn of the hologram 66 was 0.095, Δn of the hologram 67 was 0.094, Δn of the hologram 68 was 0.092, Δn of the hologram 69 was 0.088, and Δn of the hologram 70 was 0.092.

Examples 71 to 75

(Preparation of Photosensitive Compositions for Hologram Recording 71 to 75)

Using materials similar to one used in Example 43, photosensitive composition for hologram recording 71 to 75 were prepared in a manner similar to Example 43 according to amounts of additives shown in the following Table 10 except that N-vinylcarbazole ("NVC") was used as a monofunctional photopolymerizable monomer in Example 71, the compound 5-6 as a polyfunctional (bifunctional) photopolymerizable monomer and N-vinylcarbazole ("NVC") as a monofunctional photopolymerizable monomer were used in Example 72, the compound 5-7 as a polyfunctional (bifunctional) photopolymerizable monomer and N-vinylcarbazole ("NVC") as a monofunctional photopolymerizable monomer were used in Example 73, the compound 6-1 as a polyfunctional (trifunctional) photopolymerizable monomer and N-vinylcarbazole ("NVC") as a monofunctional photopolymerizable monomer were used in Example 74, and the compound 7-1 as a polyfunctional (trifunctional) photopolymerizable monomer and N-vinylcarbazole ("NVC") as a monofunctional photopolymerizable monomer were used in Example 75.

(Preparation of Hologram Recording Media 71 to 75)

Using the prepared photosensitive compositions for hologram recording 71 to 75, hologram recording media 71 to 75 were prepared in a manner similar to Example 43.

(Preparation of Holograms 71 to 75)

Using the prepared hologram recording media 71 to 75, holograms 71 to 75 were prepared in a manner similar to Example 43 except that exposure was carried out under conditions shown in Table 10.

(Evaluation of Holograms 71 to 75)

The amounts of refractive index change (Δn) of each of Holograms 71 to 75 prepared herein were obtained in a manner similar to Example 43. Δn of the hologram 71 was 0.085, Δn of the hologram 72 was 0.086, Δn of the hologram 73 was 0.085, Δn of the hologram 74 was 0.087, and Δn of the hologram 75 was 0.088.

Examples 76 to 80

(Preparation of Photosensitive Compositions for Hologram Recording 76 to 80)

Using materials similar to one used in Example 43, photosensitive composition for hologram recording 76 to 80 were prepared in a manner similar to Example 43 according to amounts of additives shown in the following Table 10 except that DNTMA was used as a monofunctional photopolymerizable monomer in Example 76, the compound 5-6 as a polyfunctional (bifunctional) photopolymerizable monomer and DNTMA as a monofunctional photopolymerizable monomer were used in Example 77, the compound 5-7 as a polyfunctional (bifunctional) photopolymerizable monomer and DNTMA as a monofunctional photopolymerizable monomer were used in Example 78, the compound 6-1 as a polyfunctional (trifunctional) photopolymerizable monomer and DNTMA as a monofunctional photopolymerizable monomer were used in Example 79, and the compound 7-1 as a polyfunctional (trifunctional) photopolymerizable monomer and DNTMA as a monofunctional photopolymerizable monomer were used in Example 80.

(Preparation of Hologram Recording Media 76 to 80)

Using the prepared photosensitive compositions for hologram recording 76 to 80, hologram recording media 76 to 80 were prepared in a manner similar to Example 43.

(Preparation of Holograms 76 to 80)

Using the prepared hologram recording media 76 to 80, holograms 76 to 80 were prepared in a manner similar to Example 43 except that exposure was carried out under conditions shown in Table 10.

(Evaluation of Holograms 76 to 80)

The amounts of refractive index change (Δn) of each of Holograms 76 to 80 prepared herein were obtained in a manner similar to Example 43. Δn of the hologram 76 was 0.091, Δn of the hologram 77 was 0.092, Δn of the hologram 78 was 0.091, Δn of the hologram 79 was 0.09, and Δn of the hologram 80 was 0.09.

Comparative Examples 17 to 23

(Preparation of Photosensitive Compositions for Hologram Recording 117 to 123)

In Comparative Example 17, using a material similar to one used in Example 43, a photosensitive composition for hologram recording 117 was prepared in a manner similar to Example 43 except that no polymerization inhibitor (hydroquinone ("HQ", available from FUJIFILM Wako Pure Chemical Corporation) was used. In Comparative Example 18, using a material similar to one used in Example 44, a photosensitive composition for hologram recording 118 was prepared in a manner similar to Example 43 except that no polymerization inhibitor (hydroquinone ("HQ", available from FUJIFILM Wako Pure Chemical Corporation) was used. In Comparative Example 19, using a material similar to one used in Example 45, a photosensitive composition for hologram recording 119 was prepared in a manner similar to Example 43 except that no polymerization inhibitor (hydroquinone ("HQ", available from FUJIFILM Wako Pure Chemical Corporation) was used. In Comparative Example 20, using a material similar to one used in Example 46, a photosensitive composition for hologram recording 120 was prepared in a manner similar to Example 43 except that no polymerization inhibitor (hydroquinone ("HQ", available from FUJIFILM Wako Pure Chemical Corporation) was used. In Comparative Example 21, using a material similar to one used in Example 47, a photosensitive composition for hologram recording 121 was prepared in a manner similar to Example 43 except that no polymerization inhibitor (hydroquinone ("HQ", available from FUJIFILM Wako Pure Chemical Corporation) was used. In Comparative Example 22, using a material similar to one used in Example 48, a photosensitive composition for hologram recording 122 was prepared in a manner similar to Example 43 except that no polymerization inhibitor (hydroquinone ("HQ", available from FUJIFILM Wako Pure Chemical Corporation) was used. In Comparative Example 23, using a material similar to one used in Example 49, a photosensitive composition for hologram recording 123 was prepared in a manner similar to Example 43 except that no polymerization inhibitor (hydroquinone ("HQ", available from FUJIFILM Wako Pure Chemical Corporation) was used. Note that the photosensitive compositions for hologram recording 117 to 123 were prepared according to amounts of additives shown in the following Table 11.

(Preparation of Hologram Recording Media 117 to 123)

Using the prepared photosensitive compositions for hologram recording 117 to 123, hologram recording media 117 to 123 were prepared in a manner similar to Example 43.

(Preparation of Holograms 117 to 123)

Using the prepared hologram recording media 117 to 123, holograms 117 to 123 were prepared in a manner similar to Example 43 except that exposure was carried out under conditions shown in the following Table 11.

(Evaluation of Holograms 117 to 123)

The amounts of refractive index change ($\Delta n$) of each of Holograms 117 to 123 prepared herein were obtained in a manner similar to Example 43. $\Delta n$ of the hologram 117 was 0.051, $\Delta n$ of the hologram 118 was 0.052, $\Delta n$ of the hologram 119 was 0.05, $\Delta n$ of the hologram 120 was 0.053, $\Delta n$ of the hologram 121 was 0.054, $\Delta n$ of the hologram 122 was 0.051, and $\Delta n$ of the hologram 123 was 0.054.

Comparative Examples 24 to 30

(Preparation of Photosensitive Compositions for Hologram Recording 124 to 130)

In Comparative Example 24, using a material similar to one used in Example 50, a photosensitive composition for hologram recording 124 was prepared in a manner similar to Example 43 except that no polymerization inhibitor (hydroquinone ("HQ", available from FUJIFILM Wako Pure Chemical Corporation) was used. In Comparative Example 25, using a material similar to one used in Example 51, a photosensitive composition for hologram recording 125 was prepared in a manner similar to Example 43 except that no polymerization inhibitor (hydroquinone ("HQ", available from FUJIFILM Wako Pure Chemical Corporation) was used. In Comparative Example 26, using a material similar to one used in Example 52, a photosensitive composition for hologram recording 126 was prepared in a manner similar to Example 43 except that no polymerization inhibitor (hydroquinone ("HQ", available from FUJIFILM Wako Pure Chemical Corporation) was used. In Comparative Example 27, using a material similar to one used in Example 53, a photosensitive composition for hologram recording 127 was prepared in a manner similar to Example 43 except that no polymerization inhibitor (hydroquinone ("HQ", available from FUJIFILM Wako Pure Chemical Corporation) was used. In Comparative Example 28, using a material similar to one used in Example 54, a photosensitive composition for hologram recording 128 was prepared in a manner similar to Example 43 except that no polymerization inhibitor (hydroquinone ("HQ", available from FUJIFILM Wako Pure Chemical Corporation) was used. In Comparative Example 29, using a material similar to one used in Example 55, a photosensitive composition for hologram recording 129 was prepared in a manner similar to Example 43 except that no polymerization inhibitor (hydroquinone ("HQ", available from FUJIFILM Wako Pure Chemical Corporation) was used. In Comparative Example 30, using a material similar to one used in Example 56, a photosensitive composition for hologram recording 130 was prepared in a manner similar to Example 43 except that no polymerization inhibitor (hydroquinone ("HQ", available from FUJIFILM Wako Pure Chemical Corporation) was used. Note that the photosensitive compositions for hologram recording 124 to 130 were prepared according to amounts of additives shown in the following Table 11.

(Preparation of Hologram Recording Media 124 to 130)

Using the prepared photosensitive compositions for hologram recording 124 to 130, hologram recording media 124 to 130 were prepared in a manner similar to Example 43.

(Preparation of Holograms 124 to 130)

Using the prepared hologram recording media 124 to 130, holograms 124 to 130 were prepared in a manner similar to Example 43 except that exposure was carried out under conditions shown in the following Table 11.

(Evaluation of Holograms 124 to 130)

The amounts of refractive index change ($\Delta n$) of each of Holograms 124 to 130 prepared herein were obtained in a manner similar to Example 43. $\Delta n$ of the hologram 124 was 0.055, $\Delta n$ of the hologram 125 was 0.053, $\Delta n$ of the hologram 126 was 0.055, $\Delta n$ of the hologram 127 was 0.054, $\Delta n$ of the hologram 128 was 0.055, $\Delta n$ of the hologram 129 was 0.05, and $\Delta n$ of the hologram 130 was 0.054.

Comparative Examples 31 to 37

(Preparation of Photosensitive Compositions for Hologram Recording 131 to 137)

In Comparative Example 31, using a material similar to one used in Example 57, a photosensitive composition for hologram recording 131 was prepared in a manner similar to Example 43 except that no polymerization inhibitor (hydroquinone ("HQ", available from FUJIFILM Wako Pure Chemical Corporation) was used. In Comparative Example 32, using a material similar to one used in Example 58, a photosensitive composition for hologram recording 132 was prepared in a manner similar to Example 43 except that no polymerization inhibitor (hydroquinone ("HQ", available from FUJIFILM Wako Pure Chemical Corporation) was used. In Comparative Example 33, using a material similar to one used in Example 59, a photosensitive composition for hologram recording 133 was prepared in a manner similar to Example 43 except that no polymerization inhibitor (hydroquinone ("HQ", available from FUJIFILM Wako Pure Chemical Corporation) was used. In Comparative Example 34, using a material similar to one used in Example 60, a photosensitive composition for hologram recording 134 was prepared in a manner similar to Example 43 except that no polymerization inhibitor (hydroquinone ("HQ", available from FUJIFILM Wako Pure Chemical Corporation) was used. In Comparative Example 35, using a material similar to one used in Example 61, a photosensitive composition for hologram recording 135 was prepared in a manner similar to Example 43 except that no polymerization inhibitor (hydroquinone ("HQ", available from FUJIFILM Wako Pure Chemical Corporation) was used. In Comparative Example 36, using a material similar to one used in Example 62, a photosensitive composition for hologram recording 136 was prepared in a manner similar to Example 43 except that no polymerization inhibitor (hydroquinone ("HQ", available from FUJIFILM Wako Pure Chemical Corporation) was used. In Comparative Example 37, using a material similar to one used in Example 63, a photosensitive composition for hologram recording 137 was prepared in a manner similar to Example 43 except that no polymerization inhibitor (hydroquinone ("HQ", available from FUJIFILM Wako Pure Chemical Corporation) was used. Note that the photosensitive compositions for hologram recording 131 to 137 were prepared according to amounts of additives shown in the following Table 12.

(Preparation of Hologram Recording Media 131 to 137)

Using the prepared photosensitive compositions for hologram recording 131 to 137, hologram recording media 131 to 137 were prepared in a manner similar to Example 43.

(Preparation of Holograms 131 to 137)

Using the prepared hologram recording media 131 to 137, holograms 131 to 137 were prepared in a manner similar to Example 43 except that exposure was carried out under conditions shown in the following Table 12.

(Evaluation of Holograms 131 to 137) The amounts of refractive index change (Δn) of each of Holograms 131 to 137 prepared herein were obtained in a manner similar to Example 43. Δn of the hologram 131 was 0.054, Δn of the hologram 132 was 0.055, Δn of the hologram 133 was 0.053, Δn of the hologram 134 was 0.052, Δn of the hologram 135 was 0.054, Δn of the hologram 136 was 0.05, and Δn of the hologram 137 was 0.055.

Comparative Examples 38 to 44

(Preparation of Photosensitive Compositions for Hologram Recording 138 to 144)

In Comparative Example 38, using a material similar to one used in Example 64, a photosensitive composition for hologram recording 138 was prepared in a manner similar to Example 43 except that no polymerization inhibitor (hydroquinone ("HQ", available from FUJIFILM Wako Pure Chemical Corporation) was used. In Comparative Example 39, using a material similar to one used in Example 65, a photosensitive composition for hologram recording 139 was prepared in a manner similar to Example 43 except that no polymerization inhibitor (hydroquinone ("HQ", available from FUJIFILM Wako Pure Chemical Corporation) was used. In Comparative Example 40, using a material similar to one used in Example 66, a photosensitive composition for hologram recording 140 was prepared in a manner similar to Example 43 except that no polymerization inhibitor (hydroquinone ("HQ", available from FUJIFILM Wako Pure Chemical Corporation) was used. In Comparative Example 41, using a material similar to one used in Example 67, a photosensitive composition for hologram recording 141 was prepared in a manner similar to Example 43 except that no polymerization inhibitor (hydroquinone ("HQ", available from FUJIFILM Wako Pure Chemical Corporation) was used. In Comparative Example 42, using a material similar to one used in Example 68, a photosensitive composition for hologram recording 142 was prepared in a manner similar to Example 43 except that no polymerization inhibitor (hydroquinone ("HQ", available from FUJIFILM Wako Pure Chemical Corporation) was used. In Comparative Example 43, using a material similar to one used in Example 69, a photosensitive composition for hologram recording 143 was prepared in a manner similar to Example 43 except that no polymerization inhibitor (hydroquinone ("HQ", available from FUJIFILM Wako Pure Chemical Corporation) was used. In Comparative Example 44, using a material similar to one used in Example 70, a photosensitive composition for hologram recording 144 was prepared in a manner similar to Example 43 except that no polymerization inhibitor (hydroquinone ("HQ", available from FUJIFILM Wako Pure Chemical Corporation) was used. Note that the photosensitive compositions for hologram recording 138 to 144 were prepared according to amounts of additives shown in the following Table 12.

(Preparation of Hologram Recording Media 138 to 144)

Using the prepared photosensitive compositions for hologram recording 138 to 144, hologram recording media 138 to 144 were prepared in a manner similar to Example 43.

(Preparation of Holograms 138 to 144)

Using the prepared hologram recording media 138 to 144, holograms 138 to 144 were prepared in a manner similar to Example 43 except that exposure was carried out under conditions shown in the following Table 12.

(Evaluation of Holograms 138 to 144)

The amounts of refractive index change (Δn) of each of Holograms 138 to 144 prepared herein were obtained in a manner similar to Example 43. Δn of the hologram 138 was 0.051, Δn of the hologram 139 was 0.052, Δn of the hologram 140 was 0.053, Δn of the hologram 141 was 0.054, Δn of the hologram 142 was 0.055, Δn of the hologram 143 was 0.05, and an of the hologram 144 was 0.054.

Comparative Examples 45 to 49

(Preparation of Photosensitive Compositions for Hologram Recording 145 to 149)

In Comparative Example 45, using a material similar to one used in Example 71, a photosensitive composition for hologram recording 145 was prepared in a manner similar to Example 43 except that no polymerization inhibitor (hydroquinone ("HQ", available from FUJIFILM Wako Pure Chemical Corporation) was used. In Comparative Example 46, using a material similar to one used in Example 72, a photosensitive composition for hologram recording 146 was prepared in a manner similar to Example 43 except that no polymerization inhibitor (hydroquinone ("HQ", available from FUJIFILM Wako Pure Chemical Corporation) was used. In Comparative Example 47, using a material similar to one used in Example 73, a photosensitive composition for hologram recording 147 was prepared in a manner similar to Example 43 except that no polymerization inhibitor (hydroquinone ("HQ", available from FUJIFILM Wako Pure Chemical Corporation) was used. In Comparative Example 48, using a material similar to one used in Example 74, a photosensitive composition for hologram recording 148 was prepared in a manner similar to Example 43 except that no polymerization inhibitor (hydroquinone ("HQ", available from FUJIFILM Wako Pure Chemical Corporation) was used. In Comparative Example 49, using a material similar to one used in Example 75, a photosensitive composition for hologram recording 149 was prepared in a manner similar to Example 43 except that no polymerization inhibitor (hydroquinone ("HQ", available from FUJIFILM Wako Pure Chemical Corporation) was used. Note that the photosensitive compositions for hologram recording 145 to 149 were prepared according to amounts of additives shown in the following Table 13.

(Preparation of Hologram Recording Media 145 to 149)

Using the prepared photosensitive compositions for hologram recording 145 to 149, hologram recording media 145 to 149 were prepared in a manner similar to Example 43.

(Preparation of Holograms 145 to 149)

Using the prepared hologram recording media 145 to 149, holograms 145 to 149 were prepared in a manner similar to Example 43 except that exposure was carried out under conditions shown in Table 13.

(Evaluation of Holograms 145 to 149)

The amounts of refractive index change ($\Delta n$) of each of Holograms 145 to 149 prepared herein were obtained in a manner similar to Example 43. $\Delta n$ of the hologram 145 was 0.049, $\Delta n$ of the hologram 146 was 0.05, $\Delta n$ of the hologram 147 was 0.048, $\Delta n$ of the hologram 148 was 0.048, and $\Delta n$ of the hologram 149 was 0.049.

Comparative Examples 50 to 54

(Preparation of Photosensitive Compositions for Hologram Recording 150 to 154)

In Comparative Example 50, using a material similar to one used in Example 76, a photosensitive composition for hologram recording 150 was prepared in a manner similar to Example 43 except that no polymerization inhibitor (hydroquinone ("HQ", available from FUJIFILM Wako Pure Chemical Corporation) was used. In Comparative Example 51, using a material similar to one used in Example 77, a photosensitive composition for hologram recording 151 was prepared in a manner similar to Example 43 except that no polymerization inhibitor (hydroquinone ("HQ", available from FUJIFILM Wako Pure Chemical Corporation) was used. In Comparative Example 52, using a material similar to one used in Example 78, a photosensitive composition for hologram recording 152 was prepared in a manner similar to Example 43 except that no polymerization inhibitor (hydroquinone ("HQ", available from FUJIFILM Wako Pure Chemical Corporation) was used. In Comparative Example 53, using a material similar to one used in Example 79, a photosensitive composition for hologram recording 153 was prepared in a manner similar to Example 43 except that no polymerization inhibitor (hydroquinone ("HQ", available from FUJIFILM Wako Pure Chemical Corporation) was used. In Comparative Example 54, using a material similar to one used in Example 80, a photosensitive composition for hologram recording 154 was prepared in a manner similar to Example 43 except that no polymerization inhibitor (hydroquinone ("HQ", available from FUJIFILM Wako Pure Chemical Corporation) was used. Note that the photosensitive compositions for hologram recording 150 to 154 were prepared according to amounts of additives shown in the following Table 13.

(Preparation of Hologram Recording Media 150 to 154)

Using the prepared photosensitive compositions for hologram recording 150 to 154, hologram recording media 150 to 154 were prepared in a manner similar to Example 43.

(Preparation of Holograms 150 to 154)

Using the prepared hologram recording media 150 to 154, holograms 150 to 154 were prepared in a manner similar to Example 43 except that exposure was carried out under conditions shown in the following Table 13.

(Evaluation of Holograms 150 to 154)

The amounts of refractive index change ($\Delta n$) of each of Holograms 150 to 154 prepared herein were obtained in a manner similar to Example 43. $\Delta n$ of the hologram 150 was 0.051, $\Delta n$ of the hologram 151 was 0.052, $\Delta n$ of the hologram 152 was 0.051, $\Delta n$ of the hologram 153 was 0.055, and $\Delta n$ of the hologram 154 was 0.054.

Examples 81 to 82

(Preparation of Photosensitive Compositions for Hologram Recording 81 to 82)

Using materials similar to one used in Example 43, photosensitive composition for hologram recording 44 to 49 were prepared in a manner similar to Example 43 according to amounts of additives shown in the following Table 14 except that bisphenoxy ethanol fluorene dimethacrylate ("EA-0200", available from Osaka Gas Chemicals Co., Ltd.) as a polyfunctional (bifunctional) photopolymerizable monomer and the compound 10-1 as a monofunctional photopolymerizable monomer were used in Example 81, and bisphenoxy ethanol fluorene dimethacrylate ("EA-0200", available from Osaka Gas Chemicals Co., Ltd.) as a polyfunctional (bifunctional) photopolymerizable monomer and the compound 10-2 as a monofunctional photopolymerizable monomer were used in Example 82.

(Preparation of Hologram Recording Media 81 to 82)

Using the prepared photosensitive compositions for hologram recording 81 to 82, hologram recording media 81 to 82 were prepared in a manner similar to Example 43.

(Preparation of Holograms 81 to 82)

Using the prepared hologram recording media 81 to 82, holograms 81 to 82 were prepared in a manner similar to Example 43 except that exposure was carried out under conditions shown in Table 14.

(Evaluation of Holograms 81 to 82)

The amounts of refractive index change ($\Delta n$) of each of Holograms 81 to 82 prepared herein were obtained in a manner similar to Example 43. $\Delta n$ of the hologram 81 was 0.090, and $\Delta n$ of the hologram 82 was 0.092.

Examples 83 to 88

(Preparation of Photosensitive Compositions for Hologram Recording 81 to 82)

Using materials similar to one used in Example 43, photosensitive compositions for hologram recording 83 to 88 were prepared in a manner similar to Example 43 according to amounts of additives shown in the following Table 15 except that bisphenoxy ethanol fluorene dimethacrylate ("EA-0200", available from Osaka Gas Chemicals Co., Ltd.) as a polyfunctional (bifunctional) photopolymerizable monomer, N-vinylcarbazole ("NVC", available from Sigma-Aldrich) as a monofunctional photopolymerizable monomer, and phenothiazine ("PT", available from Tokyo Chemical Industry Co., Ltd.) as a polymerization inhibitor were used in Examples 83 to 86, bisphenoxy ethanol fluorene dimethacrylate ("EA-0200", available from Osaka Gas Chemicals Co., Ltd.) as a polyfunctional (bifunctional) photopolymerizable monomer, 2-(9H-carbazole-9-yl)ethyl acrylate ("EACz", available from Sigma-Aldrich) as a monofunctional photopolymerizable monomer, and phenothiazine ("PT", available from Tokyo Chemical Industry Co., Ltd.) as a polymerization inhibitor were used in Examples 84 to 87, and bisphenoxy ethanol fluorene dimethacrylate ("EA-0200", available from Osaka Gas Chemicals Co., Ltd.) as a polyfunctional (bifunctional) photopolymerizable monomer, 9H-carbazole-9-ethylmethacrylate ("EMCz", available from Sigma-Aldrich) as a monofunctional photopolymerizable monomer, and phenothiazine ("PT", available from Tokyo Chemical Industry Co., Ltd.) as a polymerization inhibitor were used in Examples 85 to 88.

(Preparation of Hologram Recording Media 83 to 88)

Using the prepared photosensitive compositions for hologram recording 83 to 88, hologram recording media 83 to 88 were prepared in a manner similar to Example 43.

(Preparation of Holograms 83 to 88)

Using the prepared hologram recording media 81 to 82, holograms 81 to 82 were prepared in a manner similar to Example 43 except that exposure was carried out under conditions shown in Table 14.

(Evaluation of Holograms 83 to 88)

The amounts of refractive index change ($\Delta n$) of each of Holograms 83 to 88 prepared herein were obtained in a manner similar to Example 43. $\Delta n$ of the hologram 83 was 0.066, $\Delta n$ of the hologram 84 was 0.069, $\Delta n$ of the hologram 85 was 0.068, $\Delta n$ of the hologram 86 was 0.060, $\Delta n$ of the hologram 87 was 0.062, $\Delta n$ of the hologram 88 was 0.061.

Note that the photosensitive compositions for hologram recording 1 to 82 prepared in Examples 1 to 82 according to the present technology are determined by, for example, chromatography typified by nuclear magnetic resonance spectroscopy, infrared spectroscopy, Raman spectroscopy, ultraviolet-visible absorption spectroscopy, high performance liquid chromatography, gas chromatography, and the like.

[Consideration]

(Reason for High $\Delta n$ Due to Addition of Polymerization Inhibitor)

Examples are examples in which a polymerization inhibitor was used as an additive, while Comparative Examples are examples in which no polymerization inhibitor was used. Hereinafter described is consideration on comparison of the results between Examples 1 to 4 and Comparative Examples 1 to 4, comparison of the results between Examples 5 to 8 and Comparative Examples 5 to 8, comparison of the results between Examples 9 to 12 and Comparative Examples 9 to 12, comparison of the results between Examples 13 to 16 and Comparative Examples 13 to 16, comparison of the results between Examples 17 to 24 and Comparative Examples 1 to 4, comparison of the results between Examples 1 to 4 and Examples 17 to 24, comparison of the results between Examples 43 to 56 and Comparative Examples 17 to 28, comparison of the results between Examples 57 to 70 and Comparative Examples 31 to 44, comparison of the results between Examples 71 to 80 and Comparative Examples 45 to 54, and the results of Examples 81 to 88.

There are two possible effects due to an improvement in $\Delta n$ by a polymerization inhibitor. The first effect is prevention of forming polymers in regions which mutually dim (dark sections) during interference exposure. A polymer formed by polymerization may be a factor that inhibits diffusion when it is present in a diffusion path of components that change the refractive index such as a monomer, a plasticizer, and a matrix. It is inferred that a polymerization inhibitor is effective in preventing formation of polymers which inhibit such diffusion. The second effect is prevention of consuming monomers in the dark sections. Such an effect increases a quantity of monomers that diffuse from the dark sections to regions which mutually intensify (bright sections) during interference exposure, causing promotion of the refractive index change.

(Reason for High $\Delta n$ Particularly in Results of Examples 5 to 8, Examples 43 to 56, Examples 57 to 70, Examples 71 to 80, and Examples 81 to 82)

Particularly, since a monomer with a high refractive index is contained in each photosensitive composition, when components with a low refractive index, such as a plasticizer and a matrix, and the monomer with a high refractive index are separated by interference exposure, the refractive index changes in a large extent. In addition, since the polymerization inhibitor promotes the separation of the components that change the refractive index, it is possible to obtain high $\Delta n$ due to a synergistic effect of containing the monomer with a high refractive index.

(Reason for Optimum Exposure Intensity)

The results of comparison between Examples 25 to 32 and Examples 33 to 42 will be considered.

Before the interference exposure, the polymerization inhibitor is uniformly present in the hologram recording medium. For this reason, a photopolymerization initiation reaction and a termination reaction due to the polymerization inhibitor compete in both of the regions which mutually intensify (bright sections) and the regions which mutually dim (dark sections) during interference exposure. With an exposure intensity weaker than an optimum exposure intensity, the effect of the termination reaction due to the polymerization inhibitor in the bright sections becomes prominent, which hardly progresses polymerization. Accordingly, the components that change the refractive index are prevented from being separated from each other, leading to a decrease in $\Delta n$. Furthermore, with an exposure intensity stronger than the optimum exposure intensity, the effect of the termination reaction due to the polymerization inhibitor in the dark sections is undermined, which causes the progression of polymerization. Accordingly, the components that change the refractive index are prevented from being separated from each other, leading to a decrease in $\Delta n$. Because of those reasons, there is the optimum exposure intensity which facilitates the progression of polymerization in the bright sections and which prevents polymerization in the dark sections.

TABLE 1

| | | EXAMPLE 1 | EXAMPLE 2 | EXAMPLE 3 | EXAMPLE 4 | EXAMPLE 5 | EXAMPLE 6 | EXAMPLE 7 | EXAMPLE 8 |
|---|---|---|---|---|---|---|---|---|---|
| COMPOSITION | PHOTOPOLYMERIZABLE MONOMER | | | | | | | | |
| | EA-0200 | 1.1 | 1.1 | 1.4 | 1.4 | | | | |
| | 3.11-DAEDNT PHOTOPOLYMERIZABLE MONOMER | | | | | 1.1 | 1.1 | 1.4 | 1.4 |
| | NVC | 0.4 | 0.4 | 0.3 | 0.3 | | | | |
| | 5AcDNpTh BINDER RESIN | | | | | 0.4 | 0.4 | 0.3 | 0.3 |
| | SN-09T | 0.7 | 0.7 | | | 0.7 | 0.7 | | |
| | SN-55T PHOTOPOLYMERIZATION INITIATOR | | | 0.5 | 0.5 | | | 0.5 | 0.5 |
| | DI POLYMERIZATION INHIBITOR | 0.09 | 0.09 | 0.09 | 0.09 | 0.09 | 0.09 | 0.09 | 0.09 |
| | HQ PLASTICIZER | 0.01 | 0.003 | 0.01 | 0.003 | 0.01 | 0.003 | 0.01 | 0.003 |
| | SDE SENSITIZING DYE | 1 | 1 | 1 | 1 | 1 | 1 | 1 | 1 |
| | BC | 0.02 | | 0.02 | | 0.02 | | 0.02 | |
| | RB CHAIN TRANSFER AGENT | | 0.08 | | 0.08 | | 0.08 | | 0.08 |
| | 2-MBO SOLVENT | | | 0.02 | 0.02 | | | 0.02 | 0.02 |
| | ACETONE | 8 | 8 | 8 | 8 | 8 | 8 | 8 | 8 |
| CONDITIONS FOR EXPOSURE | EXPOSURE WAVELENGTH/nm | 457 | 532 | 457 | 532 | 457 | 532 | 457 | 532 |
| | LIGHT INTENSITY ON ONE SIDE/ mW · cm$^{-2}$ | 20 | 2.6 | 20 | 2.6 | 20 | 2.6 | 20 | 2.6 |
| | TIME OF EXPOSURE/ SECOND | 20 | 30 | 20 | 30 | 20 | 30 | 20 | 30 |
| DIFFRACTION CHARACTERISTIC | Δn | 0.065 | 0.066 | 0.069 | 0.067 | 0.087 | 0.086 | 0.091 | 0.092 |

TABLE 2

| | | EXAMPLE 9 | EXAMPLE 10 | EXAMPLE 11 | EXAMPLE 12 | EXAMPLE 13 | EXAMPLE 14 | EXAMPLE 15 | EXAMPLE 16 |
|---|---|---|---|---|---|---|---|---|---|
| COMPOSITION | PHOTOPOLYMERIZABLE MONOMER | | | | | | | | |
| | EA-0200 | 1.1 | 1.1 | 1.1 | 1.1 | 1.4 | 1.4 | 1.4 | 1.4 |
| | PHOTOPOLYMERIZABLE MONOMER | | | | | | | | |
| | NVC | 0.4 | 0.4 | 0.4 | 0.4 | 0.3 | 0.3 | 0.3 | 0.3 |
| | BINDER RESIN | | | | | | | | |
| | SN-09T | 0.7 | 0.7 | 0.7 | 0.7 | | | | |
| | SN-55T | | | | | 0.5 | 0.5 | 0.5 | 0.5 |
| | PHOTOPOLYMERIZATION INITIATOR | | | | | | | | |
| | DI | 0.09 | 0.09 | 0.09 | 0.09 | 0.09 | 0.09 | 0.09 | 0.09 |
| | POLYMERIZATION INHIBITOR | | | | | | | | |
| | HQ | 0.01 | 0.01 | 0.003 | 0.003 | 0.01 | 0.01 | 0.003 | 0.003 |
| | PLASTICIZER | | | | | | | | |
| | SDE | 1 | 1 | 1 | 1 | 1 | 1 | 1 | 1 |
| | SENSITIZING DYE | | | | | | | | |
| | BC | 0.02 | 0.02 | | | 0.02 | 0.02 | | |
| | RB | | | 0.08 | 0.08 | | | 0.08 | 0.08 |
| | CHAIN TRANSFER AGENT | | | | | | | | |
| | 2-MBO | | | | | 0.02 | 0.02 | 0.02 | 0.02 |
| | INORGANIC PARTICULATE | | | | | | | | |
| | SRD-K | 1.25 | | 1.25 | | 1.25 | | 1.25 | |
| | SZR-K | | 1.25 | | 1.25 | | 1.25 | | 1.25 |
| | SOLVENT | | | | | | | | |
| | ACETONE | 8 | 8 | 8 | 8 | 8 | 8 | 8 | 8 |
| CONDITIONS FOR EXPOSURE | EXPOSURE WAVELENGTH/nm | 457 | 457 | 532 | 532 | 457 | 457 | 532 | 532 |
| | LIGHT INTENSITY ON ONE SIDE/ mW·cm$^{-2}$ | 20 | 20 | 2.6 | 2.6 | 20 | 20 | 2.6 | 2.6 |
| | TIME OF EXPOSURE/ SECOND | 20 | 20 | 30 | 30 | 20 | 20 | 30 | 30 |
| DIFFRACTION CHARACTERISTIC | Δn | 0.078 | 0.073 | 0.08 | 0.076 | 0.083 | 0.081 | 0.088 | 0.085 |

TABLE 3

| | | EXAMPLE 17 | EXAMPLE 18 | EXAMPLE 19 | EXAMPLE 20 | EXAMPLE 21 | EXAMPLE 22 | EXAMPLE 23 | EXAMPLE 24 |
|---|---|---|---|---|---|---|---|---|---|
| COMPOSITION | PHOTOPOLYMERIZABLE MONOMER | | | | | | | | |
| | EA-0200 PHOTOPOLYMERIZABLE MONOMER | 1.1 | 1.1 | 1.1 | 1.1 | 1.4 | 1.4 | 1.4 | 1.4 |
| | NVC BINDER RESIN | 0.4 | 0.4 | 0.4 | 0.4 | 0.3 | 0.3 | 0.3 | 0.3 |
| | SN-09T | 0.7 | 0.7 | 0.7 | 0.7 | | | | |
| | SN-55T PHOTOPOLYMERIZATION INITIATOR | | | | | 0.5 | 0.5 | 0.5 | 0.5 |
| | DI POLYMERIZATION INHIBITOR | 0.09 | 0.09 | 0.09 | 0.09 | 0.09 | 0.09 | 0.09 | 0.09 |
| | ADK STAB AO-50 | 0.01 | | 0.003 | | 0.01 | | 0.003 | |
| | ADK STAB LA-31 PLASTICIZER | | 0.01 | | 0.003 | | 0.01 | | 0.003 |
| | SDE SENSITIZING DYE | 1 | 1 | 1 | 1 | 1 | 1 | 1 | 1 |
| | BC | 0.02 | 0.02 | | | 0.02 | 0.02 | | |
| | RB CHAIN TRANSFER AGENT | | | 0.08 | 0.08 | | | 0.08 | 0.08 |
| | 2-MBO SOLVENT | | | | | 0.02 | 0.02 | 0.02 | 0.02 |
| | ACETONE | 8 | 8 | 8 | 8 | 8 | 8 | 8 | 8 |
| CONDITIONS FOR EXPOSURE | EXPOSURE WAVELENGTH/nm | 457 | 457 | 532 | 532 | 457 | 457 | 532 | 532 |
| | LIGHT INTENSITY ON ONE SIDE/ mW · cm$^{-2}$ | 20 | 20 | 2.6 | 2.6 | 20 | 20 | 2.6 | 2.6 |
| | TIME OF EXPOSURE/ SECOND | 20 | 20 | 30 | 30 | 20 | 20 | 30 | 30 |
| DIFFRACTION CHARACTERISTIC | Δn | 0.068 | 0.07 | 0.07 | 0.072 | 0.071 | 0.073 | 0.074 | 0.075 |

TABLE 4

| | | COMPARATIVE EXAMPLE 1 | COMPARATIVE EXAMPLE 2 | COMPARATIVE EXAMPLE 3 | COMPARATIVE EXAMPLE 4 | COMPARATIVE EXAMPLE 5 | COMPARATIVE EXAMPLE 6 | COMPARATIVE EXAMPLE 7 | COMPARATIVE EXAMPLE 8 |
|---|---|---|---|---|---|---|---|---|---|
| COMPOSITION | PHOTOPOLYMERIZABLE MONOMER | | | | | | | | |
| | EA-0200 | 1.1 | 1.1 | 1.4 | 1.4 | | | | |
| | 3.11-DAENT | | | | | 1.1 | 1.1 | 1.4 | 1.4 |
| | PHOTOPOLYMERIZABLE MONOMER | | | | | | | | |
| | NVC | 0.4 | 0.4 | 0.3 | 0.3 | | | | |
| | DNTMA | | | | | 0.4 | 0.4 | 0.3 | 0.3 |
| | BINDER RESIN | | | | | | | | |
| | SN-09T | 0.7 | 0.7 | | | 0.7 | 0.7 | | |
| | SN-55T | | | 0.5 | 0.5 | | | 0.5 | 0.5 |
| | PHOTOPOLYMERIZATION INITIATOR | | | | | | | | |
| | DI | 0.09 | 0.09 | 0.09 | 0.09 | 0.09 | 0.09 | 0.09 | 0.09 |
| | PLASTICIZER | | | | | | | | |
| | SDE | 1 | 1 | 1 | 1 | 1 | 1 | 1 | 1 |
| | SENSITIZING DYE | | | | | | | | |
| | BC | 0.02 | | 0.02 | | 0.02 | | 0.02 | |
| | RB | | 0.08 | | 0.08 | | 0.08 | | 0.08 |
| | CHAIN TRANSFER AGENT | | | | | | | | |
| | 2-MBO | | | 0.02 | 0.02 | | | 0.02 | 0.02 |
| | SOLVENT | | | | | | | | |
| | ACETONE | 8 | 8 | 8 | 8 | 8 | 8 | 8 | 8 |
| CONDITIONS FOR EXPOSURE | EXPOSURE WAVELENGTH/nm | 457 | 532 | 457 | 532 | 457 | 532 | 457 | 532 |
| | LIGHT INTENSITY ON ONE SIDE/ mW·cm$^{-2}$ | 20 | 2.6 | 20 | 2.6 | 20 | 2.6 | 20 | 2.6 |
| | TIME OF EXPOSURE/ SECOND | 20 | 30 | 20 | 30 | 20 | 30 | 20 | 30 |
| DIFFRACTION CHARACTERISTIC | $\Delta n$ | 0.043 | 0.037 | 0.035 | 0.038 | 0.047 | 0.049 | 0.046 | 0.048 |

TABLE 5

| | | COMPARATIVE EXAMPLE 9 | COMPARATIVE EXAMPLE 10 | COMPARATIVE EXAMPLE 11 | COMPARATIVE EXAMPLE 12 | COMPARATIVE EXAMPLE 13 | COMPARATIVE EXAMPLE 14 | COMPARATIVE EXAMPLE 15 | COMPARATIVE EXAMPLE 16 |
|---|---|---|---|---|---|---|---|---|---|
| COMPOSITION | PHOTOPOLYMERIZABLE MONOMER | | | | | | | | |
| | EA-0200 PHOTOPOLYMERIZABLE MONOMER | 1.1 | 1.1 | 1.1 | 1.1 | 1.4 | 1.4 | 1.4 | 1.4 |
| | NVC BINDER RESIN | 0.4 | 0.4 | 0.4 | 0.4 | 0.3 | 0.3 | 0.3 | 0.3 |
| | SN-09T | 0.7 | 0.7 | 0.7 | 0.7 | | | | |
| | SN-55T PHOTOPOLYMERIZATION INITIATOR | | | | | 0.5 | 0.5 | 0.5 | 0.5 |
| | DI PLASTICIZER | 0.09 | 0.09 | 0.09 | 0.09 | 0.09 | 0.09 | 0.09 | 0.09 |
| | SDE SENSITIZING DYE | 1 | 1 | 1 | 1 | 1 | 1 | 1 | 1 |
| | BC | 0.02 | 0.02 | | | 0.02 | 0.02 | | |
| | RB CHAIN TRANSFER AGENT | | | 0.08 | 0.08 | | | 0.08 | 0.08 |
| | 2-MBO INORGANIC PARTICULATE | | | | | 0.02 | 0.02 | 0.02 | 0.02 |
| | SRD-K | 1.25 | | 1.25 | | 1.25 | | 1.25 | |
| | SZR-K SOLVENT | | 1.25 | | 1.25 | | 1.25 | | 1.25 |
| | ACETONE | 8 | 8 | 8 | 8 | 8 | 8 | 8 | 8 |
| CONDITIONS FOR EXPOSURE | EXPOSURE WAVELENGTH/nm | 457 | 457 | 532 | 532 | 457 | 457 | 532 | 532 |
| | LIGHT INTENSITY ON ONE SIDE/ mW · cm$^{-2}$ | 20 | 20 | 2.6 | 2.6 | 20 | 20 | 2.6 | 2.6 |
| | TIME OF EXPOSURE/ SECOND | 20 | 20 | 30 | 30 | 20 | 20 | 30 | 30 |
| DIFFRACTION CHARACTERISTIC | Δn | 0.048 | 0.046 | 0.049 | 0.046 | 0.045 | 0.044 | 0.046 | 0.045 |

TABLE 6

| | | EXAMPLE 25 | EXAMPLE 26 | EXAMPLE 27 | EXAMPLE 28 | EXAMPLE 29 | EXAMPLE 30 | EXAMPLE 31 | EXAMPLE 32 |
|---|---|---|---|---|---|---|---|---|---|
| COMPOSITION | PHOTOPOLYMERIZABLE MONOMER | | | | | | | | |
| | EA-0200 PHOTOPOLYMERIZABLE MONOMER | 1.1 | 1.1 | 1.1 | 1.1 | 1.1 | 1.1 | 1.1 | 1.1 |
| | NVC BINDER RESIN | 0.4 | 0.4 | 0.4 | 0.4 | 0.4 | 0.4 | 0.4 | 0.4 |
| | SN-09T PHOTOPOLYMERIZATION INITIATOR | 0.7 | 0.7 | 0.7 | 0.7 | 0.7 | 0.7 | 0.7 | 0.7 |
| | DI POLYMERIZATION INHIBITOR | 0.09 | 0.09 | 0.09 | 0.09 | 0.09 | 0.09 | 0.09 | 0.09 |
| | HQ PLASTICIZER | 0.01 | 0.02 | 0.005 | 0.003 | 0.003 | 0.012 | 0.006 | 0.0015 |
| | SDE SENSITIZING DYE | 1 | 1 | 1 | 1 | 1 | 1 | 1 | 1 |
| | BC | 0.02 | 0.02 | 0.02 | 0.02 | | | | |
| | RB SOLVENT | | | | | 0.08 | 0.08 | 0.08 | 0.08 |
| | ACETONE | 8 | 8 | 8 | 8 | 8 | 8 | 8 | 8 |
| CONDITIONS FOR EXPOSURE | EXPOSURE WAVELENGTH/nm | 457 | 457 | 457 | 457 | 532 | 532 | 532 | 532 |
| | LIGHT INTENSITY ON ONE SIDE/ mW · cm$^{-2}$ | 20 | 40 | 10 | 6 | 2.6 | 10.4 | 5.2 | 1.3 |
| | TIME OF EXPOSURE/ SECOND | 20 | 10 | 40 | 33 | 30 | 7.5 | 15 | 60 |
| DIFFRACTION CHARACTERISTIC | Δn | 0.065 | 0.067 | 0.066 | 0.067 | 0.066 | 0.068 | 0.069 | 0.065 |

TABLE 7

| | | EXAMPLE 33 | EXAMPLE 34 | EXAMPLE 35 | EXAMPLE 36 | EXAMPLE 37 | EXAMPLE 38 | EXAMPLE 39 |
|---|---|---|---|---|---|---|---|---|
| COMPOSITION | PHOTOPOLYMERIZABLE MONOMER | | | | | | | |
| | EA-0200 | 1.1 | 1.1 | 1.1 | 1.1 | 1.1 | 1.1 | 1.1 |

TABLE 7-continued

| | | | | | | | | | |
|---|---|---|---|---|---|---|---|---|---|
| | PHOTO-POLY-MERIZABLE MONOMER | | | | | | | | |
| | NVC BINDER RESIN | 0.4 | 0.4 | 0.4 | 0.4 | 0.4 | 0.4 | 0.4 |
| | SN-09T PHOTO-POLY-MERIZATION INITIATOR | 0.7 | 0.7 | 0.7 | 0.7 | 0.7 | 0.7 | 0.7 |
| | DI POLY-MERIZATION INHIBITOR | 0.09 | 0.09 | 0.09 | 0.09 | 0.09 | 0.09 | 0.09 |
| | HQ PLASTICIZER | 0.01 | 0.01 | 0.01 | 0.05 | 0.005 | 0.003 | 0.003 |
| | SDE SENSITIZING DYE | 1 | 1 | 1 | 1 | 1 | 1 | 1 |
| | BC | 0.02 | 0.02 | 0.02 | 0.02 | 0.02 | | |
| | RB SOLVENT | | | | | | 0.08 | 0.08 |
| CONDITIONS FOR EXPOSURE | ACETONE | 8 | 8 | 8 | 8 | 8 | 8 | 8 |
| | EXPOSURE WAVELENGTH/nm | 457 | 457 | 457 | 457 | 457 | 532 | 532 |
| | LIGHT INTENSITY ON ONE SIDE/ mW · cm$^{-2}$ | 40 | 10 | 6 | 20 | 20 | 10.4 | 5.2 |
| | TIME OF EXPOSURE/ SECOND | 10 | 40 | 33 | 20 | 20 | 7.5 | 15 |
| DIFFRACTION CHARACTERISTIC | Δn | 0.06 | 0.062 | 0.061 | 0.063 | 0.062 | 0.06 | 0.06 |

| | | | EXAMPLE 40 | EXAMPLE 41 | EXAMPLE 42 |
|---|---|---|---|---|---|
| | COMPOSITION | PHOTO-POLY-MERIZABLE MONOMER | | | |
| | | EA-0200 PHOTO-POLY-MERIZABLE MONOMER | 1.1 | 1.1 | 1.1 |
| | | NVC BINDER RESIN | 0.4 | 0.4 | 0.4 |
| | | SN-09T PHOTO-POLY-MERIZATION INITIATOR | 0.7 | 0.7 | 0.7 |
| | | DI POLY-MERIZATION INHIBITOR | 0.09 | 0.09 | 0.09 |
| | | HQ | 0.003 | 0.0006 | 0.015 |

TABLE 7-continued

|  |  |  | | | |
|---|---|---|---|---|---|
| | | PLASTICIZER | | | |
| | | SDE SENSITIZING DYE | 1 | 1 | 1 |
| | | BC RB SOLVENT | 0.08 | 0.08 | 0.08 |
| CONDITIONS FOR EXPOSURE | EXPOSURE WAVELENGTH/nm | ACETONE | 8 | 8 | 8 |
| | | | 532 | 532 | 532 |
| | LIGHT INTENSITY ON ONE SIDE/ $mW \cdot cm^{-2}$ | | 1.3 | 2.6 | 2.6 |
| | TIME OF EXPOSURE/ SECOND | | 60 | 30 | 30 |
| DIFFRACTION CHARACTER- | $\Delta n$ | | 0.062 | 0.063 | 0.062 |

TABLE 8

| | | EXAMPLE 43 | EXAMPLE 44 | EXAMPLE 45 | EXAMPLE 46 | EXAMPLE 47 | EXAMPLE 48 | EXAMPLE 49 | EXAMPLE 50 |
|---|---|---|---|---|---|---|---|---|---|
| COMPOSITION | PHOTOPOLYMERIZABLE MONOMER | | | | | | | | |
| | COMPOUND 5-5 | 1.4 | | | | | | | 1.4 |
| | COMPOUND 5-6 | | 1.4 | | | | | | |
| | COMPOUND 5-7 | | | 1.4 | | | | | |
| | COMPOUND 6-1 | | | | 1.4 | | | | |
| | COMPOUND 7-1 | | | | | 1.4 | | | |
| | EA-0200 | | | | | | 1.4 | | |
| | 3.11-DAEDENT PHOTOPOLYMERIZABLE MONOMER | | | | | | | 1.4 | |
| | COMPOUND 5-1 | 0.3 | 0.3 | 0.3 | 0.3 | 0.3 | 0.3 | 0.3 | |
| | COMPOUND 5-2 BINDER RESIN | | | | | | | | 0.3 |
| | SN-55T PHOTOPOLYMERIZATION INITIATOR | 0.5 | 0.5 | 0.5 | 0.5 | 0.5 | 0.5 | 0.5 | 0.5 |
| | DI POLYMERIZATION INHIBITOR | 0.09 | 0.09 | 0.09 | 0.09 | 0.09 | 0.09 | 0.09 | 0.09 |
| | HQ PLASTICIZER | 0.003 | 0.003 | 0.003 | 0.003 | 0.003 | 0.003 | 0.003 | 0.003 |
| | SDE SENSITIZING DYE | 1 | 1 | 1 | 1 | 1 | 1 | 1 | 1 |
| | RB | 0.08 | 0.08 | 0.08 | 0.08 | 0.08 | 0.08 | 0.08 | 0.08 |

TABLE 8-continued

|  |  |  |  |  |  |  |  |  |  |
|---|---|---|---|---|---|---|---|---|---|
|  | CHAIN TRANSFER AGENT |  |  |  |  |  |  |  |  |
|  | 2-MBO | 0.02 | 0.02 | 0.02 | 0.02 | 0.02 | 0.02 | 0.02 | 0.02 |
|  | SOLVENT |  |  |  |  |  |  |  |  |
|  | ACETONE | 8 | 8 | 8 | 8 | 8 | 8 | 8 | 8 |
| CONDITIONS FOR EXPOSURE | EXPOSURE WAVELENGTH/nm | 532 | 532 | 532 | 532 | 532 | 532 | 532 | 532 |
|  | LIGHT INTENSITY ON ONE SIDE/ mW · cm$^{-2}$ | 2.6 | 2.6 | 2.6 | 2.6 | 2.6 | 2.6 | 2.6 | 2.6 |
|  | TIME OF EXPOSURE/ SECOND | 30 | 30 | 30 | 30 | 30 | 30 | 30 | 30 |
| DIFFRACTION CHARACTERISTIC | Δn | 0.091 | 0.092 | 0.09 | 0.09 | 0.093 | 0.085 | 0.09 | 0.09 |

|  |  |  | EXAMPLE 51 | EXAMPLE 52 | EXAMPLE 53 | EXAMPLE 54 | EXAMPLE 55 | EXAMPLE 56 |
|---|---|---|---|---|---|---|---|---|
| COMPOSITION | PHOTOPOLYMERIZABLE MONOMER |  |  |  |  |  |  |  |
|  |  | COMPOUND 5-5 |  |  |  |  |  |  |
|  |  | COMPOUND 5-6 | 1.4 |  |  |  |  |  |
|  |  | COMPOUND 5-7 |  | 1.4 |  |  |  |  |
|  |  | COMPOUND 6-1 |  |  | 1.4 |  |  |  |
|  |  | COMPOUND 7-1 |  |  |  | 1.4 |  |  |
|  |  | EA-0200 |  |  |  |  | 1.4 |  |
|  |  | 3.11-DAEDENT |  |  |  |  |  | 1.4 |
|  | PHOTOPOLYMERIZABLE MONOMER |  |  |  |  |  |  |  |
|  |  | COMPOUND 5-1 |  |  |  |  |  |  |
|  |  | COMPOUND 5-2 | 0.3 | 0.3 | 0.3 | 0.3 | 0.3 | 0.3 |
|  | BINDER RESIN |  |  |  |  |  |  |  |
|  |  | SN-55T | 0.5 | 0.5 | 0.5 | 0.5 | 0.5 | 0.5 |
|  | PHOTOPOLYMERIZATION INITIATOR |  |  |  |  |  |  |  |
|  |  | DI | 0.09 | 0.09 | 0.09 | 0.09 | 0.09 | 0.09 |
|  | POLYMERIZATION INHIBITOR |  |  |  |  |  |  |  |
|  |  | HQ | 0.003 | 0.003 | 0.003 | 0.003 | 0.003 | 0.003 |
|  | PLASTICIZER |  |  |  |  |  |  |  |
|  |  | SDE | 1 | 1 | 1 | 1 | 1 | 1 |
|  | SENSITIZING DYE |  |  |  |  |  |  |  |
|  |  | RB | 0.08 | 0.08 | 0.08 | 0.08 | 0.08 | 0.08 |
|  | CHAIN TRANSFER AGENT |  |  |  |  |  |  |  |
|  |  | 2-MBO | 0.02 | 0.02 | 0.02 | 0.02 | 0.02 | 0.02 |
|  | SOLVENT |  |  |  |  |  |  |  |
|  |  | ACETONE | 8 | 8 | 8 | 8 | 8 | 8 |

TABLE 8-continued

| | | | | | | | |
|---|---|---|---|---|---|---|---|
| CONDITIONS FOR EXPOSURE | EXPOSURE WAVELENGTH/nm | 532 | 532 | 532 | 532 | 532 | 532 |
| | LIGHT INTENSITY ON ONE SIDE/ mW·cm$^{-2}$ | 2.6 | 2.6 | 2.6 | 2.6 | 2.6 | 2.6 |
| | TIME OF EXPOSURE/ SECOND | 30 | 30 | 30 | 30 | 30 | 30 |
| DIFFRACTION CHARACTERISTIC | Δn | 0.091 | 0.092 | 0.092 | 0.093 | 0.086 | 0.09 |

TABLE 9

| | | EXAMPLE 57 | EXAMPLE 58 | EXAMPLE 59 | EXAMPLE 60 | EXAMPLE 61 | EXAMPLE 62 | EXAMPLE 63 | EXAMPLE 64 |
|---|---|---|---|---|---|---|---|---|---|
| COMPOSITION | PHOTOPOLYMERIZABLE MONOMER | | | | | | | | |
| | COMPOUND 5-5 | 1.4 | | | | | | | 1.4 |
| | COMPOUND 5-6 | | 1.4 | | | | | | |
| | COMPOUND 5-7 | | | 1.4 | | | | | |
| | COMPOUND 6-1 | | | | 1.4 | | | | |
| | COMPOUND 7-1 | | | | | 1.4 | | | |
| | EA-0200 | | | | | | 1.4 | | |
| | 3.11-DAEDENT | | | | | | | 1.4 | |
| | PHOTOPOLYMERIZABLE MONOMER | | | | | | | | |
| | COMPOUND 5-3 | 0.3 | 0.3 | 0.3 | 0.3 | 0.3 | 0.3 | 0.3 | |
| | COMPOUND 5-4 | | | | | | | | 0.3 |
| | BINDER RESIN | | | | | | | | |
| | SN-55T | 0.5 | 0.5 | 0.5 | 0.5 | 0.5 | 0.5 | 0.5 | 0.5 |
| | PHOTOPOLYMERIZATION INITIATOR | | | | | | | | |
| | DI | 0.09 | 0.09 | 0.09 | 0.09 | 0.09 | 0.09 | 0.09 | 0.09 |
| | POLYMERIZATION INHIBITOR | | | | | | | | |
| | HQ | 0.003 | 0.003 | 0.003 | 0.003 | 0.003 | 0.003 | 0.003 | 0.003 |
| | PLASTICIZER | | | | | | | | |
| | SDE | 1 | 1 | 1 | 1 | 1 | 1 | 1 | 1 |
| | SENSITIZING DYE | | | | | | | | |
| | RB | 0.08 | 0.08 | 0.08 | 0.08 | 0.08 | 0.08 | 0.08 | 0.08 |
| | CHAIN TRANSFER AGENT | | | | | | | | |
| | 2-MBO | 0.02 | 0.02 | 0.02 | 0.02 | 0.02 | 0.02 | 0.02 | 0.02 |
| | SOLVENT | | | | | | | | |
| | ACETONE | 8 | 8 | 8 | 8 | 8 | 8 | 8 | 8 |

TABLE 9-continued

| | | | | | | | | | |
|---|---|---|---|---|---|---|---|---|---|
| CONDITIONS FOR EXPOSURE | EXPOSURE WAVELENGTH/nm | 532 | 532 | 532 | 532 | 532 | 532 | 532 | 532 |
| | LIGHT INTENSITY ON ONE SIDE/ mW·cm$^{-2}$ | 2.6 | 2.6 | 2.6 | 2.6 | 2.6 | 2.6 | 2.6 | 2.6 |
| | TIME OF EXPOSURE/ SECOND | 30 | 30 | 30 | 30 | 30 | 30 | 30 | 30 |
| DIFFRACTION CHARACTERISTIC | Δn | 0.09 | 0.093 | 0.092 | 0.094 | 0.095 | 0.087 | 0.091 | 0.091 |

| | | | EXAMPLE 65 | EXAMPLE 66 | EXAMPLE 67 | EXAMPLE 68 | EXAMPLE 69 | EXAMPLE 70 |
|---|---|---|---|---|---|---|---|---|
| COMPOSITION | PHOTOPOLYMERIZABLE MONOMER | | | | | | | |
| | COMPOUND 5-5 | | 1.4 | | | | | |
| | COMPOUND 5-6 | | | 1.4 | | | | |
| | COMPOUND 5-7 | | | | 1.4 | | | |
| | COMPOUND 6-1 | | | | | 1.4 | | |
| | COMPOUND 7-1 | | | | | | 1.4 | |
| | EA-0200 3.11-DAEDENT | | | | | | | 1.4 |
| | PHOTOPOLYMERIZABLE MONOMER | | | | | | | |
| | COMPOUND 5-3 | | | | | | | |
| | COMPOUND 5-4 | | 0.3 | 0.3 | 0.3 | 0.3 | 0.3 | 0.3 |
| | BINDER RESIN | | | | | | | |
| | SN-55T | | 0.5 | 0.5 | 0.5 | 0.5 | 0.5 | 0.5 |
| | PHOTOPOLYMERIZATION INITIATOR | | | | | | | |
| | DI | | 0.09 | 0.09 | 0.09 | 0.09 | 0.09 | 0.09 |
| | POLYMERIZATION INHIBITOR | | | | | | | |
| | HQ | | 0.003 | 0.003 | 0.003 | 0.003 | 0.003 | 0.003 |
| | PLASTICIZER | | | | | | | |
| | SDE | | 1 | 1 | 1 | 1 | 1 | 1 |
| | SENSITIZING DYE | | | | | | | |
| | RB | | 0.08 | 0.08 | 0.08 | 0.08 | 0.08 | 0.08 |
| | CHAIN TRANSFER AGENT | | | | | | | |
| | 2-MBO | | 0.02 | 0.02 | 0.02 | 0.02 | 0.02 | 0.02 |
| | SOLVENT | | | | | | | |
| | ACETONE | | 8 | 8 | 8 | 8 | 8 | 8 |
| CONDITIONS FOR EXPOSURE | EXPOSURE WAVELENGTH/nm | | 532 | 532 | 532 | 532 | 532 | 532 |
| | LIGHT INTENSITY ON ONE SIDE/ mW·cm$^{-2}$ | | 2.6 | 2.6 | 2.6 | 2.6 | 2.6 | 2.6 |

TABLE 9-continued

|  |  |  |  |  |  |  |  |
|---|---|---|---|---|---|---|---|
|  | TIME OF EXPOSURE/SECOND | 30 | 30 | 30 | 30 | 30 | 30 |
| DIFFRACTION CHARACTERISTIC | Δn | 0.091 | 0.095 | 0.094 | 0.092 | 0.088 | 0.092 |

TABLE 10

| | | EXAMPLE 71 | EXAMPLE 72 | EXAMPLE 73 | EXAMPLE 74 | EXAMPLE 75 | EXAMPLE 76 | EXAMPLE 77 | EXAMPLE 78 |
|---|---|---|---|---|---|---|---|---|---|
| COMPOSITION | PHOTOPOLYMERIZABLE MONOMER | | | | | | | | |
| | COMPOUND 5-5 | 1.4 | | | | | 1.4 | | |
| | COMPOUND 5-6 | | 1.4 | | | | | 1.4 | |
| | COMPOUND 5-7 | | | 1.4 | | | | | 1.4 |
| | COMPOUND 6-1 | | | | 1.4 | | | | |
| | COMPOUND 7-1 | | | | | 1.4 | | | |
| | PHOTOPOLYMERIZABLE MONOMER | | | | | | | | |
| | NVC | 0.3 | 0.3 | 0.3 | 0.3 | 0.3 | | 0.3 | 0.3 |
| | DNTMA | | | | | | 0.3 | | |
| | BINDER RESIN | | | | | | | | |
| | SN-55T | 0.5 | 0.5 | 0.5 | 0.5 | 0.5 | 0.5 | 0.5 | 0.5 |
| | PHOTOPOLYMERIZATION INITIATOR | | | | | | | | |
| | DI | 0.09 | 0.09 | 0.09 | 0.09 | 0.09 | 0.09 | 0.09 | 0.09 |
| | POLYMERIZATION INHIBITOR | | | | | | | | |
| | HQ | 0.003 | 0.003 | 0.003 | 0.003 | 0.003 | 0.003 | 0.003 | 0.003 |
| | PLASTICIZER | | | | | | | | |
| | SDE | 1 | 1 | 1 | 1 | 1 | 1 | 1 | 1 |
| | SENSITIZING DYE | | | | | | | | |
| | RB | 0.08 | 0.08 | 0.08 | 0.08 | 0.08 | 0.08 | 0.08 | 0.08 |
| | CHAIN TRANSFER AGENT | | | | | | | | |
| | 2-MBO | 0.02 | 0.02 | 0.02 | 0.02 | 0.02 | 0.02 | 0.02 | 0.02 |
| | SOLVENT | | | | | | | | |
| | ACETONE | 8 | 8 | 8 | 8 | 8 | 8 | 8 | 8 |
| CONDITIONS FOR EXPOSURE | EXPOSURE WAVELENGTH/nm | 532 | 532 | 532 | 532 | 532 | 532 | 532 | 532 |
| | LIGHT INTENSITY ON ONE SIDE/mW · cm$^{-2}$ | 2.6 | 2.6 | 2.6 | 2.6 | 2.6 | 2.6 | 2.6 | 2.6 |
| | TIME OF EXPOSURE/SECOND | 30 | 30 | 30 | 30 | 30 | 30 | 30 | 30 |

TABLE 10-continued

| DIF-FRACTION CHARACTERISTIC | Δn | 0.085 | 0.086 | 0.085 | 0.087 | 0.088 | 0.091 | 0.092 | 0.091 |
|---|---|---|---|---|---|---|---|---|---|

| | | | | EXAMPLE 79 | EXAMPLE 80 |
|---|---|---|---|---|---|
| COMPOSITION | PHOTOPOLYMERIZABLE MONOMER | | | | |
| | | COMPOUND 5-5 | | | |
| | | COMPOUND 5-6 | | | |
| | | COMPOUND 5-7 | | | |
| | | COMPOUND 6-1 | | 1.4 | |
| | | COMPOUND 7-1 | | | 1.4 |
| | PHOTOPOLYMERIZABLE MONOMER | | | | |
| | | NVC | | | |
| | | DNTMA | | 0.3 | 0.3 |
| | BINDER RESIN | | | | |
| | | SN-55T | | 0.5 | 0.5 |
| | PHOTOPOLYMERIZATION INITIATOR | | | | |
| | | DI | | 0.09 | 0.09 |
| | POLYMERIZATION INHIBITOR | | | | |
| | | HQ | | 0.003 | 0.003 |
| | PLASTICIZER | | | | |
| | | SDE | | 1 | 1 |
| | SENSITIZING DYE | | | | |
| | | RB | | 0.08 | 0.08 |
| | CHAIN TRANSFER AGENT | | | | |
| | | 2-MBO | | 0.02 | 0.02 |
| | SOLVENT | | | | |
| | | ACETONE | | 8 | 8 |
| CONDITIONS FOR EXPOSURE | EXPOSURE WAVELENGTH/nm | | | 532 | 532 |
| | LIGHT INTENSITY ON ONE SIDE/ mW · cm$^{-2}$ | | | 2.6 | 2.6 |
| | TIME OF EXPOSURE/ SECOND | | | 30 | 30 |
| DIFFRACTION CHARACTERISTIC | Δn | | | 0.09 | 0.09 |

TABLE 11

| | | COMPARATIVE EXAMPLE 17 | COMPARATIVE EXAMPLE 18 | COMPARATIVE EXAMPLE 19 | COMPARATIVE EXAMPLE 20 | COMPARATIVE EXAMPLE 21 | COMPARATIVE EXAMPLE 22 | COMPARATIVE EXAMPLE 23 | COMPARATIVE EXAMPLE 24 |
|---|---|---|---|---|---|---|---|---|---|
| COMPOSITION | PHOTOPOLYMERIZABLE MONOMER | | | | | | | | |
| | COMPOUND 5-5 | 1.4 | | | | | | | 1.4 |
| | COMPOUND 5-6 | | 1.4 | | | | | | |
| | COMPOUND 5-7 | | | 1.4 | | | | | |
| | COMPOUND 6-1 | | | | 1.4 | | | | |
| | COMPOUND 7-1 | | | | | 1.4 | | | |
| | EA-0200 | | | | | | 1.4 | | |
| | 3.11-DAEDNT | | | | | | | 1.4 | |
| | PHOTOPOLYMERIZABLE MONOMER | | | | | | | | |
| | COMPOUND 5-1 | 0.3 | 0.3 | 0.3 | 0.3 | 0.3 | 0.3 | 0.3 | |
| | COMPOUND 5-2 | | | | | | | | 0.3 |
| | BINDER RESIN | | | | | | | | |
| | SN-55T | 0.5 | 0.5 | 0.5 | 0.5 | 0.5 | 0.5 | 0.5 | 0.5 |
| | PHOTOPOLYMERIZATION INITIATOR | | | | | | | | |
| | DI | 0.09 | 0.09 | 0.09 | 0.09 | 0.09 | 0.09 | 0.09 | 0.09 |
| | PLASTICIZER | | | | | | | | |
| | SDE | 1 | 1 | 1 | 1 | 1 | 1 | 1 | 1 |
| | SENSITIZING DYE | | | | | | | | |
| | RB | 0.08 | 0.08 | 0.08 | 0.08 | 0.08 | 0.08 | 0.08 | 0.08 |
| | CHAIN TRANSFER AGENT | | | | | | | | |
| | 2-MBO | 0.02 | 0.02 | 0.02 | 0.02 | 0.02 | 0.02 | 0.02 | 0.02 |
| | SOLVENT | | | | | | | | |
| | ACETONE | 8 | 8 | 8 | 8 | 8 | 8 | 8 | 8 |
| CONDITIONS FOR EXPOSURE | EXPOSURE WAVELENGTH/nm | 532 | 532 | 532 | 532 | 532 | 532 | 532 | 532 |
| | LIGHT INTENSITY ON ONE SIDE/ mW · cm$^{-2}$ | 2.6 | 2.6 | 2.6 | 2.6 | 2.6 | 2.6 | 2.6 | 2.6 |
| | TIME OF EXPOSURE/ SECOND | 30 | 30 | 30 | 30 | 30 | 30 | 30 | 30 |
| DIFFRACTION CHARACTERISTIC | Δn | 0.051 | 0.052 | 0.05 | 0.053 | 0.054 | 0.051 | 0.054 | 0.055 |

| | | | EXAMPLE 25 | EXAMPLE 26 | EXAMPLE 27 | EXAMPLE 28 | EXAMPLE 29 | EXAMPLE 30 |
|---|---|---|---|---|---|---|---|---|
| COMPOSITION | PHOTOPOLYMERIZABLE MONOMER | | | | | | | |
| | | COMPOUND 5-5 | | | | | | |
| | | COMPOUND 5-6 | 1.4 | | | | | |
| | | COMPOUND 5-7 | | 1.4 | | | | |

TABLE 11-continued

|  |  |  |  |  |  |  |  |
|---|---|---|---|---|---|---|---|
|  | COMPOUND 6-1 |  |  | 1.4 |  |  |  |
|  | COMPOUND 7-1 |  |  |  | 1.4 |  |  |
|  | EA-0200 |  |  |  |  | 1.4 |  |
|  | 3.11-DAEDNT |  |  |  |  |  | 1.4 |
|  | PHOTO-POLY-MERIZABLE MONOMER |  |  |  |  |  |  |
|  | COMPOUND 5-1 |  |  |  |  |  |  |
|  | COMPOUND 5-2 | 0.3 | 0.3 | 0.3 | 0.3 | 0.3 | 0.3 |
|  | BINDER RESIN |  |  |  |  |  |  |
|  | SN-55T | 0.5 | 0.5 | 0.5 | 0.5 | 0.5 | 0.5 |
|  | PHOTO-POLY-MERIZATION INITIATOR |  |  |  |  |  |  |
|  | DI | 0.09 | 0.09 | 0.09 | 0.09 | 0.09 | 0.09 |
|  | PLASTICIZER |  |  |  |  |  |  |
|  | SDE | 1 | 1 | 1 | 1 | 1 | 1 |
|  | SENSITIZING DYE |  |  |  |  |  |  |
|  | RB | 0.08 | 0.08 | 0.08 | 0.08 | 0.08 | 0.08 |
|  | CHAIN TRANSFER AGENT |  |  |  |  |  |  |
|  | 2-MBO | 0.02 | 0.02 | 0.02 | 0.02 | 0.02 | 0.02 |
|  | SOLVENT |  |  |  |  |  |  |
|  | ACETONE | 8 | 8 | 8 | 8 | 8 | 8 |
| CONDITIONS FOR EXPOSURE | EXPOSURE WAVELENGTH/nm | 532 | 532 | 532 | 532 | 532 | 532 |
|  | LIGHT INTENSITY ON ONE SIDE/ mW · cm$^{-2}$ | 2.6 | 2.6 | 2.6 | 2.6 | 2.6 | 2.6 |
|  | TIME OF EXPOSURE/ SECOND | 30 | 30 | 30 | 30 | 30 | 30 |
| DIFFRACTION CHARACTERISTIC | Δn | 0.053 | 0.055 | 0.054 | 0.055 | 0.05 | 0.054 |

TABLE 12

|  |  | COMPARATIVE EXAMPLE 31 | COMPARATIVE EXAMPLE 32 | COMPARATIVE EXAMPLE 33 | COMPARATIVE EXAMPLE 34 | COMPARATIVE EXAMPLE 35 | COMPARATIVE EXAMPLE 36 | COMPARATIVE EXAMPLE 37 | COMPARATIVE EXAMPLE 38 |
|---|---|---|---|---|---|---|---|---|---|
| COMPOSITION | PHOTO-POLY-MERIZABLE MONOMER |  |  |  |  |  |  |  |  |
|  | COMPOUND 5-5 | 1.4 |  |  |  |  |  |  | 1.4 |
|  | COMPOUND 5-6 |  | 1.4 |  |  |  |  |  |  |
|  | COMPOUND 5-7 |  |  | 1.4 |  |  |  |  |  |
|  | COMPOUND 6-1 |  |  |  | 1.4 |  |  |  |  |
|  | COMPOUND 7-1 |  |  |  |  | 1.4 |  |  |  |
|  | EA-0200 |  |  |  |  |  | 1.4 |  |  |
|  | 3.11-DAEDNT |  |  |  |  |  |  | 1.4 |  |

TABLE 12-continued

| | | | | | | | | | | |
|---|---|---|---|---|---|---|---|---|---|---|
| | | PHOTO-POLY-MERIZABLE MONOMER | | | | | | | | |
| | | COMPOUND 5-3 | 0.3 | 0.3 | 0.3 | 0.3 | 0.3 | 0.3 | 0.3 | |
| | | COMPOUND 5-4 | | | | | | | | 0.3 |
| | | BINDER RESIN | | | | | | | | |
| | | SN-55T | 0.5 | 0.5 | 0.5 | 0.5 | 0.5 | 0.5 | 0.5 | 0.5 |
| | | PHOTO-POLY-MERIZATION INITIATOR | | | | | | | | |
| | | DI | 0.09 | 0.09 | 0.09 | 0.09 | 0.09 | 0.09 | 0.09 | 0.09 |
| | | PLASTICIZER | | | | | | | | |
| | | SDE | 1 | 1 | 1 | 1 | 1 | 1 | 1 | 1 |
| | | SENSITIZING DYE | | | | | | | | |
| | | RB | 0.08 | 0.08 | 0.08 | 0.08 | 0.08 | 0.08 | 0.08 | 0.08 |
| | | CHAIN TRANSFER AGENT | | | | | | | | |
| | | 2-MBO | 0.02 | 0.02 | 0.02 | 0.02 | 0.02 | 0.02 | 0.02 | 0.02 |
| | | SOLVENT | | | | | | | | |
| | | ACETONE | 8 | 8 | 8 | 8 | 8 | 8 | 8 | 8 |
| CONDITIONS FOR EXPOSURE | | EXPOSURE WAVELENGTH/nm | 532 | 532 | 532 | 532 | 532 | 532 | 532 | 532 |
| | | LIGHT INTENSITY ON ONE SIDE/mW·cm$^{-2}$ | 2.6 | 2.6 | 2.6 | 2.6 | 2.6 | 2.6 | 2.6 | 2.6 |
| | | TIME OF EXPOSURE/SECOND | 30 | 30 | 30 | 30 | 30 | 30 | 30 | 30 |
| DIFFRACTION CHARACTERISTIC | | Δn | 0.054 | 0.055 | 0.053 | 0.052 | 0.054 | 0.05 | 0.055 | 0.051 |

| | | | EXAMPLE 39 | EXAMPLE 40 | EXAMPLE 41 | EXAMPLE 42 | EXAMPLE 43 | EXAMPLE 44 |
|---|---|---|---|---|---|---|---|---|
| COMPOSITION | | PHOTO-POLY-MERIZABLE MONOMER | | | | | | |
| | | COMPOUND 5-5 | | | | | | |
| | | COMPOUND 5-6 | 1.4 | | | | | |
| | | COMPOUND 5-7 | | 1.4 | | | | |
| | | COMPOUND 6-1 | | | 1.4 | | | |
| | | COMPOUND 7-1 | | | | 1.4 | | |
| | | EA-0200 | | | | | 1.4 | |
| | | 3.11-DAEDNT | | | | | | 1.4 |
| | | PHOTO-POLY-MERIZABLE MONOMER | | | | | | |
| | | COMPOUND 5-3 | 0.3 | 0.3 | 0.3 | 0.3 | 0.3 | 0.3 |
| | | COMPOUND 5-4 | | | | | | |
| | | BINDER RESIN | | | | | | |
| | | SN-55T | 0.5 | 0.5 | 0.5 | 0.5 | 0.5 | 0.5 |

TABLE 12-continued

|  |  |  |  |  |  |  |  |  |
|---|---|---|---|---|---|---|---|---|
|  |  | PHOTO-POLY-MERIZATION INITIATOR |  |  |  |  |  |  |
|  |  | DI PLASTICIZER | 0.09 | 0.09 | 0.09 | 0.09 | 0.09 | 0.09 |
|  |  | SDE SENSITIZING DYE | 1 | 1 | 1 | 1 | 1 | 1 |
|  |  | RB CHAIN TRANSFER AGENT | 0.08 | 0.08 | 0.08 | 0.08 | 0.08 | 0.08 |
|  |  | 2-MBO SOLVENT | 0.02 | 0.02 | 0.02 | 0.02 | 0.02 | 0.02 |
|  |  | ACETONE | 8 | 8 | 8 | 8 | 8 | 8 |
|  | CONDITIONS FOR EXPOSURE | EXPOSURE WAVELENGTH/nm | 532 | 532 | 532 | 532 | 532 | 532 |
|  |  | LIGHT INTENSITY ON ONE SIDE/ $mW \cdot cm^{-2}$ | 2.6 | 2.6 | 2.6 | 2.6 | 2.6 | 2.6 |
|  |  | TIME OF EXPOSURE/ SECOND | 30 | 30 | 30 | 30 | 30 | 30 |
|  | DIFFRACTION CHARACTERISTIC | $\Delta n$ | 0.052 | 0.053 | 0.054 | 0.055 | 0.05 | 0.054 |

TABLE 13

|  |  | COMPARATIVE EXAMPLE 45 | COMPARATIVE EXAMPLE 46 | COMPARATIVE EXAMPLE 47 | COMPARATIVE EXAMPLE 48 | COMPARATIVE EXAMPLE 49 | COMPARATIVE EXAMPLE 50 | COMPARATIVE EXAMPLE 51 | COMPARATIVE EXAMPLE 52 |
|---|---|---|---|---|---|---|---|---|---|
| COMPOSITION | PHOTO-POLY-MERIZABLE MONOMER |  |  |  |  |  |  |  |  |
|  | COMPOUND 5-5 | 1.4 |  |  |  |  | 1.4 |  |  |
|  | COMPOUND 5-6 |  | 1.4 |  |  |  |  | 1.4 |  |
|  | COMPOUND 5-7 |  |  | 1.4 |  |  |  |  | 1.4 |
|  | COMPOUND 6-1 |  |  |  | 1.4 |  |  |  |  |
|  | COMPOUND 7-1 |  |  |  |  | 1.4 |  |  |  |
|  | PHOTO-POLY-MERIZABLE MONOMER |  |  |  |  |  |  |  |  |
|  | NVC | 0.3 | 0.3 | 0.3 | 0.3 | 0.3 |  |  |  |
|  | DNTMA BINDER RESIN |  |  |  |  |  | 0.3 | 0.3 | 0.3 |
|  | SN-55T PHOTO-POLY-MERIZATION INITIATOR | 0.5 | 0.5 | 0.5 | 0.5 | 0.5 | 0.5 | 0.5 | 0.5 |
|  | DI PLASTICIZER | 0.09 | 0.09 | 0.09 | 0.09 | 0.09 | 0.09 | 0.09 | 0.09 |
|  | SDE | 1 | 1 | 1 | 1 | 1 | 1 | 1 | 1 |

TABLE 13-continued

| | | | | | | | | | |
|---|---|---|---|---|---|---|---|---|---|
| | SENSITIZING DYE | | | | | | | | |
| | RB | 0.08 | 0.08 | 0.08 | 0.08 | 0.08 | 0.08 | 0.08 | 0.08 |
| | CHAIN TRANSFER AGENT | | | | | | | | |
| | 2-MBO | 0.02 | 0.02 | 0.02 | 0.02 | 0.02 | 0.02 | 0.02 | 0.02 |
| | SOLVENT | | | | | | | | |
| | ACETONE | 8 | 8 | 8 | 8 | 8 | 8 | 8 | 8 |
| CONDITIONS FOR EXPOSURE | EXPOSURE WAVELENGTH/nm | 532 | 532 | 532 | 532 | 532 | 532 | 532 | 532 |
| | LIGHT INTENSITY ON ONE SIDE/ mW · cm$^{-2}$ | 2.6 | 2.6 | 2.6 | 2.6 | 2.6 | 2.6 | 2.6 | 2.6 |
| | TIME OF EXPOSURE/ SECOND | 30 | 30 | 30 | 30 | 30 | 30 | 30 | 30 |
| DIFFRACTION CHARACTERISTIC | Δn | 0.049 | 0.05 | 0.048 | 0.048 | 0.049 | 0.051 | 0.052 | 0.051 |

| | | | COMPARATIVE EXAMPLE 53 | COMPARATIVE EXAMPLE 54 |
|---|---|---|---|---|
| COMPOSITION | PHOTOPOLYMERIZABLE MONOMER | | | |
| | COMPOUND 5-5 | | | |
| | COMPOUND 5-6 | | | |
| | COMPOUND 5-7 | | | |
| | COMPOUND 6-1 | | 1.4 | |
| | COMPOUND 7-1 | | | 1.4 |
| | PHOTOPOLYMERIZABLE MONOMER | | | |
| | NVC | | | |
| | DNTMA | | 0.3 | 0.3 |
| | BINDER RESIN | | | |
| | SN-55T | | 0.5 | 0.5 |
| | PHOTOPOLYMERIZATION INITIATOR | | | |
| | DI | | 0.09 | 0.09 |
| | PLASTICIZER | | | |
| | SDE | | 1 | 1 |
| | SENSITIZING DYE | | | |
| | RB | | 0.08 | 0.08 |
| | CHAIN TRANSFER AGENT | | | |
| | 2-MBO | | 0.02 | 0.02 |
| | SOLVENT | | | |
| | ACETONE | | 8 | 8 |

TABLE 13-continued

|  |  |  |  |
|---|---|---|---|
| CONDITIONS FOR EXPOSURE | EXPOSURE WAVELENGTH/nm | 532 | 532 |
|  | LIGHT INTENSITY ON ONE SIDE/mW · cm$^{-2}$ | 2.6 | 2.6 |
|  | TIME OF EXPOSURE/SECOND | 30 | 30 |
| DIFFRACTION CHARACTERISTIC | Δn | 0.055 | 0.054 |

TABLE 14

|  |  | EXAMPLE 81 | EXAMPLE 82 |
|---|---|---|---|
| COMPOSITION | PHOTOPOLYMERIZABLE MONOMER |  |  |
|  | COMPOUND 10-1 | 1.4 |  |
|  | COMPOUND 10-2 |  | 1.4 |
|  | EA-0200 | 0.3 | 0.3 |
|  | BINDER RESIN |  |  |
|  | SN-55T | 0.5 | 0.5 |
|  | PHOTOPOLYMERIZATION INITIATOR |  |  |
|  | DI | 0.09 | 0.09 |
|  | POLYMERIZATION INHIBITOR |  |  |
|  | HQ | 0.003 | 0.003 |
|  | PLASTICIZER |  |  |
|  | SDE | 1 | 1 |
|  | SENSITIZING DYE |  |  |
|  | RB | 0.08 | 0.08 |
|  | CHAIN TRANSFER AGENT |  |  |
|  | 2-MBO | 0.02 | 0.02 |
|  | SOLVENT |  |  |
|  | ACETONE | 8 | 8 |
| CONDITIONS FOR EXPOSURE | EXPOSURE WAVELENGTH/nm | 532 | 532 |
|  | LIGHT INTENSITY ON ONE SIDE/mW · cm$^{-2}$ | 2.6 | 2.6 |
|  | TIME OF EXPOSURE/SECOND | 30 | 30 |
| DIFFRACTION CHARACTERISTIC | Δn | 0.09 | 0.092 |

TABLE 15

|  |  | EXAMPLE 83 | EXAMPLE 84 | EXAMPLE 85 | EXAMPLE 86 | EXAMPLE 87 | EXAMPLE 88 |
|---|---|---|---|---|---|---|---|
| COMPOSITION | PHOTOPOLYMERIZABLE MONOMER |  |  |  |  |  |  |
|  | EA-0200 | 1.1 | 1.1 | 1.1 | 1.1 | 1.1 | 1.1 |
|  | PHOTOPOLYMERIZABLE MONOMER |  |  |  |  |  |  |
|  | NVC | 0.4 |  |  | 0.4 |  |  |
|  | EACz |  | 0.4 |  |  | 0.4 |  |
|  | EMCz |  |  | 0.4 |  |  | 0.4 |

TABLE 15-continued

| | | EXAMPLE 83 | EXAMPLE 84 | EXAMPLE 85 | EXAMPLE 86 | EXAMPLE 87 | EXAMPLE 88 |
|---|---|---|---|---|---|---|---|
| | BINDER RESIN | | | | | | |
| | SN-55T PHOTO-POLYMERIZATION INITIATOR | 0.7 | 0.7 | 0.7 | 0.7 | 0.7 | 0.7 |
| | DI POLYMERIZATION INHIBITOR | 0.3 | 0.3 | 0.3 | 0.3 | 0.3 | 0.3 |
| | PT PLASTICIZER | 0.05 | 0.05 | 0.05 | 0.005 | 0.005 | 0.005 |
| | DIETHYL SEBACATE SENSITIZING DYE | 1 | 1 | 1 | 1 | 1 | 1 |
| | RB CHAIN TRANSFER AGENT | 0.07 | 0.07 | 0.07 | 0.07 | 0.07 | 0.07 |
| | 2-MBO SOLVENT | 0.02 | 0.02 | 0.02 | 0.02 | 0.02 | 0.02 |
| CONDITIONS FOR EXPOSURE | ACETONE | 8 | 8 | 8 | 8 | 8 | 8 |
| | EXPOSURE WAVELENGTH/nm | 532 | 532 | 532 | 532 | 532 | 532 |
| | LIGHT INTENSITY ON ONE SIDE/ mW · cm$^{-2}$ | 2.6 | 2.6 | 2.6 | 2.6 | 2.6 | 2.6 |
| | TIME OF EXPOSURE/SECOND | 30 | 30 | 30 | 30 | 30 | 30 |
| DIFFRACTION CHARACTERISTIC | Δn | 0.066 | 0.069 | 0.068 | 0.060 | 0.062 | 0.061 |

Note that the present technology is not limited to each of the embodiments and Examples described above and may be modified in various ways without departing from the gist of the present technology.

Furthermore, the effects described herein are for purposes of illustration and not limitation, and the present technology may produce other effects.

Furthermore, the present technology may also employ the following configuration.

[1]

A photosensitive composition for hologram recording including at least: at least two kinds of photopolymerizable monomers; a photopolymerization initiator; a binder resin; and a polymerization inhibitor, in which the at least two kinds of photopolymerizable monomers are a monofunctional monomer and a polyfunctional monomer.

[2]

The photosensitive composition for hologram recording according to [1], in which the monofunctional monomer is a dinaphthothiophene monomer, and the polyfunctional monomer is a dinaphthothiophene monomer.

[3]

The photosensitive composition for hologram recording according to [1] or [2], in which the polymerization inhibitor is a quinone compound.

[4]

The photosensitive composition for hologram recording according to [1], further including an inorganic particulate.

[5]

The photosensitive composition for hologram recording according to [4], in which the inorganic particulate is ZrO$_2$ particulate or TiO$_2$ particulate.

[6]

The photosensitive composition for hologram recording according to [4] or [5], in which the monofunctional monomer is a carbazole monomer, and the polyfunctional monomer is a fluorene monomer.

[7]

The photosensitive composition for hologram recording according to [1], in which the polymerization inhibitor is a hindered phenol compound.

[8]

The photosensitive composition for hologram recording according to [1], in which the polymerization inhibitor is a benzotriazole compound.

[9]

The photosensitive composition for hologram recording according to [7], in which the monofunctional monomer is a carbazole monomer, and the polyfunctional monomer is a fluorene monomer.

[10]

The photosensitive composition for hologram recording according to [8], in which the monofunctional monomer is a carbazole monomer, and the polyfunctional monomer is a fluorene monomer.

[11]

The photosensitive composition for hologram recording according to [1], in which the monofunctional monomer is a carbazole monomer, and the polyfunctional monomer is a fluorene monomer.

[12]

The photosensitive composition for hologram recording according to [11], in which the polymerization inhibitor is a quinone compound.

The photosensitive composition for hologram recording according to [1], in which the polyfunctional monomer is a tris(phenylethynyl)benzene monomer or a tris(naphthylethynyl)benzene monomer.

[14]

The photosensitive composition for hologram recording according to [13], in which the polymerization inhibitor is a quinone compound.

[15]

The photosensitive composition for hologram recording according to [1], in which the monofunctional monomer is a dinaphthothiophene monomer.

[16]

The photosensitive composition for hologram recording according to [15], in which the polymerization inhibitor is a quinone compound.

[17]

The photosensitive composition for hologram recording according to [1], in which the polyfunctional monomer is a dinaphthothiophene monomer.

[18]

The photosensitive composition for hologram recording according to [17], in which the polymerization inhibitor is a quinone compound.

[19]

The photosensitive composition for hologram recording according to [2], in which the polymerization inhibitor is a thiazine compound.

[20]

The photosensitive composition for hologram recording according to [11], in which the polymerization inhibitor is a thiazine compound.

[21]

The photosensitive composition for hologram recording according to [13], in which the polymerization inhibitor is a thiazine compound.

[22]

The photosensitive composition for hologram recording according to [15], in which the polymerization inhibitor is a thiazine compound.

[23]

The photosensitive composition for hologram recording according to [17], in which the polymerization inhibitor is a thiazine compound.

[24]

A hologram recording medium including: at least a photosensitive layer including the photosensitive composition for hologram recording according to any one of [1] to [23]; and at least one transparent base material, in which the photosensitive layer is formed on the at least one transparent base material.

[25]

A hologram obtained with use of the hologram recording medium according to [24], in which an amount of refractive index change of the hologram is 0.06 or more.

[26]

A photosensitive composition for hologram recording including: at least one kind of photopolymerizable monomer; a photopolymerization initiator; a binder resin; and a polymerization inhibitor.

[27]

A photosensitive composition for hologram recording including: at least two kinds of photopolymerizable monomers; a photopolymerization initiator; a binder resin; and a polymerization inhibitor.

[28]

A hologram recording medium including: at least a photosensitive layer including the photosensitive composition for hologram recording according to [26] or [27]; and at least one transparent base material, in which the photosensitive layer is formed on the at least one transparent base material.

[29]

A hologram obtained with use of the hologram recording medium according to [28], in which an amount of refractive index change of the hologram is 0.06 or more.

[30]

The photosensitive composition for hologram recording according to [1], in which the monofunctional monomer is a compound represented by the following General Formula (8):

[Formula 26]

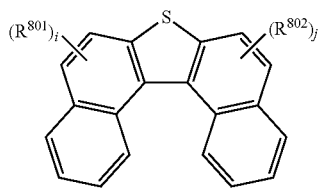

(8)

(in General Formula (8), $R^{801}$ and $R^{802}$ independently are a univalent substituent represented by the following General Formula (9), where i and j independently are an integer of 0 or 1, and i and j are not simultaneously 0 or 1),

[Formula 27]

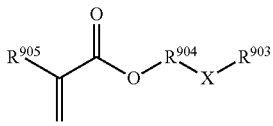

(9)

(in General Formula (9), $R^{903}$ and $R^{904}$ independently are a single bond or a substituted or unsubstituted straight or branched $C_{1-10}$ alkylene group, $R^{905}$ is hydrogen or a substituted or unsubstituted straight or branched $C_{1-10}$ alkyl group, and X is a divalent aromatic group represented by the following Formulae (9-1) to (9-8), The divalent aromatic group is unsubstituted or includes at least one substituent. two binding sites of the divalent aromatic group for $R^{903}$ and $R^{904}$ may be on any carbon in the aromatic group that is to be bound).

[Formula 28]

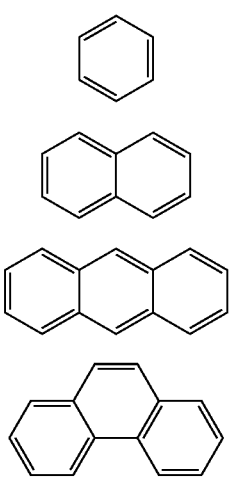

(9-1)
(9-2)
(9-3)
(9-4)

[Formula 29]

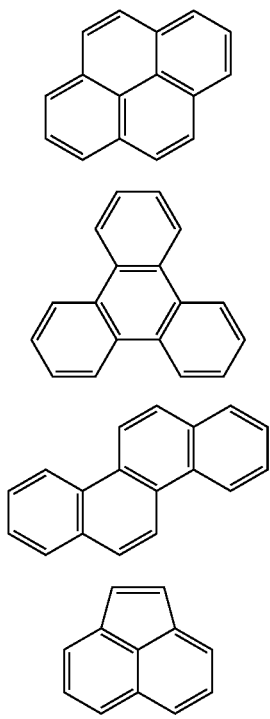

(9-5)
(9-6)
(9-7)
(9-8)

[31]
The photosensitive composition for hologram recording according to [30], in which the polyfunctional monomer is a fluorene monomer.

[32]
The photosensitive composition for hologram recording according to [30], in which the polyfunctional monomer is a dinaphthothiophene monomer.

[33]
The photosensitive composition for hologram recording according to any one of [30] to [32], in which the polymerization inhibitor is a quinone compound.

[34]
The photosensitive composition for hologram recording according to any one of [30] to [32], in which the polymerization inhibitor is a thiazine compound.

[35]
A hologram recording medium including: at least a photosensitive layer including the photosensitive composition for hologram recording according to any one of [30] to [34]; and at least one transparent base material,
in which the photosensitive layer is formed on the at least one transparent base material.

[36]
A hologram obtained with use of the hologram recording medium according to [35], in which an amount of refractive index change of the hologram is 0.06 or more.

REFERENCE SIGNS LIST

1 Hologram recording medium
11 Polyvinyl alcohol film (transparent base material)
12 Photosensitive layer
13 Glass substrate (transparent base material)

The invention claimed is:

1. A photosensitive composition for hologram recording comprising at least two kinds of photopolymerizable monomers; a photopolymerization initiator; a binder resin; and a polymerization inhibitor,
wherein the at least two kinds of photopolymerizable monomers are a monofunctional monomer and a polyfunctional monomer, wherein the monofunctional monomer is a carbazole monomer selected from the group consisting of 2-(9H-carbazole-9-yl)ethyl acrylate and 9H-carbazole-9-ethylmethacrylate and the polyfunctional monomer is a fluorene monomer,
wherein an amount of the polymerization inhibitor is from 0.1% to 10% by mass of the photosensitive composition and a molar ratio of the polymerization inhibitor to the photopolymerization initiator is 0.5 to 1.5.

2. The photosensitive composition for hologram recording according to claim 1, wherein the polymerization inhibitor is selected from the group consisting of a quinone compound, a benzotriazole compound, a hindered phenol compound, and a thiazine compound.

3. A hologram recording medium comprising: at least a photosensitive layer including the photosensitive composition for hologram recording according to claim 1; and at least one transparent base material,
wherein the photosensitive layer is formed on the at least one transparent base material.

4. A hologram obtained with use of the hologram recording medium according to claim 3, wherein an amount of refractive index change of the hologram is 0.06 or more.

5. The photosensitive composition for hologram recording according to claim 1, wherein irradiation of the photosensitive composition provides a hologram having a refractive index change of 0.06 or more.

6. The photosensitive composition for hologram recording according to claim 1, wherein the fluorene monomer is selected from the group consisting of 9,9-bis((meth)acryloyloxyaryl)fluorenes and 9,9 bis((meth)acryloyloxy-(poly)alkoxyaryl)fluorenes.

7. The photosensitive composition for hologram recording according to claim 1, wherein the fluorene monomer is bisphenoxy ethanol fluorene dimethacrylate.

8. The photosensitive composition for hologram recording according to claim 1, wherein the binder resin is selected from the group consisting of polyvinyl acetate, poly(methyl) acrylic acid ester, polyvinyl alcohol, triacetyl cellulose, polyisoprene, polybutadiene, polychloroprene, silicone rubber, polystyrene, polyvinyl butyral, polychloroprene, polyvinyl chloride, polyarylater, chlorinated polyethylene, chlorinated polypropylene, poly-N-vinylcarbazole or a derivative thereof, poly-N-vinylpyrrolidone or a derivative thereof, polyarylate, copolymers thereof, and mixtures thereof.

9. The photosensitive composition for hologram recording according to claim 1, wherein the binder resin selected from the group consisting of a vinyl acetate, an acrylic, and a hydrolysate thereof.

10. The photosensitive composition for hologram recording according to claim 1, wherein the photopolymerization initiator is a cationic polymerization initiator.

11. The photosensitive composition for hologram recording according to claim 1, wherein the photopolymerization initiator is not a cationic polymerization initiator.

12. The photosensitive composition for hologram recording according to claim 11, further comprising: (i) a sensitizing dye present in an amount from 0.01% to 3.0% by mass of the photosensitive composition and (ii) a chain transfer agent present in an amount from 0.1% to 1.0% by mass of the photosensitive composition.

13. The photosensitive composition for hologram recording according to claim 1, wherein the amount of the polymerization inhibitor is from 0.1% to 5% by mass of the photosensitive composition.

14. The photosensitive composition for hologram recording according to claim 1, wherein the polymerization inhibitor is a hindered phenol compound.

15. A hologram having an amount of refractive index change of 0.06 or more, wherein the hologram is produced by irradiating a hologram recording medium comprising:
at least one transparent base material; and
at least one photosensitive layer formed on the at least one transparent base material,
wherein the at least one photosensitive layer comprises a photosensitive composition comprising at least two kinds of photopolymerizable monomers, a photopolymerization initiator, a binder resin, and a polymerization inhibitor,
wherein the at least two kinds of photopolymerizable monomers are a monofunctional carbazole monomer selected from the group consisting of 2-(9H-carbazole-9-yl)ethyl acrylate and 9H-carbazole-9-ethylmethacrylate and a polyfunctional fluorene monomer,
wherein an amount of the polymerization inhibitor is from 0.1% to 10% by mass of the photosensitive composition and a molar ratio of the polymerization inhibitor to the photopolymerization initiator is 0.5 to 1.5.

16. The hologram of claim 15, wherein the polymerization inhibitor is selected from the group consisting of a quinone compound, a benzotriazole compound, a hindered phenol compound, and a thiazine compound.

17. The hologram of claim 15, wherein the polyfunctional fluorene monomer is selected from the group consisting of 9,9-bis((meth)acryloyloxyaryl)fluorenes and 9,9-bis((meth)acryloyloxy-(poly)alkoxyaryl)fluorenes.

18. The hologram of claim 15, wherein the polyfunctional fluorene monomer is bisphenoxy ethanol fluorene dimethacrylate.

19. The hologram of claim 15, wherein the binder resin is selected from the group consisting of polyvinyl acetate, poly(methyl) acrylic acid ester, polyvinyl alcohol, triacetyl cellulose, polylsoprene, polybutadiene, polychloroprene, silicone rubber, polystyrene, polyvinyl butyral, polychloroprene, polyvinyl chloride, polyarylater, chlorinated polyethylene, chlorinated polypropylene, poly-N-vinylcarbazole or a derivative thereof, poly-N-vinylpyrrolidone or a derivative thereof, polyarylate, copolymers thereof, and mixtures thereof.

20. The hologram of claim 15, wherein the binder resin selected from the group consisting of a vinyl acetate, an acrylic, and a hydrolysate thereof.

21. A photosensitive composition for hologram recording comprising at least two kinds of photopolymerizable monomers; a photopolymerization initiator; a binder resin; and a polymerization inhibitor,
wherein the at least two kinds of photopolymerizable monomers are a monofunctional monomer and a polyfunctional monomer, wherein the monofunctional monomer is a carbazole monomer and the polyfunctional monomer is a fluorene monomer,
wherein the polymerization inhibitor is a hindered phenol and an amount of the polymerization inhibitor is from 0.1% to 10% by mass of the photosensitive composition and a molar ratio of the polymerization inhibitor to the photopolymerization initiator is 0.1 to 10.

22. The photosensitive composition for hologram recording according to claim 21, wherein the carbazole monomer is selected from the group consisting of 2-(9H-carbazole-9-yl)ethyl acrylate and 9H-carbazole-9-ethylmethacrylate.

23. The photosensitive composition for hologram recording according to claim 22, wherein the fluorene monomer is selected from the group consisting of 9,9-bis((meth)acryloyloxyaryl)fluorenes and 9,9 bis((meth)acryloyloxy-(poly)alkoxyaryl)fluorenes.

24. The photosensitive composition for hologram recording according to claim 21, wherein the amount of the polymerization inhibitor is from 0.1% to 5% by mass of the photosensitive composition and the molar ratio of the polymerization inhibitor to the photopolymerization initiator is 0.5 to 1.5.

25. The photosensitive composition for hologram recording according to claim 21, further comprising: (i) a sensitizing dye present in an amount from 0.01% to 3.0% by mass of the photosensitive composition and (ii) a chain transfer agent present in an amount from 0.1% to 1.0% by mass of the photosensitive composition.

* * * * *